United States Patent [19]

Nose et al.

[11] Patent Number: 5,508,701

[45] Date of Patent: Apr. 16, 1996

[54] DATA CONVERSION METHOD AND RECORDING AND REPRODUCTION APPARATUS

[75] Inventors: Junichi Nose; Hideki Kaneko; Tatsuo Yamasaki; Ken Onishi; Masako Yamada; Taketoshi Hibi, all of Nagaokakyo, Japan

[73] Assignee: Mitsubishi Denki Kabushiki Kaisha, Tokyo, Japan

[21] Appl. No.: 266,892

[22] Filed: Jul. 5, 1994

[30] Foreign Application Priority Data

| Jul. 6, 1993 | [JP] | Japan | 5-192924 |
| Dec. 27, 1993 | [JP] | Japan | 5-349951 |
| Apr. 29, 1994 | [JP] | Japan | 6-114578 |

[51] Int. Cl.⁶ ......................... H03M 5/00
[52] U.S. Cl. ......................... 341/58
[58] Field of Search .................. 341/58, 87, 102, 341/106; 360/39, 40, 41, 42, 43, 44

[56] References Cited

U.S. PATENT DOCUMENTS 4,499,454  2/1985  Shimada ........................ 341/58

FOREIGN PATENT DOCUMENTS

| 56-19506 | 2/1981 | Japan . |
| 60-48646 | 3/1985 | Japan . |
| 61-30818 | 2/1986 | Japan . |
| 3-234146 | 10/1991 | Japan . |
| 3234146 | 10/1991 | Japan . |
| 4-80576 | 12/1992 | Japan . |

*Primary Examiner*—Brian K. Young
*Attorney, Agent, or Firm*—Birch, Stewart, Kolasch & Birch

[57] ABSTRACT

Codewords with CDS=0 are mapped in corresponding relationship to datawords, and codewords with CDS>0 and codewords with CDS<0 are paired together and mapped in corresponding relationship to the remaining datawords, and further, codewords with CDS≠0, left unmapped, are mapped in corresponding relationship to the datawords to which the codewords with CDS=0 have been mapped, thus reducing the probability of occurrence of codewords with large DSV in absolute value terms and thereby achieving a further suppression of low-frequency components. Based on the least significant bit of the codeword corresponding to the last dataword and on the current and next datawords, a codeword corresponding to the current dataword is selected, thus realizing high-density recording with good overwrite characteristics.

12 Claims, 91 Drawing Sheets

FIG. 1
PRIOR ART

| | $T_{min}$ | $T_{max}$ | $T_{max}/T_{min}$ | $T_w$ | $T_w \times T_{min}$ | $DSV_{max}$ |
|---|---|---|---|---|---|---|
| 8-10 MODULATION | 0.8T | 3.2T | 4.0 | 0.8 | 0.640 | ±4 |
| 8-14 MODULATION | 1.14T | 4.0T | 3.5 | 0.57 | 0.653 | ±7 |
| METHOD OF INVENTION | 1.14T | 3.43T | 3.0 | 0.57 | 0.653 | ±14 |

T: DATA CLOCK CYCLE

FIG. 4
PRIOR ART

|  | DATAWORD (MSB—LSB) | CODEWORD (MSB—LSB) Q'=-1 | DC | Q | CODEWORD (MSB—LSB) Q'=1 | DC | Q |
|---|---|---|---|---|---|---|---|
| 00 | 00000000 | 0101010101 | 0 | 1 | 0101010101 | 0 | -1 |
| 01 | 00000001 | 0101010111 | 0 | -1 | 0101010111 | 0 | 1 |
| 02 | 00000010 | 0101011101 | 0 | -1 | 0101011101 | 0 | 1 |
| 03 | 00000011 | 0101011111 | 0 | 1 | 0101011111 | 0 | -1 |
| 04 | 00000100 | 0101001001 | 0 | -1 | 0101001001 | 0 | -1 |
| 05 | 00000101 | 0101001011 | 0 | 1 | 0101001011 | 0 | -1 |
| 06 | 00000110 | 0101001110 | 0 | 1 | 0101001110 | 0 | -1 |
| 07 | 00000111 | 0101011010 | 0 | 1 | 0101011010 | 0 | -1 |
| 08 | 00001000 | 0101110101 | 0 | -1 | 0101110101 | 0 | 1 |
| 09 | 00001001 | 0101110111 | 0 | 1 | 0101110111 | 0 | -1 |
| 0A | 00001010 | 0101111101 | 0 | 1 | 0101111101 | 0 | -1 |
| 0B | 00001011 | 0101111111 | 0 | -1 | 0101111111 | 0 | 1 |
| 0C | 00001100 | 0101101001 | 0 | 1 | 0101101001 | 0 | -1 |
| 0D | 00001101 | 0101101011 | 0 | -1 | 0101101011 | 0 | 1 |
| 0E | 00001110 | 0101101110 | 0 | -1 | 0101101110 | 0 | 1 |
| 0F | 00001111 | 0101111010 | 0 | -1 | 0101111010 | 0 | 1 |
| ... | ... | ... | ... | ... | ... | ... | ... |
| BC | 11101100 | 1111101001 | 0 | 1 | 1111101001 | 0 | -1 |
| BD | 11101101 | 1111101011 | 0 | -1 | 1111101011 | 0 | 1 |
| BE | 11101110 | 1111101110 | 0 | -1 | 1111101110 | 0 | 1 |
| BF | 11101111 | 1111111010 | 0 | -1 | 1111111010 | 0 | 1 |
| F0 | 11110000 | 1101010101 | 0 | -1 | 1101010101 | 0 | 1 |
| F1 | 11110001 | 1101010111 | 0 | 1 | 1101010111 | 0 | -1 |
| F2 | 11110010 | 1101011101 | 0 | 1 | 1101011101 | 0 | -1 |
| F3 | 11110011 | 1101011111 | 0 | -1 | 1101011111 | 0 | 1 |
| F4 | 11110100 | 1101001001 | 0 | 1 | 1101001001 | 0 | -1 |
| F5 | 11110101 | 1101001011 | 0 | -1 | 1101001011 | 0 | 1 |
| F6 | 11110110 | 1101001110 | 0 | -1 | 1101001110 | 0 | 1 |
| F7 | 11110111 | 1101011010 | 0 | -1 | 1101011010 | 0 | 1 |
| F8 | 11111000 | 1111100101 | 2 | -1 | 0111100101 | -2 | -1 |
| F9 | 11111001 | 1111100111 | 2 | 1 | 0111100111 | -2 | 1 |
| FA | 11111010 | 1111101101 | 2 | 1 | 0111101101 | -2 | 1 |
| FB | 11111011 | 1111101111 | 2 | -1 | 0111101111 | -2 | -1 |
| FC | 11111100 | 1111111001 | 2 | 1 | 0111111001 | -2 | 1 |
| FD | 11111101 | 1111111011 | 2 | -1 | 0111111011 | -2 | -1 |
| FE | 11111110 | 1111111110 | 2 | -1 | 0111111110 | -2 | -1 |
| FF | 11111111 | 1111101010 | 2 | -1 | 0111101010 | -2 | -1 |

FIG. 5

| CDS | DSV IN CODEWORD | | NUMBER | NUMBER |
|---|---|---|---|---|
| | MAX | MIN | | |
| −6 | −1 | | 1 | 1 |
| −4 | 1 | | 9 | |
| | 0 | | 13 | 33 |
| | −1 | | 11 | |
| −2 | 3 | | 1 | |
| | 2 | | 15 | |
| | 1 | | 56 | 126 |
| | 0 | | 41 | |
| | −1 | | 13 | |
| 0 | 4 or −4 | | 2 | |
| | 3 or −3 | | 29 | |
| | 2 or −2 | | 129 | 192 |
| | 1 or −1 | | 32 | |
| 2 | | −2 | 15 | |
| | | −1 | 55 | 151 |
| | | 0 | 47 | |
| | | 1 | 34 | |
| 4 | | −1 | 10 | |
| | | 0 | 13 | 55 |
| | | 1 | 32 | |
| 6 | | 1 | 6 | 6 |

| | A group Q1′=0, Q2′=0 | | | | B group Q1′=0, Q2′=1 | | | | C group Q1′=1, Q2′=0 | | | | D group Q1′=1, Q2′=1 | | | |
|---|---|---|---|---|---|---|---|---|---|---|---|---|---|---|---|---|
| DATA | CODEWORD | CDS | Q1 | Q2 | CODEWORD | CDS | Q1 | Q2 | CODEWORD | CDS | Q1 | Q2 | CODEWORD | CDS | Q1 | Q2 |
| 129 | 1 1 1 1 0 1 0 0 1 0 | 0 | 0 | 0 | 1 1 1 1 0 1 0 0 1 0 | 0 | 0 | 1 | 1 1 1 1 0 1 0 0 1 0 | 0 | 1 | 0 | 1 1 1 1 0 1 0 0 1 0 | 0 | 1 | 1 |
| 130 | 1 1 1 0 1 0 0 1 1 1 | 0 | 0 | 1 | 1 1 1 0 1 0 0 1 1 1 | 0 | 0 | 0 | 1 1 1 0 1 0 0 1 1 1 | 0 | 1 | 1 | 1 1 1 0 1 0 0 1 1 1 | 0 | 1 | 0 |
| 131 | 1 0 0 1 0 0 1 1 0 1 | 0 | 0 | 1 | 1 0 0 1 0 0 1 1 0 1 | 0 | 0 | 0 | 1 1 1 0 0 1 0 1 0 1 | 2 | 0 | 0 | 1 1 0 1 1 0 0 1 0 1 | −2 | 0 | 0 |
| 132 | 1 1 0 0 0 1 0 0 1 1 | 0 | 0 | 1 | 1 1 0 0 0 1 0 0 1 1 | 0 | 0 | 0 | 0 1 1 1 0 0 0 1 0 1 | 2 | 0 | 1 | 1 1 0 0 0 1 0 0 1 0 | −2 | 0 | 0 |
| 133 | 1 1 0 0 0 1 0 0 0 1 | 0 | 0 | 0 | 1 1 0 0 0 1 0 0 0 1 | 0 | 0 | 1 | 1 0 0 1 0 0 1 0 0 1 | 2 | 0 | 0 | 1 0 1 1 1 0 0 1 1 0 | −2 | 0 | 0 |
| 134 | 0 1 0 0 0 1 0 1 1 0 | 0 | 0 | 0 | 0 1 0 0 0 1 0 1 1 0 | 0 | 0 | 1 | 1 1 1 0 1 1 1 1 0 1 | 2 | 0 | 0 | 1 1 0 1 1 1 1 1 1 0 | −2 | 0 | 0 |
| 135 | 1 0 0 1 0 0 0 1 0 1 | 0 | 0 | 0 | 1 0 0 1 0 0 0 1 0 1 | 0 | 0 | 1 | 1 0 1 0 1 0 1 0 1 0 | 2 | 0 | 1 | 1 1 0 1 0 1 0 0 1 1 | −2 | 0 | 0 |
| 136 | 1 1 0 0 0 1 0 1 1 0 | 0 | 0 | 1 | 1 1 0 0 0 1 0 1 1 0 | 0 | 0 | 0 | 1 0 0 1 0 0 1 1 1 0 | 2 | 0 | 1 | 1 1 0 0 1 1 0 1 1 1 | −2 | 0 | 1 |
| 137 | 1 0 0 1 1 1 0 0 0 1 | 0 | 0 | 1 | 1 0 0 1 1 1 0 0 0 1 | 0 | 0 | 0 | 1 1 1 1 1 1 1 0 0 1 | 2 | 0 | 0 | 0 1 0 1 0 0 1 1 0 1 | −2 | 0 | 1 |
| 138 | 1 0 0 1 0 0 0 1 1 1 | 0 | 0 | 1 | 1 0 0 1 0 0 0 1 1 1 | 0 | 0 | 0 | 1 1 1 1 1 0 1 1 0 1 | 2 | 0 | 0 | 0 1 0 1 0 0 1 1 1 1 | −2 | 0 | 0 |
| 139 | 1 0 1 1 0 1 0 0 0 1 | 0 | 0 | 1 | 1 0 1 1 0 1 0 0 0 1 | 0 | 0 | 0 | 1 0 1 0 1 0 1 1 0 1 | 2 | 0 | 0 | 1 1 0 1 1 0 1 1 0 1 | −2 | 0 | 1 |
| 140 | 1 1 1 0 0 1 0 0 0 1 | 0 | 0 | 1 | 1 1 1 0 0 1 0 0 0 1 | 0 | 0 | 0 | 1 1 1 0 0 1 1 1 0 1 | 2 | 0 | 1 | 1 1 1 1 0 1 1 1 1 0 | −2 | 0 | 0 |
| 141 | 1 0 0 0 1 0 0 0 1 1 | 0 | 0 | 0 | 1 0 0 0 1 0 0 0 1 1 | 0 | 0 | 1 | 1 0 1 1 1 0 1 0 1 1 | 2 | 0 | 1 | 1 1 0 0 1 1 0 1 0 1 | −2 | 0 | 0 |
| 142 | 1 0 0 0 1 0 0 1 1 0 | 0 | 0 | 0 | 1 0 0 0 1 0 0 1 1 0 | 0 | 0 | 1 | 1 1 1 0 0 1 1 1 1 1 | 2 | 0 | 0 | 0 1 0 1 0 0 0 1 1 1 | −2 | 0 | 1 |
| 143 | 1 0 1 1 0 1 0 1 0 1 | 2 | 1 | 1 | 0 1 0 1 1 1 0 0 1 1 | −2 | 1 | 0 | 1 0 1 1 0 1 0 1 0 1 | 2 | 0 | 0 | 0 1 0 1 1 1 0 0 1 1 | −2 | 0 | 0 |
| 144 | 1 1 1 0 0 1 0 1 1 1 | 2 | 1 | 0 | 0 1 1 1 0 1 0 1 1 0 | −2 | 1 | 0 | 1 1 1 0 0 1 0 1 1 1 | 2 | 0 | 1 | 0 1 1 1 0 1 0 1 1 0 | −2 | 0 | 0 |
| 145 | 1 0 0 1 1 0 1 0 1 1 | 2 | 1 | 1 | 0 1 0 1 0 0 0 1 0 1 | −2 | 1 | 0 | 1 0 0 1 1 0 1 0 1 1 | 2 | 0 | 0 | 0 1 0 1 0 0 0 1 0 1 | −2 | 0 | 0 |
| 146 | 0 1 1 1 0 1 1 0 0 1 | 2 | 1 | 1 | 0 1 0 1 0 1 1 0 0 1 | −2 | 1 | 1 | 0 1 1 1 0 1 1 0 0 1 | 2 | 0 | 0 | 0 1 0 1 0 1 1 0 0 1 | −2 | 0 | 1 |
| 147 | 1 0 0 1 1 0 1 0 0 1 | 2 | 1 | 0 | 1 1 0 0 1 1 1 1 1 1 | −2 | 1 | 0 | 1 0 0 1 1 0 1 0 0 1 | 2 | 0 | 1 | 1 1 0 0 1 1 1 1 1 1 | −2 | 0 | 0 |
| 148 | 0 1 0 1 1 1 1 0 0 1 | 2 | 1 | 1 | 1 1 1 1 1 1 0 0 0 1 | −2 | 1 | 1 | 0 1 0 1 1 1 1 0 0 1 | 2 | 0 | 0 | 1 1 1 1 1 1 0 0 0 1 | −2 | 0 | 1 |
| 149 | 1 0 0 1 1 1 1 0 1 0 | 2 | 1 | 1 | 1 1 0 1 1 0 1 1 1 1 | −2 | 1 | 0 | 1 0 0 1 1 1 1 0 1 0 | 2 | 0 | 0 | 1 1 0 1 1 0 1 1 1 1 | −2 | 0 | 0 |
| 150 | 0 1 1 1 0 0 1 0 1 0 | 2 | 1 | 0 | 0 1 0 1 0 0 1 0 1 0 | −2 | 1 | 0 | 0 1 1 1 0 0 1 0 1 0 | 2 | 0 | 1 | 0 1 0 1 0 0 1 0 1 0 | −2 | 0 | 0 |
| 151 | 1 0 0 0 1 0 1 1 1 1 | 2 | 1 | 1 | 1 1 1 1 0 0 1 1 1 1 | −2 | 1 | 0 | 1 0 0 0 1 0 1 1 1 1 | 2 | 0 | 0 | 1 1 1 1 0 0 1 1 1 1 | −2 | 0 | 0 |
| 152 | 0 1 0 0 1 0 1 0 0 1 | 2 | 1 | 1 | 0 0 1 1 1 0 1 0 0 1 | −2 | 1 | 1 | 0 1 0 0 1 0 1 0 0 1 | 2 | 0 | 0 | 0 0 1 1 1 0 1 0 0 1 | −2 | 0 | 1 |
| 153 | 1 0 0 0 1 1 1 0 1 1 | 2 | 1 | 1 | 0 1 1 0 0 1 1 0 1 0 | −2 | 1 | 1 | 1 0 0 0 1 1 1 0 1 1 | 2 | 0 | 0 | 0 1 1 0 0 1 1 0 1 0 | −2 | 0 | 1 |
| 154 | 1 0 1 0 0 1 0 0 1 1 | 2 | 1 | 0 | 0 1 1 1 1 0 1 0 1 0 | −2 | 1 | 0 | 1 0 1 0 0 1 0 0 1 1 | 2 | 0 | 1 | 0 1 1 1 1 0 1 0 1 0 | −2 | 0 | 0 |
| 155 | 1 0 1 1 1 1 0 0 1 0 | 2 | 1 | 1 | 0 0 1 0 1 1 1 0 0 1 | −2 | 1 | 1 | 1 0 1 1 1 1 0 0 1 0 | 2 | 0 | 0 | 0 0 1 0 1 1 1 0 0 1 | −2 | 0 | 1 |
| 156 | 1 0 0 1 0 1 1 1 1 1 | 2 | 1 | 0 | 0 1 1 1 1 1 1 1 1 0 | −2 | 1 | 0 | 1 0 0 1 0 1 1 1 1 1 | 2 | 0 | 1 | 0 1 1 1 1 1 1 1 1 0 | −2 | 0 | 0 |
| 157 | 1 0 0 0 1 1 1 0 0 1 | 2 | 1 | 0 | 0 1 1 0 0 1 0 1 1 1 | −2 | 1 | 0 | 1 0 0 0 1 1 1 0 0 1 | 2 | 0 | 1 | 0 1 1 0 0 1 0 1 1 1 | −2 | 0 | 0 |
| 158 | 0 1 0 1 0 1 0 1 1 0 | 2 | 1 | 0 | 0 0 1 1 1 0 1 0 1 1 | −2 | 1 | 0 | 0 1 0 1 0 1 0 1 1 0 | 2 | 0 | 1 | 0 0 1 1 1 0 1 0 1 1 | −2 | 0 | 0 |
| 159 | 1 0 0 1 0 1 0 0 1 0 | 2 | 1 | 1 | 0 0 1 0 1 1 1 1 1 0 | −2 | 1 | 0 | 1 0 0 1 0 1 0 0 1 0 | 2 | 0 | 0 | 0 0 1 0 1 1 1 1 1 0 | −2 | 0 | 0 |
| 160 | 0 1 0 1 1 0 0 1 0 1 | 2 | 1 | 0 | 0 0 1 1 1 1 1 0 1 0 | −2 | 1 | 0 | 0 1 0 1 1 0 0 1 0 1 | 2 | 0 | 1 | 0 0 1 1 1 1 1 0 1 0 | −2 | 0 | 0 |

A GROUP

| OUTPUT OF Q1,Q2 | INPUT/ OUTPUT POLARITY AFTER NRZI | CDS VALUE |
|---|---|---|
| Q1=0, Q2=0 | SAME | CDS=0 |
| Q1=1, Q2=0 | DIFFERENT | CDS≠0 |
| Q1=0, Q2=1 | DIFFERENT | CDS=0 |
| Q1=1, Q2=1 | SAME | CDS≠0 |

FIG. 16

B GROUP

| OUTPUT OF Q1,Q2 | INPUT/ OUTPUT POLARITY AFTER NRZI | CDS VALUE |
|---|---|---|
| Q1=0, Q2=0 | DIFFERENT | CDS=0 |
| Q1=1, Q2=0 | SAME | CDS≠0 |
| Q1=0, Q2=1 | SAME | CDS=0 |
| Q1=1, Q2=1 | DIFFERENT | CDS≠0 |

FIG. 17

C GROUP

| OUTPUT OF Q1,Q2 | INPUT/ OUTPUT POLARITY AFTER NRZI | CDS VALUE |
|---|---|---|
| Q1=0, Q2=0 | SAME | CDS≠0 |
| Q1=1, Q2=0 | SAME | CDS=0 |
| Q1=0, Q2=1 | DIFFERENT | CDS≠0 |
| Q1=1, Q2=1 | DIFFERENT | CDS=0 |

FIG. 18

D GROUP

| OUTPUT OF Q1,Q2 | INPUT/ OUTPUT POLARITY AFTER NRZI | CDS VALUE |
|---|---|---|
| Q1=0, Q2=0 | DIFFERENT | CDS≠0 |
| Q1=1, Q2=0 | DIFFERENT | CDS=0 |
| Q1=0, Q2=1 | SAME | CDS≠0 |
| Q1=1, Q2=1 | SAME | CDS=0 |

FIG. 28A  CODEWORD "0" RUN LENGTH
IN CODEWORD 1 TO 5
AT MSB SIDE MAX. 3
AT LSB SIDE MAX. 2

| CDS | 0 | +2 | +4 | +6 | +8 | -2 | -4 | -6 | -8 |
|-----|-----|-----|----|----|----|-----|----|----|----|
| NUMBER | 147 | 135 | 74 | 22 | 2 | 100 | 37 | 6 | 0 |

FIG. 28B  CODEWORD "0" RUN LENGTH
IN CODEWORD 1 TO 5
AT MSB SIDE 1 TO 5
AT LSB SIDE MAX. 2

| CDS | 0 | +2 | +4 | +6 | +8 | -2 | -4 | -6 | -8 |
|-----|-----|----|----|----|----|----|----|----|----|
| NUMBER | 100 | 71 | 27 | 3 | 0 | 89 | 50 | 16 | 1 |

FIG. 29

LSB OF CODEWORD = "0"
("0" RUN LENGTH MAX. 3 AT MSB SIDE)

| CDS | 0 | +2 | +4 | +6 | +8 | -2 | -4 | -6 | -8 |
|---|---|---|---|---|---|---|---|---|---|
| NUMBER WHEN P=+1 | 40 | 31 | 12 | 3 | 0 | 33 | 14 | 5 | 0 |
| NUMBER WHEN P=-1 | 36 | 39 | 25 | 9 | 0 | 18 | 2 | 0 | 0 |

FIG. 30

LSB OF CODEWORD = "1"
  ("0" RUN LENGTH MAX.3 AT MSB SIDE)

| CDS | 0 | +2 | +4 | +6 | +8 | -2 | -4 | -6 | -8 |
|---|---|---|---|---|---|---|---|---|---|
| NUMBER WHEN P=+1 | 34 | 38 | 22 | 6 | 0 | 19 | 4 | 1 | 0 |
| NUMBER WHEN P=-1 | 37 | 27 | 15 | 4 | 2 | 30 | 17 | 0 | 0 |

FIG. 31

LSB OF CODEWORD = "0"
 ("0" RUN LENGTH 1 TO 5 AT MSB SIDE)

| CDS | 0 | +2 | +4 | +6 | +8 | −2 | −4 | −6 | −8 |
|---|---|---|---|---|---|---|---|---|---|
| NUMBER WHEN P=+1 | 23 | 15 | 4 | 0 | 0 | 26 | 18 | 9 | 0 |
| NUMBER WHEN P=−1 | 28 | 23 | 10 | 2 | 0 | 18 | 6 | 2 | 0 |

FIG. 32

LSB OF CODEWORD = "1"
   ("0" RUN LENGTH 1 TO 5 AT MSB SIDE)

| CDS | 0 | +2 | +4 | +6 | +8 | −2 | −4 | −6 | −8 |
|---|---|---|---|---|---|---|---|---|---|
| NUMBER WHEN P=+1 | 25 | 21 | 8 | 3 | 0 | 21 | 8 | 3 | 0 |
| NUMBER WHEN P=−1 | 24 | 12 | 5 | 0 | 0 | 24 | 18 | 2 | 1 |

FIG. 33

| | To GROUP ("0" RUN LENGTH MAX. 3 AT MSB SIDE) | | | | |
|---|---|---|---|---|---|
| | LSB OF LAST CODEWORD = "0", k≧0 | | | | |
| | 8-BIT DATA | LSB | CDS | P | CONNECTION CONDITION FOR NEXT CODEWORD |
| 1 | 00~4B B8~FF | "0" | 0 -2 -4 -6 | +1 or -1 | POSSIBLE CONNECTION TO CODEWORD OF MSB "1" (CONNECTION TO CODEWORD IN T$_0$ OR T$_1$ GROUP) |
| 2 | 4C~71 | "1" | 0 | -1 | IMPOSSIBLE CONNECTION TO CODEWORD OF MSB "1" (CONNECTION TO CODEWORD IN T$_3$ GROUP), POSSIBILITY OF EXCEEDING A PREDETERMINED VALUE (n=8) BY NG CODEWORD |
| | | | -2 | -1 | IMPOSSIBLE CONNECTION TO CODEWORD OF MSB "1" (CONNECTION TO CODEWORD IN T$_2$ OR T$_3$ GROUP), POSSIBILITY OF EXCEEDING A PREDETERMINED VALUE BY NG CODEWORD (CDS=-4) |
| 3 | 72~82 A5~B7 | "1" | -4 | -1 | IMPOSSIBLE CONNECTION TO CODEWORD OF MSB "1" (CONNECTION TO CODEWORD IN T$_2$ OR T$_3$ GROUP), IMPOSSIBILITY OF EXCEEDING A PREDETERMINED VALUE EVEN WHEN CONNECTION TO NG CODEWORD |
| 4 | 83~A4 | "1" | 0 | +1 | IMPOSSIBLE CONNECTION TO CODEWORD OF MSB "1", CONNECTION TO CODEWORD IN T$_2$ GROUP (k≧0) |

FIG. 34

| | T1 GROUP ("0" RUN LENGTH MAX. 3 AT MSB SIDE) | | | | |
|---|---|---|---|---|---|
| | LSB OF LAST CODEWORD = "0", k<0 | | | | |
| | 8-BIT DATA | LSB | CDS | P | CONNECTION CONDITION FOR NEXT CODEWORD |
| 1 | 00~4B 72~B7 CF~FF | "0" | 0 -2 -4 -6 | +1 or -1 | POSSIBLE CONNECTION TO CODEWORD OF MSB "1" (CONNECTION TO CODEWORD IN T0 OR T1 GROUP) |
| 2 | 4C~71 | "1" | +2 | +1 | IMPOSSIBLE CONNECTION TO CODEWORD OF MSB "1" (CONNECTION TO CODEWORD IN T2 OR T3 GROUP), POSSIBILITY OF EXCEEDING A PREDETERMINED VALUE (n=8) BY NG CODEWORD (CDS=-4) |
| 3 | B8~C3 | "1" | +2 | — | IMPOSSIBLE CONNECTION TO CODEWORD OF MSB "1", CONNECTION TO CODEWORD IN T2 GROUP (k≥0) |
| 4 | C4~CE | "1" | +4 | — | IMPOSSIBLE CONNECTION TO CODEWORD OF MSB "1" (CONNECTION TO CODEWORD IN T2 OR T3 GROUP), IMPOSSIBILITY OF EXCEEDING A PREDETERMINED VALUE EVEN WHEN CONNECTION TO NG CODEWORD |

FIG. 35

| T2 GROUP ("0" RUN LENGTH 1 TO 5 AT MSB SIDE) |||||||
|---|---|---|---|---|---|---|
| LSB OF LAST CODEWORD = "1", $k \geq 0$ |||||||
| | 8-BIT DATA | LSB | CDS | P | CONNECTION CONDITION FOR NEXT CODEWORD ||
| 1 | 00~3B<br>8C~8F<br>BE~FF | "0" | 0<br>-2<br>-4<br>-6 | +1<br>or<br>-1 | POSSIBLE CONNECTION TO CODEWORD OF MSB "1" (CONNECTION TO CODEWORD IN T0 OR T1 GROUP) ||
| 2 | 3C~6E | "1" | 0 | -1 | IMPOSSIBLE CONNECTION TO CODEWORD OF MSB "1" (CONNECTION TO CODEWORD IN T3 GROUP), POSSIBILITY OF EXCEEDING A PREDETERMINED VALUE (n=8) BY NG CODEWORD ||
| | | | -2<br>-6 | -1<br>-1 | IMPOSSIBLE CONNECTION TO CODEWORD OF MSB "1" (CONNECTION TO CODEWORD IN T2 OR T3 GROUP), POSSIBILITY OF EXCEEDING A PREDETERMINED VALUE BY NG CODEWORD (CDS=-4) ||
| 3 | 6F~83 | "1" | -4<br>-6<br>-8 | -1 | IMPOSSIBLE CONNECTION TO CODEWORD OF MSB "1" (CONNECTION TO CODEWORD IN T2 OR T3 GROUP), IMPOSSIBILITY OF EXCEEDING A PREDETERMINED VALUE EVEN WHEN CONNECTION TO NG CODEWORD ||
| | 84~8B<br>A9~BD | | -2<br>-4 | +1 | ||
| 4 | 90~A8 | "1" | 0 | +1 | IMPOSSIBLE CONNECTION TO CODEWORD OF MSB "1", CONNECTION TO CODEWORD IN T2 GROUP ($k \geq 0$) ||

FIG. 36A

| | 8-BIT DATA | LSB | CDS | P | CONNECTION CONDITION FOR NEXT CODEWORD |
|---|---|---|---|---|---|
| | T3 GROUP ("0" RUN LENGTH 1 TO 5 AT MSB SIDE) ||||||
| | LSB OF LAST CODEWORD = "1", k<0 ||||||
| 1 | 00~32<br>38~3B<br>69~77<br>8C~8F<br>A9~C5 | "0" | 0<br>+2<br>+4 | +1<br>or<br>−1 | POSSIBLE CONNECTION TO CODEWORD OF MSB "1" (CONNECTION TO CODEWORD IN T0 OR T1 GROUP) |
| 2 | 54~68 | "1" | +2 | +1 | IMPOSSIBLE CONNECTION TO CODEWORD OF MSB "1" (CONNECTION TO CODEWORD IN T2 OR T3 GROUP), POSSIBILITY OF EXCEEDING A PREDETERMINED VALUE (n=8) BY NG CODEWORD (CDS=−4) |
| | 90~A8 | | 0 | +1 | IMPOSSIBLE CONNECTION TO CODEWORD OF MSB "1" (CONNECTION TO CODEWORD IN T3 GROUP), POSSIBILITY OF EXCEEDING A PREDETERMINED VALUE BY NG CODEWORD |
| 3 | 33~37<br>84~8B | "1" | −4<br><br>+6 | +1<br>or<br>−1<br>+1 | IMPOSSIBLE CONNECTION TO CODEWORD OF MSB "1" (CONNECTION TO CODEWORD IN T2 OR T3 GROUP), IMPOSSIBILITY OF EXCEEDING A PREDETERMINED VALUE EVEN WHEN CONNECTION TO NG CODEWORD |

FIG. 36B

| T3 GROUP ("0" RUN LENGTH 1 TO 5 AT MSB SIDE) | | | | |
|---|---|---|---|---|
| LSB OF LAST CODEWORD = "1", k<0 | | | | |
| | 8-BIT DATA | LSB | CDS | P | CONNECTION CONDITION FOR NEXT CODEWORD |
| 4 | 3C~53 | "1" | 0 | −1 | IMPOSSIBLE CONNECTION TO CODEWORD OF MSB "1" CONNECTION TO CODEWORD IN T2 GROUP (k≥0) |
| | 78~83 | | +2 | −1 | |
| 5 | C6~FF | "0" | −2 | +1 or −1 | NG CODEWORD (DSV TOWARD DIVERGENT DIRECTION). USE OF CODEWORD SAME AS CODEWORD OF CORRESPONDING DATA IN T2 GROUP. POSSIBLE CONNECTION TO CODEWORD OF MSB "1" (CONNECTION TO CODEWORD IN T0 OR T1 GROUP) |
| | | | −4 | | |

FIG. 37

| T01 GROUP ("0" RUN LENGTH MAX. 3 AT MSB SIDE) |||||
|---|---|---|---|---|
| LSB OF LAST CODEWORD = "0", k>0 (NEXT DATA IS ONE CORRESPONDING TO NG CODEWORD) |||||
| 8-BIT DATA | LSB | CDS | P | CONNECTION CONDITION FOR NEXT CODEWORD |
| 4C~71 | "1" | +2 | +1 | IMPOSSIBLE CONNECTION TO CODEWORD OF MSB "1", CONNECTION TO CODEWORD IN T2 GROUP AT k>0 |

\* USE AS SUBCODE OF T0 GROUP

FIG. 38

| T11 GROUP ("0" RUN LENGTH MAX. 3 AT MSB SIDE) ||||||
|---|---|---|---|---|
| LSB OF LAST CODEWORD = "0", k<0 (NEXT DATA IS ONE CORRESPONDING TO NG CODEWORD) |||||
| 8-BIT DATA | LSB | CDS | P | CONNECTION CONDITION FOR NEXT CODEWORD |
| 4C~53 54~71 | "1" | 0 -2 | -1 -1 | IMPOSSIBLE CONNECTION TO CODEWORD OF MSB "1", CONNECTION TO CODEWORD IN T2 GROUP AT k>0 |

\* USE AS SUBCODE OF T1 GROUP

FIG. 39

| T21 GROUP ("0" RUN LENGTH 1 TO 5 AT MSB SIDE) ||||||
|---|---|---|---|---|
| LSB OF LAST CODEWORD = "0", k≧0 (NEXT DATA IS ONE CORRESPONDING TO NG CODEWORD) |||||
| 8-BIT DATA | LSB | CDS | P | CONNECTION CONDITION FOR NEXT CODEWORD |
| 3C~53 69~6E | "0" | +2 | −1 or +1 | IMPOSSIBLE CONNECTION TO CODEWORD OF MSB "1" (CONNECTION TO CODEWORD IN T0 OR T1 GROUP) |
| 54~68 | "1" | +2 | +1 | IMPOSSIBLE CONNECTION TO CODEWORD OF MSB "1", CONNECTION TO CODEWORD IN T2 GROUP AT k>0 |

\* USE AS SUBCODE OF T2 GROUP

FIG. 40

| T31 GROUP ("0" RUN LENGTH 1 TO 5 AT MSB SIDE) ||||||
|---|---|---|---|---|---|
| LSB OF LAST CODEWORD = "0", k<0 (NEXT DATA IS ONE CORRESPONDING TO NG CODEWORD) ||||||
| 8-BIT DATA | LSB | CDS | P | CONNECTION CONDITION FOR NEXT CODEWORD ||
| 54~5C | "1" | -2 | -1 | IMPOSSIBLE CONNECTION TO CODEWORD OF MSB "1" CONNECTION TO CODEWORD OF CDS=-4 IN T2 GROUP AT k>0 ||
| 5D~68 |  | -4 | -1 | |||
| 90~99 | "0" | -2 | +1 | IMPOSSIBLE CONNECTION TO CODEWORD OF MSB "1" CONNECTION TO CODEWORD IN T1 GROUP AT k<0 ||
| 9A~A8 | "1" | -2 | -1 | IMPOSSIBLE CONNECTION TO CODEWORD OF MSB "1", CONNECTION TO CODEWORD IN T2 GROUP AT k>0 ||

＊ USE AS SUBCODE OF T3 GROUP

FIG. 41

| 8-bit DATA | T0 ($k \geq 0$, LSB = "0") | | | T1 ($k < 0$, LSB = "0") | | |
|---|---|---|---|---|---|---|
| | CODEWORD | CDS | P | CODEWORD | CDS | P |
| 00 | 010101001010 | 0 | + | 010101001010 | 0 | + |
| 01 | 010101010010 | 0 | + | 010101010010 | 0 | + |
| 02 | 010100100000100 | 0 | + | 010100100000100 | 0 | + |
| 03 | 010100001000010 | 0 | + | 010100001000010 | 0 | + |
| 04 | 010010101010 | 0 | + | 010010101010 | 0 | + |
| 05 | 010010001000010 | 0 | + | 010010001000010 | 0 | + |
| 06 | 010010010000100 | 0 | + | 010010010000100 | 0 | + |
| 07 | 010001000100010 | 0 | + | 010001000100010 | 0 | + |
| 08 | 010001001000100 | 0 | + | 010001001000100 | 0 | + |
| 09 | 010000100001010 | 0 | + | 010000100001010 | 0 | + |
| 0A | 010000100010100 | 0 | + | 010000100010100 | 0 | + |
| 0B | 001010100000100 | 0 | + | 001010100000100 | 0 | + |
| 0C | 001010010000010 | 0 | + | 001010010000010 | 0 | + |
| 0D | 001001001000010 | 0 | + | 001001001000010 | 0 | + |
| 0E | 001001010000100 | 0 | + | 001001010000100 | 0 | + |
| 0F | 001000100010010 | 0 | + | 001000100010010 | 0 | + |
| 10 | 001000101000100 | 0 | + | 001000101000100 | 0 | + |
| 11 | 001000010010010 | 0 | + | 001000010010010 | 0 | + |
| 12 | 001000010100100 | 0 | + | 001000010100100 | 0 | + |
| 13 | 000101010000010 | 0 | + | 000101010000010 | 0 | + |
| 14 | 000100101000010 | 0 | + | 000100101000010 | 0 | + |
| 15 | 000100001010100 | 0 | + | 000100001010100 | 0 | + |
| 16 | 000100001010010 | 0 | + | 000100001010010 | 0 | + |
| 17 | 010101001000010 | 0 | − | 010101001000010 | 0 | − |
| 18 | 010101010000100 | 0 | − | 010101010000100 | 0 | − |
| 19 | 010100100010010 | 0 | − | 010100100010010 | 0 | − |
| 1A | 010100101000100 | 0 | − | 010100101000100 | 0 | − |
| 1B | 010100010010100 | 0 | − | 010100010010100 | 0 | − |
| 1C | 010100010100100 | 0 | − | 010100010100100 | 0 | − |
| 1D | 010010101000100 | 0 | − | 010010101000100 | 0 | − |
| 1E | 010010001010100 | 0 | − | 010010001010100 | 0 | − |
| 1F | 010010010100100 | 0 | − | 010010010100100 | 0 | − |
| 20 | 010001000000100 | 0 | − | 010001000000100 | 0 | − |
| 21 | 010000100000010 | 0 | − | 010000100000010 | 0 | − |
| 22 | 001010100100010 | 0 | − | 001010100100010 | 0 | − |
| 23 | 001010101000100 | 0 | − | 001010101000100 | 0 | − |
| 24 | 001010010010100 | 0 | − | 001010010010100 | 0 | − |
| 25 | 001010010101000 | 0 | − | 001010010101000 | 0 | − |
| 26 | 001001001010100 | 0 | − | 001001001010100 | 0 | − |
| 27 | 001001010100010 | 0 | − | 001001010100010 | 0 | − |
| 28 | 001000100000100 | 0 | − | 001000100000100 | 0 | − |
| 29 | 001000010000010 | 0 | − | 001000010000010 | 0 | − |
| 2A | 000101010010100 | 0 | − | 000101010010100 | 0 | − |
| 2B | 000101010100100 | 0 | − | 000101010100100 | 0 | − |
| 2C | 000100101010100 | 0 | − | 000100101010100 | 0 | − |
| 2D | 000100001000010 | 0 | − | 000100001000010 | 0 | − |
| 2E | 000100010001000 | 0 | − | 000100010001000 | 0 | − |
| 2F | 101010100010010 | 0 | + | 101010100010010 | 0 | + |

FIG. 42

| 8-bit DATA | T0 (k≥0, LSB = "0") CODEWORD | CDS | P | T1 (k<0, LSB = "0") CODEWORD | CDS | P |
|---|---|---|---|---|---|---|
| 30 | 101010101000100 | 0 | + | 101010101000100 | 0 | + |
| 31 | 10101001001010 | 0 | + | 10101001001010 | 0 | + |
| 32 | 10101001010100 | 0 | + | 10101001010100 | 0 | + |
| 33 | 10100100101010 | 0 | + | 10100100101010 | 0 | + |
| 34 | 10100101010010 | 0 | + | 10100101010010 | 0 | + |
| 35 | 10100010000100 | 0 | + | 10100010000100 | 0 | + |
| 36 | 10100001000010 | 0 | + | 10100001000010 | 0 | + |
| 37 | 10010101001010 | 0 | + | 10010101001010 | 0 | + |
| 38 | 10010101010100 | 0 | + | 10010101010100 | 0 | + |
| 39 | 10010010101010 | 0 | + | 10010010101010 | 0 | + |
| 3A | 10010000100010 | 0 | + | 10010000100010 | 0 | + |
| 3B | 10010001000100 | 0 | + | 10010001000100 | 0 | + |
| 3C | 10001000010010 | 0 | + | 10001000010010 | 0 | + |
| 3D | 10001000100100 | 0 | + | 10001000100100 | 0 | + |
| 3E | 10000100001010 | 0 | + | 10000100001010 | 0 | + |
| 3F | 10000100010100 | 0 | + | 10000100010100 | 0 | + |
| 40 | 10101010000100 | 0 | − | 10101010000100 | 0 | − |
| 41 | 10101001000010 | 0 | − | 10101001000010 | 0 | − |
| 42 | 10100100100010 | 0 | − | 10100100100010 | 0 | − |
| 43 | 10100101000100 | 0 | − | 10100101000100 | 0 | − |
| 44 | 10100010010010 | 0 | − | 10100010010010 | 0 | − |
| 45 | 10100010100100 | 0 | − | 10100010100100 | 0 | − |
| 46 | 10100001001010 | 0 | − | 10100001001010 | 0 | − |
| 47 | 10100001010100 | 0 | − | 10100001010100 | 0 | − |
| 48 | 10010101000010 | 0 | − | 10010101000010 | 0 | − |
| 49 | 10010010100010 | 0 | − | 10010010100010 | 0 | − |
| 4A | 10010000101010 | 0 | − | 10010000101010 | 0 | − |
| 4B | 10010001010010 | 0 | − | 10010001010010 | 0 | − |
| 4C | 10101010010101 | 0 | − | 01010100010101 | 2 | + |
| 4D | 10101010101001 | 0 | − | 01010100101001 | 2 | + |
| 4E | 10101000100001 | 0 | − | 01010101010001 | 2 | + |
| 4F | 10100100010001 | 0 | − | 01010001000001 | 2 | + |
| 50 | 10100101010101 | 0 | − | 01001010010101 | 2 | + |
| 51 | 10100010001001 | 0 | − | 01001010101001 | 2 | + |
| 52 | 10100001000101 | 0 | − | 01001000100001 | 2 | + |
| 53 | 10010100100001 | 0 | − | 01000100010001 | 2 | + |
| 54 | 01010100100001 | −2 | − | 01000101010101 | 2 | + |
| 55 | 01010010010001 | −2 | − | 01000010001001 | 2 | + |
| 56 | 01010000100101 | −2 | − | 01000001000101 | 2 | + |
| 57 | 01010001001001 | −2 | − | 00101001000001 | 2 | + |
| 58 | 01001010100001 | −2 | − | 00100100100001 | 2 | + |
| 59 | 01001000010101 | −2 | − | 00100010010001 | 2 | + |
| 5A | 01001000101001 | −2 | − | 00100000100101 | 2 | + |
| 5B | 01001001010001 | −2 | − | 00100001001001 | 2 | + |
| 5C | 00101010010001 | −2 | − | 00010101000001 | 2 | + |
| 5D | 00101000100101 | −2 | − | 00100010100001 | 2 | + |
| 5E | 00101001001001 | −2 | − | 00010000010101 | 2 | + |
| 5F | 00100100010101 | −2 | − | 00010000101001 | 2 | + |

FIG. 43

| 8-bit DATA | T0 ($k \geq 0$, LSB = "0") CODEWORD | CDS | P | T1 ($k < 0$, LSB = "0") CODEWORD | CDS | P |
|---|---|---|---|---|---|---|
| 60 | 001100100101001 | -2 | - | 000100001010001 | 2 | + |
| 61 | 001001101010001 | -2 | - | 101010010010001 | 2 | + |
| 62 | 001000001000001 | -2 | - | 101010000100101 | 2 | + |
| 63 | 000101000100101 | -2 | - | 101010001001001 | 2 | + |
| 64 | 000101001001001 | -2 | - | 101001000010101 | 2 | + |
| 65 | 000100100010101 | -2 | - | 101001000101001 | 2 | + |
| 66 | 000100101001001 | -2 | - | 101001010010001 | 2 | + |
| 67 | 000100000100001 | -2 | - | 101000001000001 | 2 | + |
| 68 | 101010001000001 | -2 | - | 100101001000101 | 2 | + |
| 69 | 101001001000001 | -2 | - | 100101010010001 | 2 | + |
| 6A | 101000100010001 | -2 | - | 100100100010101 | 2 | + |
| 6B | 101000001000101 | -2 | - | 100100101010001 | 2 | + |
| 6C | 101000010010001 | -2 | - | 100100000100001 | 2 | + |
| 6D | 100101010000001 | -2 | - | 100010101000101 | 2 | + |
| 6E | 100100101000001 | -2 | - | 100010000100001 | 2 | + |
| 6F | 100100000101001 | -2 | - | 100010010010101 | 2 | + |
| 70 | 100010000101001 | -2 | - | 100000100001001 | 2 | + |
| 71 | 100010001010001 | -2 | - | 100000100000101 | 2 | + |
| 72 | 010101010000001 | -4 | - | 010101000000100 | 2 | + |
| 73 | 010100101000001 | -4 | - | 010100100000010 | 2 | + |
| 74 | 010100000101001 | -4 | - | 010010100000100 | 2 | + |
| 75 | 010100000101001 | -4 | - | 010010010000010 | 2 | + |
| 76 | 010100001010001 | -4 | - | 010001001000010 | 2 | + |
| 77 | 001010101000001 | -4 | - | 010001010000100 | 2 | + |
| 78 | 001010000100101 | -4 | - | 010000100010010 | 2 | + |
| 79 | 001010001010001 | -4 | - | 010000010100100 | 2 | + |
| 7A | 001010010010001 | -4 | - | 010000010100100 | 2 | + |
| 7B | 000101000100101 | -4 | - | 010000010010100 | 2 | + |
| 7C | 000101001010001 | -4 | - | 001010100000010 | 2 | + |
| 7D | 000101010010001 | -4 | - | 001001010000010 | 2 | + |
| 7E | 000100010000001 | -4 | - | 001000100100010 | 2 | + |
| 7F | 101001010000001 | -4 | - | 001000000101010 | 2 | + |
| 80 | 101000101000001 | -4 | - | 001000001010010 | 2 | + |
| 81 | 101000000101001 | -4 | - | 010101000010010 | 2 | - |
| 82 | 101000001010001 | -4 | - | 010101000100100 | 2 | - |
| 83 | 101010100001001 | 0 | + | 010100100001010 | 2 | - |
| 84 | 101010010001001 | 0 | + | 010100100010100 | 2 | - |
| 85 | 101001001001001 | 0 | + | 010010100010010 | 2 | - |
| 86 | 101001010010001 | 0 | + | 010010101000100 | 2 | - |
| 87 | 101000101010001 | 0 | + | 010010010010010 | 2 | - |
| 88 | 101000101001001 | 0 | + | 010010001010100 | 2 | - |
| 89 | 101000000100001 | 0 | + | 010000100101010 | 2 | - |
| 8A | 100101000100101 | 0 | + | 010001010101010 | 2 | - |
| 8B | 100100100100101 | 0 | + | 010000100000100 | 2 | - |
| 8C | 100100000100001 | 0 | + | 010000010000010 | 2 | - |
| 8D | 100100010100101 | 0 | + | 001010100001010 | 2 | - |
| 8E | 100010000101001 | 0 | + | 001010100101010 | 2 | - |
| 8F | 100001000000101 | 0 | + | 001001010010100 | 2 | - |

FIG. 44

| 8-bit DATA | T0 (k≥0, LSB = "0") CODEWORD | CDS | P | T1 (k<0, LSB = "0") CODEWORD | CDS | P |
|---|---|---|---|---|---|---|
| 90 | 010101001001 01 | 0 | + | 001001010101 00 | 2 | − |
| 91 | 010101010010 01 | 0 | + | 001000101010 10 | 2 | − |
| 92 | 010100100101 01 | 0 | + | 001000001000 10 | 2 | − |
| 93 | 010100101010 01 | 0 | + | 001000010001 00 | 2 | − |
| 94 | 010100001000 01 | 0 | + | 000100000100 10 | 2 | − |
| 95 | 010010101001 01 | 0 | + | 000100001001 00 | 2 | − |
| 96 | 010010000100 01 | 0 | + | 101010101000 10 | 2 | + |
| 97 | 010010010101 01 | 0 | + | 101010001010 10 | 2 | + |
| 98 | 010001000010 01 | 0 | + | 101010010100 10 | 2 | + |
| 99 | 010000100001 01 | 0 | + | 101001000001 00 | 2 | + |
| 9A | 001010100101 01 | 0 | + | 101000100000 10 | 2 | + |
| 9B | 001010101010 01 | 0 | + | 100101001010 10 | 2 | + |
| 9C | 001010001000 01 | 0 | + | 100101010100 10 | 2 | + |
| 9D | 001001000100 01 | 0 | + | 100100100001 00 | 2 | + |
| 9E | 001001010101 01 | 0 | + | 100100010000 10 | 2 | + |
| 9F | 001000100010 01 | 0 | + | 100010101010 10 | 2 | + |
| A0 | 001000010001 01 | 0 | + | 100010001000 10 | 2 | + |
| A1 | 000101001000 01 | 0 | + | 100010010001 00 | 2 | + |
| A2 | 000100100100 01 | 0 | + | 100001000100 10 | 2 | + |
| A3 | 000100001001 01 | 0 | + | 100001001000 00 | 2 | + |
| A4 | 000100010010 01 | 0 | + | 100000100010 10 | 2 | + |
| A5 | 101010100001 01 | −2 | + | 100000100101 00 | 2 | + |
| A6 | 101001010001 01 | −2 | + | 101010101010 10 | 2 | − |
| A7 | 101000101001 01 | −2 | + | 101010001000 10 | 2 | − |
| A8 | 101000010101 01 | −2 | + | 101010010001 00 | 2 | − |
| A9 | 010101010001 01 | −2 | + | 101001000100 10 | 2 | − |
| AA | 010100101001 01 | −2 | + | 101001001001 00 | 2 | − |
| AB | 010100000100 01 | −2 | + | 101000100010 10 | 2 | − |
| AC | 010100010101 01 | −2 | + | 101000100101 00 | 2 | − |
| AD | 010010000100 01 | −2 | + | 100101001001 00 | 2 | − |
| AE | 010001000001 01 | −2 | + | 100101010001 00 | 2 | − |
| AF | 001010101001 01 | −2 | + | 100100101001 00 | 2 | − |
| B0 | 001010000100 01 | −2 | + | 100100101001 00 | 2 | − |
| B1 | 001010010101 01 | −2 | + | 100010010100 10 | 2 | − |
| B2 | 001001000010 01 | −2 | + | 100010010101 00 | 2 | − |
| B3 | 001000100001 01 | −2 | + | 100010101000 10 | 2 | − |
| B4 | 000101000100 01 | −2 | + | 100010010101 00 | 2 | − |
| B5 | 000101010101 01 | −2 | + | 100010010100 10 | 2 | − |
| B6 | 000100100100 01 | −2 | + | 100001000001 00 | 2 | − |
| B7 | 000100010001 01 | −2 | + | 100000100000 10 | 2 | − |
| B8 | 010101010010 10 | −2 | + | 010101000010 01 | 2 | − |
| B9 | 010101010101 00 | −2 | + | 010100100001 01 | 2 | − |
| BA | 010100101010 10 | −2 | + | 010010100010 01 | 2 | − |
| BB | 010100001000 10 | −2 | + | 010010010001 01 | 2 | − |
| BC | 010100010001 00 | −2 | + | 010001001001 01 | 2 | − |
| BD | 010010000101 00 | −2 | + | 010001010010 01 | 2 | − |
| BE | 010010001000 10 | −2 | + | 010000100010 01 | 2 | − |
| BF | 010001000010 10 | −2 | + | 010000101010 01 | 2 | − |

FIG. 45

| 8-bit DATA | T0 ($k \geq 0$, LSB = "0") CODEWORD | CDS | P | T1 ($k < 0$, LSB = "0") CODEWORD | CDS | P |
|---|---|---|---|---|---|---|
| C0 | 01000100010100 | -2 | + | 00101010000101 | 2 | - |
| C1 | 00101010101010 | -2 | + | 00100101000101 | 2 | - |
| C2 | 00101000100010 | -2 | + | 00100010100101 | 2 | - |
| C3 | 00101001000100 | -2 | + | 00100001010101 | 2 | - |
| C4 | 00100100010010 | -2 | + | 01010100000101 | 4 | - |
| C5 | 00100100100100 | -2 | + | 10101000001001 | 4 | - |
| C6 | 00100010001010 | -2 | + | 10100100000101 | 4 | - |
| C7 | 00100010010100 | -2 | + | 10010100001001 | 4 | - |
| C8 | 00010100100010 | -2 | + | 10010010000101 | 4 | - |
| C9 | 00010101000100 | -2 | + | 10001010001001 | 4 | - |
| CA | 00010010010010 | -2 | + | 10001001000101 | 4 | - |
| CB | 00010010100100 | -2 | + | 10000100100101 | 4 | - |
| CC | 00010001001010 | -2 | + | 10000101001001 | 4 | - |
| CD | 00010001010100 | -2 | + | 10000010010101 | 4 | - |
| CE | 01010101000010 | -2 | - | 10000010101001 | 4 | - |
| CF | 01010010100010 | -2 | - | 01001010000010 | 4 | + |
| D0 | 01010000101010 | -2 | - | 01000101000010 | 4 | + |
| D1 | 01010001010010 | -2 | - | 01000010100010 | 4 | + |
| D2 | 00101010100010 | -2 | - | 01000001010010 | 4 | + |
| D3 | 00101000101010 | -2 | - | 01010100001010 | 4 | - |
| D4 | 00101001010010 | -2 | - | 01010100010100 | 4 | - |
| D5 | 00100100100010 | -2 | - | 01001010001010 | 4 | - |
| D6 | 00100010000010 | -2 | - | 01001010010100 | 4 | - |
| D7 | 00010100101010 | -2 | - | 01000101001010 | 4 | - |
| D8 | 00010101010010 | -2 | - | 01000101010100 | 4 | - |
| D9 | 00010010000100 | -2 | - | 01000010101010 | 4 | - |
| DA | 00010001000010 | -2 | - | 01000001000100 | 4 | - |
| DB | 10101010001010 | -2 | + | 00100000100100 | 4 | - |
| DC | 10101010010100 | -2 | + | 00010000010100 | 4 | - |
| DD | 10100101001010 | -2 | + | 10010100000100 | 4 | + |
| DE | 10100101010100 | -2 | + | 10010010000010 | 4 | + |
| DF | 10100010101010 | -2 | + | 10001010000100 | 4 | + |
| E0 | 10100000100010 | -2 | + | 10001001000010 | 4 | + |
| E1 | 10100001000100 | -2 | + | 10000100100010 | 4 | + |
| E2 | 10010000010010 | -2 | + | 10000101000100 | 4 | + |
| E3 | 10010000100100 | -2 | + | 10000010010010 | 4 | + |
| E4 | 10001000001010 | -2 | + | 10000010100100 | 4 | + |
| E5 | 10001000010100 | -2 | + | 10101000010010 | 4 | - |
| E6 | 10101010000010 | -2 | - | 10101000100100 | 4 | - |
| E7 | 10100101000010 | -2 | - | 10100100001010 | 4 | - |
| E8 | 10100010100010 | -2 | - | 10100100010100 | 4 | - |
| E9 | 10100000101010 | -2 | - | 10010100010010 | 4 | - |
| EA | 10100001010010 | -2 | - | 10010100100100 | 4 | - |
| EB | 01010000010010 | -4 | + | 10010010001010 | 4 | - |
| EC | 01010000100100 | -4 | + | 10010010010100 | 4 | - |
| ED | 01001000001010 | -4 | + | 10001010010010 | 4 | - |
| EE | 01001000010100 | -4 | + | 10001010100100 | 4 | - |
| EF | 00101000010010 | -4 | + | 10001001001010 | 4 | - |

FIG. 46

| 8-bit DATA | T0 ($k \geq 0$, LSB = "0") CODEWORD | CDS | P | T1 ($k < 0$, LSB = "0") CODEWORD | CDS | P |
|---|---|---|---|---|---|---|
| F0 | 00101000100100 | -4 | + | 10001001010100 | 4 | - |
| F1 | 00100100001010 | -4 | + | 10000100101010 | 4 | - |
| F2 | 00100100010100 | -4 | + | 10000101010010 | 4 | - |
| F3 | 00010100010010 | -4 | + | 10000010000100 | 4 | - |
| F4 | 00010100100100 | -4 | + | 10001010000010 | 6 | + |
| F5 | 00010010001010 | -4 | + | 10000101000010 | 6 | + |
| F6 | 00010010010100 | -4 | + | 10000010100010 | 6 | + |
| F7 | 00010100000100 | -4 | - | 10101000001010 | 6 | - |
| F8 | 00010010000010 | -4 | - | 10101000010100 | 6 | - |
| F9 | 10100000100100 | -4 | + | 10010100001010 | 6 | - |
| FA | 10010000010100 | -4 | + | 10010100010100 | 6 | - |
| FB | 01010000010100 | -6 | + | 10001010001010 | 6 | - |
| FC | 00101000001010 | -6 | + | 10001010010100 | 6 | - |
| FD | 00101000010100 | -6 | + | 10000101001010 | 6 | - |
| FE | 00010100001010 | -6 | + | 10000101010100 | 6 | - |
| FF | 00010100010100 | -6 | + | 10000010101010 | 6 | - |

FIG. 47

| 8-bit DATA | T2 ($k \geq 0$, LSB = "1") CODEWORD | CDS | P | T3 ($k < 0$, LSB = "1") CODEWORD | CDS | P |
|---|---|---|---|---|---|---|
| 00 | 010101000101010 | 0 | + | 010101000101010 | 0 | + |
| 01 | 010101010100010 | 0 | + | 010101010100010 | 0 | + |
| 02 | 010100100000100 | 0 | + | 010100100000100 | 0 | + |
| 03 | 010100010000010 | 0 | + | 010100010000010 | 0 | + |
| 04 | 010010101010100 | 0 | + | 010010101010100 | 0 | + |
| 05 | 010010001000010 | 0 | + | 010010001000010 | 0 | + |
| 06 | 010010010000100 | 0 | + | 010010010000100 | 0 | + |
| 07 | 010001000100010 | 0 | + | 010001000100010 | 0 | + |
| 08 | 010001001000100 | 0 | + | 010001001000100 | 0 | + |
| 09 | 010000100001010 | 0 | + | 010000100001010 | 0 | + |
| 0A | 010000100101000 | 0 | + | 010000100101000 | 0 | + |
| 0B | 001010100000100 | 0 | + | 001010100000100 | 0 | + |
| 0C | 001010010000010 | 0 | + | 001010010000010 | 0 | + |
| 0D | 001001001000010 | 0 | + | 001001001000010 | 0 | + |
| 0E | 001001010000100 | 0 | + | 001001010000100 | 0 | + |
| 0F | 001000100010010 | 0 | + | 001000100010010 | 0 | + |
| 10 | 001000101000100 | 0 | + | 001000101000100 | 0 | + |
| 11 | 001000010001010 | 0 | + | 001000010001010 | 0 | + |
| 12 | 001000010101000 | 0 | + | 001000010101000 | 0 | + |
| 13 | 000101010000010 | 0 | + | 000101010000010 | 0 | + |
| 14 | 000100101000010 | 0 | + | 000100101000010 | 0 | + |
| 15 | 000100001010100 | 0 | + | 000100001010100 | 0 | + |
| 16 | 000100010100010 | 0 | + | 000100010100010 | 0 | + |
| 17 | 010101001000010 | 0 | − | 010101001000010 | 0 | − |
| 18 | 010101010001000 | 0 | − | 010101010001000 | 0 | − |
| 19 | 010100100010010 | 0 | − | 010100100010010 | 0 | − |
| 1A | 010100101001000 | 0 | − | 010100101001000 | 0 | − |
| 1B | 010100010010100 | 0 | − | 010100010010100 | 0 | − |
| 1C | 010100010101000 | 0 | − | 010100010101000 | 0 | − |
| 1D | 010010101000010 | 0 | − | 010010101000010 | 0 | − |
| 1E | 010010001010100 | 0 | − | 010010001010100 | 0 | − |
| 1F | 010010010101000 | 0 | − | 010010010101000 | 0 | − |
| 20 | 010001000000100 | 0 | − | 010001000000100 | 0 | − |
| 21 | 010000100000010 | 0 | − | 010000100000010 | 0 | − |
| 22 | 001010100010010 | 0 | − | 001010100010010 | 0 | − |
| 23 | 001010101000100 | 0 | − | 001010101000100 | 0 | − |
| 24 | 001010010010010 | 0 | − | 001010010010010 | 0 | − |
| 25 | 001010010101000 | 0 | − | 001010010101000 | 0 | − |
| 26 | 001001000101010 | 0 | − | 001001000101010 | 0 | − |
| 27 | 001001010100010 | 0 | − | 001001010100010 | 0 | − |
| 28 | 001000100000100 | 0 | − | 001000100000100 | 0 | − |
| 29 | 001000010000010 | 0 | − | 001000010000010 | 0 | − |
| 2A | 000101010010100 | 0 | − | 000101010010100 | 0 | − |
| 2B | 000101010101000 | 0 | − | 000101010101000 | 0 | − |
| 2C | 000100101010100 | 0 | − | 000100101010100 | 0 | − |
| 2D | 000100001000100 | 0 | − | 000100001000100 | 0 | − |
| 2E | 000100010001000 | 0 | − | 000100010001000 | 0 | − |
| 2F | 000010000100100 | 0 | − | 000010000100100 | 0 | − |

FIG. 48

| 8-bit DATA | T2 ($k \geq 0$, LSB = "1") CODEWORD | CDS | P | T3 ($k < 0$, LSB = "1") CODEWORD | CDS | P |
|---|---|---|---|---|---|---|
| 30 | 000010001001000 | 0 | − | 000010001001000 | 0 | − |
| 31 | 000001000010100 | 0 | − | 000001000010100 | 0 | − |
| 32 | 000001000101000 | 0 | − | 000001000101000 | 0 | − |
| 33 | 010100000101000 | −6 | + | 010001010000001 | 6 | + |
| 34 | 001010000010100 | −6 | + | 010000101000001 | 6 | + |
| 35 | 001010000101000 | −6 | + | 010000010100001 | 6 | + |
| 36 | 000101000010100 | −6 | + | 010101000000101 | 4 | − |
| 37 | 000101000101000 | −6 | + | 010010100000101 | 4 | − |
| 38 | 000010100001010 | −6 | + | 010010100000010 | 4 | + |
| 39 | 000010100101000 | −6 | + | 010001010000010 | 4 | + |
| 3A | 000001010010100 | −6 | + | 010000101000010 | 4 | + |
| 3B | 000001010101000 | −6 | + | 010000010100010 | 4 | + |
| 3C | 010101000100001 | 0 | − | 010101000100001 | 0 | − |
| 3D | 010101010101001 | 0 | − | 010101010101001 | 0 | − |
| 3E | 010100100010001 | 0 | − | 010100100010001 | 0 | − |
| 3F | 010100010001001 | 0 | − | 010100010001001 | 0 | − |
| 40 | 010010100100001 | 0 | − | 010010100100001 | 0 | − |
| 41 | 010010001000101 | 0 | − | 010010001000101 | 0 | − |
| 42 | 010010010010001 | 0 | − | 010010010010001 | 0 | − |
| 43 | 010001000100101 | 0 | − | 010001000100101 | 0 | − |
| 44 | 010001000101001 | 0 | − | 010001000101001 | 0 | − |
| 45 | 010001010100001 | 0 | − | 010001010100001 | 0 | − |
| 46 | 010000010000001 | 0 | − | 010000010000001 | 0 | − |
| 47 | 001010100010001 | 0 | − | 001010100010001 | 0 | − |
| 48 | 001010010001001 | 0 | − | 001010010001001 | 0 | − |
| 49 | 001001001001001 | 0 | − | 001001001001001 | 0 | − |
| 4A | 001001010010001 | 0 | − | 001001010010001 | 0 | − |
| 4B | 001000100010101 | 0 | − | 001000100010101 | 0 | − |
| 4C | 001000101010001 | 0 | − | 001000101010001 | 0 | − |
| 4D | 001000000100001 | 0 | − | 001000000100001 | 0 | − |
| 4E | 000101010001001 | 0 | − | 000101010001001 | 0 | − |
| 4F | 000100101001001 | 0 | − | 000100101001001 | 0 | − |
| 50 | 000100000100001 | 0 | − | 000100000100001 | 0 | − |
| 51 | 000100010101001 | 0 | − | 000100010101001 | 0 | − |
| 52 | 000010000010001 | 0 | − | 000010000010001 | 0 | − |
| 53 | 000001000000101 | 0 | − | 000001000000101 | 0 | − |
| 54 | 010101001000001 | −2 | − | 010101000101001 | 2 | + |
| 55 | 010100101000001 | −2 | − | 010101001010001 | 2 | + |
| 56 | 010100001001010 | −2 | − | 010101010101001 | 2 | + |
| 57 | 010100010010010 | −2 | − | 010100010000001 | 2 | + |
| 58 | 010010101000001 | −2 | − | 010010100101001 | 2 | + |
| 59 | 010010000100101 | −2 | − | 010010101010001 | 2 | + |
| 5A | 010010001010010 | −2 | − | 010010001000001 | 2 | + |
| 5B | 010010010100101 | −2 | − | 010001000100001 | 2 | + |
| 5C | 001010100100001 | −2 | − | 010001010101001 | 2 | + |
| 5D | 001010001001001 | −2 | − | 010000100010001 | 2 | + |
| 5E | 001010010010101 | −2 | − | 010000010001001 | 2 | + |
| 5F | 001001000101001 | −2 | − | 001010010000001 | 2 | + |

FIG. 49

| 8-bit DATA | T2 (k≥0, LSB = "1") CODEWORD | CDS | P | T3 (k<0, LSB = "1") CODEWORD | CDS | P |
|---|---|---|---|---|---|---|
| 60 | 001001001001001 | -2 | - | 001001001000001 | 2 | + |
| 61 | 001001010010001 | -2 | - | 001000100100001 | 2 | + |
| 62 | 001000010000001 | -2 | - | 001000001001001 | 2 | + |
| 63 | 000101000100101 | -2 | - | 001000001001001 | 2 | + |
| 64 | 000101010010001 | -2 | - | 000101010000001 | 2 | + |
| 65 | 000100101001001 | -2 | - | 000100101000001 | 2 | + |
| 66 | 000100101010001 | -2 | - | 000100000010101 | 2 | + |
| 67 | 000100001000001 | -2 | - | 000100000101001 | 2 | + |
| 68 | 000010101001001 | -2 | - | 000100001010001 | 2 | + |
| 69 | 000010000010001 | -2 | - | 010101000001001 | 2 | + |
| 6A | 000010010101001 | -2 | - | 010100100000010 | 2 | + |
| 6B | 000001000001001 | -2 | - | 010010100000100 | 2 | + |
| 6C | 000101000000101 | -6 | + | 010010010000010 | 2 | + |
| 6D | 000010100000101 | -6 | + | 010001001000010 | 2 | + |
| 6E | 000001010000101 | -6 | + | 010001010000100 | 2 | + |
| 6F | 010101010000001 | -4 | - | 010000100100010 | 2 | + |
| 70 | 010100101000001 | -4 | - | 010000101000100 | 2 | + |
| 71 | 010100001010001 | -4 | - | 010000010010010 | 2 | + |
| 72 | 010100010100001 | -4 | - | 010000100100100 | 2 | + |
| 73 | 010100010010001 | -4 | - | 001010100000010 | 2 | + |
| 74 | 001010101001001 | -4 | - | 001001010000010 | 2 | + |
| 75 | 001010010010101 | -4 | - | 001000101000010 | 2 | + |
| 76 | 001010010101001 | -4 | - | 001000000101010 | 2 | + |
| 77 | 001010010100001 | -4 | - | 001000001010010 | 2 | + |
| 78 | 000101000010101 | -4 | - | 010101000001001 | 2 | - |
| 79 | 000101001010001 | -4 | - | 010100100000101 | 2 | - |
| 7A | 000101010100001 | -4 | - | 010010100001001 | 2 | - |
| 7B | 000100010000001 | -4 | - | 010010010000101 | 2 | - |
| 7C | 000010100101001 | -4 | - | 010001001001001 | 2 | - |
| 7D | 000010101010001 | -4 | - | 010000101001001 | 2 | - |
| 7E | 000001000100001 | -4 | - | 010000010010101 | 2 | - |
| 7F | 000001000100001 | -4 | - | 010000010101001 | 2 | - |
| 80 | 000001010101001 | -4 | - | 001010101010001 | 2 | - |
| 81 | 000010010000001 | -6 | - | 001010100000101 | 2 | - |
| 82 | 000001000100001 | -6 | - | 001001010000101 | 2 | - |
| 83 | 000001010000001 | -6 | - | 001000101000101 | 2 | - |
| 84 | 001010000010001 | -4 | + | 010010010001001 | 4 | + |
| 85 | 001001000000101 | -4 | + | 010001000100001 | 4 | + |
| 86 | 000101000010001 | -4 | + | 010000100010001 | 4 | + |
| 87 | 000100101000001 | -4 | + | 010000010010001 | 4 | + |
| 88 | 000010101000101 | -4 | + | 001001010000001 | 4 | + |
| 89 | 000010001000101 | -4 | + | 001000101000001 | 4 | + |
| 8A | 000001000100101 | -4 | + | 001000001001001 | 4 | + |
| 8B | 000001001001001 | -4 | + | 001000010100001 | 4 | + |
| 8C | 000010100000010 | -6 | - | 010101000010010 | 4 | - |
| 8D | 000001010000010 | -6 | - | 010100100010100 | 4 | - |
| 8E | 010101010101010 | -2 | + | 010010100001010 | 4 | - |
| 8F | 010101010100100 | -2 | + | 010010100010100 | 4 | - |

FIG. 50

| 8-bit DATA | T2 ($k \geq 0$, LSB = "1") CODEWORD | CDS | P | T3 ($k < 0$, LSB = "1") CODEWORD | CDS | P |
|---|---|---|---|---|---|---|
| 90 | 01010100100101 | 0 | + | 01010100100101 | 0 | + |
| 91 | 01010101001001 | 0 | + | 01010101001001 | 0 | + |
| 92 | 01010010010101 | 0 | + | 01010010010101 | 0 | + |
| 93 | 01010010101001 | 0 | + | 01010010101001 | 0 | + |
| 94 | 01010000100001 | 0 | + | 01010000100001 | 0 | + |
| 95 | 01001010100101 | 0 | + | 01001010100101 | 0 | + |
| 96 | 01001000010001 | 0 | + | 01001000010001 | 0 | + |
| 97 | 01001001010101 | 0 | + | 01001001010101 | 0 | + |
| 98 | 01000100001001 | 0 | + | 01000100001001 | 0 | + |
| 99 | 01000010000101 | 0 | + | 01000010000101 | 0 | + |
| 9A | 00101010010101 | 0 | + | 00101010010101 | 0 | + |
| 9B | 00101010101001 | 0 | + | 00101010101001 | 0 | + |
| 9C | 00101000100001 | 0 | + | 00101000100001 | 0 | + |
| 9D | 00100100010001 | 0 | + | 00100100010001 | 0 | + |
| 9E | 00100101010101 | 0 | + | 00100101010101 | 0 | + |
| 9F | 00100010001001 | 0 | + | 00100010001001 | 0 | + |
| A0 | 00100001000101 | 0 | + | 00100001000101 | 0 | + |
| A1 | 00010100100001 | 0 | + | 00010100100001 | 0 | + |
| A2 | 00010010010001 | 0 | + | 00010010010001 | 0 | + |
| A3 | 00010000100101 | 0 | + | 00010000100101 | 0 | + |
| A4 | 00010001001001 | 0 | + | 00010001001001 | 0 | + |
| A5 | 00001010100001 | 0 | + | 00001010100001 | 0 | + |
| A6 | 00001000010101 | 0 | + | 00001000010101 | 0 | + |
| A7 | 00001000101001 | 0 | + | 00001000101001 | 0 | + |
| A8 | 00001001010001 | 0 | + | 00001001010001 | 0 | + |
| A9 | 01010101000101 | -2 | + | 01010100010010 | 2 | - |
| AA | 01010010100101 | -2 | + | 01010100100100 | 2 | - |
| AB | 01010000010001 | -2 | + | 01010010001010 | 2 | - |
| AC | 01010001010101 | -2 | + | 01010010010100 | 2 | - |
| AD | 01001000001001 | -2 | + | 01001010010010 | 2 | - |
| AE | 01000100000101 | -2 | + | 01001010100100 | 2 | - |
| AF | 00101010100101 | -2 | + | 01001001001010 | 2 | - |
| B0 | 00101000010001 | -2 | + | 01001001010100 | 2 | - |
| B1 | 00101001010101 | -2 | + | 01000100101010 | 2 | - |
| B2 | 00100100001001 | -2 | + | 01000101010010 | 2 | - |
| B3 | 00100010000101 | -2 | + | 01000010000100 | 2 | - |
| B4 | 00010100010001 | -2 | + | 01000001000010 | 2 | - |
| B5 | 00010101010101 | -2 | + | 00101010001010 | 2 | - |
| B6 | 00010010001001 | -2 | + | 00101010010100 | 2 | - |
| B7 | 00010001000101 | -2 | + | 00100101001010 | 2 | - |
| B8 | 00001010010001 | -2 | + | 00100101010100 | 2 | - |
| B9 | 00001000100101 | -2 | + | 00100010101010 | 2 | - |
| BA | 00001001001001 | -2 | + | 00100000100010 | 2 | - |
| BB | 00000100010101 | -2 | + | 00100001000100 | 2 | - |
| BC | 00000100101001 | -2 | + | 00010000010010 | 2 | - |
| BD | 00000101010001 | -2 | + | 00010000100100 | 2 | - |
| BE | 01010010101010 | -2 | + | 00001000001010 | 2 | - |
| BF | 01010000100010 | -2 | + | 00001000010100 | 2 | - |

FIG. 51

| 8-bit DATA | T2 ($k \geq 0$ LSB = "1") CODEWORD | CDS | P | T3 ($k < 0$ LSB = "1") CODEWORD | CDS | P |
|---|---|---|---|---|---|---|
| C0 | 01010001000100 | -2 | + | 01000101001010 | 4 | - |
| C1 | 01001000010010 | -2 | + | 01000101010100 | 4 | - |
| C2 | 01001000100100 | -2 | + | 01000010101010 | 4 | - |
| C3 | 01000100001010 | -2 | + | 01000001000100 | 4 | - |
| C4 | 01000100010100 | -2 | + | 00100000100100 | 4 | - |
| C5 | 00101010101010 | -2 | + | 00010000010100 | 4 | - |
| C6 | 00101000100010 | -2 | + | 00101000100010 | -2 | + |
| C7 | 00101001000100 | -2 | + | 00101001000100 | -2 | + |
| C8 | 00100100010010 | -2 | + | 00100100010010 | -2 | + |
| C9 | 00100100100100 | -2 | + | 00100100100100 | -2 | + |
| CA | 00100010001010 | -2 | + | 00100010001010 | -2 | + |
| CB | 00100010010100 | -2 | + | 00100010010100 | -2 | + |
| CC | 00010100100010 | -2 | + | 00010100100010 | -2 | + |
| CD | 00010101000100 | -2 | + | 00010101000100 | -2 | + |
| CE | 00010010010010 | -2 | + | 00010010010010 | -2 | + |
| CF | 00010010100100 | -2 | + | 00010010100100 | -2 | + |
| D0 | 00010001001010 | -2 | + | 00010001001010 | -2 | + |
| D1 | 00010001010100 | -2 | + | 00010001010100 | -2 | + |
| D2 | 00001010100010 | -2 | + | 00001010100010 | -2 | + |
| D3 | 00001000101010 | -2 | + | 00001000101010 | -2 | + |
| D4 | 00001001010010 | -2 | + | 00001001010010 | -2 | + |
| D5 | 00000100000100 | -2 | + | 00000100000100 | -2 | + |
| D6 | 01010101000010 | -2 | - | 01010101000010 | -2 | - |
| D7 | 01010010100010 | -2 | - | 01010010100010 | -2 | - |
| D8 | 01010000101010 | -2 | - | 01010000101010 | -2 | - |
| D9 | 01010001010010 | -2 | - | 01010001010010 | -2 | - |
| DA | 00101010100010 | -2 | - | 00101010100010 | -2 | - |
| DB | 00101000101010 | -2 | - | 00101000101010 | -2 | - |
| DC | 00101001010010 | -2 | - | 00101001010010 | -2 | - |
| DD | 00100100000100 | -2 | - | 00100100000100 | -2 | - |
| DE | 00100010000010 | -2 | - | 00100010000010 | -2 | - |
| DF | 00010100101010 | -2 | - | 00010100101010 | -2 | - |
| E0 | 00010101010010 | -2 | - | 00010101010010 | -2 | - |
| E1 | 00010010000100 | -2 | - | 00010010000100 | -2 | - |
| E2 | 00010001000010 | -2 | - | 00010001000010 | -2 | - |
| E3 | 00001010101010 | -2 | - | 00001010101010 | -2 | - |
| E4 | 00001000100010 | -2 | - | 00001000100010 | -2 | - |
| E5 | 00001001000100 | -2 | - | 00001001000100 | -2 | - |
| E6 | 00000100010010 | -2 | - | 00000100010010 | -2 | - |
| E7 | 00000100100100 | -2 | - | 00000100100100 | -2 | - |
| E8 | 01010000010010 | -4 | + | 01010000010010 | -4 | + |
| E9 | 01010000100100 | -4 | + | 01010000100100 | -4 | + |
| EA | 01001000001010 | -4 | + | 01001000001010 | -4 | + |
| EB | 01001000010100 | -4 | + | 01001000010100 | -4 | + |
| EC | 00101000010010 | -4 | + | 00101000010010 | -4 | + |
| ED | 00101000100100 | -4 | + | 00101000100100 | -4 | + |
| EE | 00100100001010 | -4 | + | 00100100001010 | -4 | + |
| EF | 00100100010100 | -4 | + | 00100100010100 | -4 | + |

FIG. 52

| 8-bit DATA | T2 ($k \geq 0$, LSB = "1") | | | T3 ($k < 0$, LSB = "1") | | |
|---|---|---|---|---|---|---|
| | CODEWORD | CDS | P | CODEWORD | CDS | P |
| F0 | 00010100010010 | -4 | + | 00010100010010 | -4 | + |
| F1 | 00010100100100 | -4 | + | 00010100100100 | -4 | + |
| F2 | 00010010001010 | -4 | + | 00010010001010 | -4 | + |
| F3 | 00010010010100 | -4 | + | 00010010010100 | -4 | + |
| F4 | 00001010010010 | -4 | + | 00001010010010 | -4 | + |
| F5 | 00001010100100 | -4 | + | 00001010100100 | -4 | + |
| F6 | 00001001001010 | -4 | + | 00001001001010 | -4 | + |
| F7 | 00001001010100 | -4 | + | 00001001010100 | -4 | + |
| F8 | 00000100101010 | -4 | + | 00000100101010 | -4 | + |
| F9 | 00000101010010 | -4 | + | 00000101010010 | -4 | + |
| FA | 00010100000100 | -4 | − | 00010100000100 | -4 | − |
| FB | 00010010000010 | -4 | − | 00010010000010 | -4 | − |
| FC | 00001010000100 | -4 | − | 00001010000100 | -4 | − |
| FD | 00001001000010 | -4 | − | 00001001000010 | -4 | − |
| FE | 00000100100010 | -4 | − | 00000100100010 | -4 | − |
| FF | 00000101000100 | -4 | − | 00000101000100 | -4 | − |

FIG. 53

| 8-bit DATA | T01 (SUBCODE OF T0) CODEWORD | CDS | P | T11 (SUBCODE OF T1) CODEWORD | CDS | P |
|---|---|---|---|---|---|---|
| 4C | 0101010000101010101 | 2 | + | 1010101010010101 | 0 | - |
| 4D | 0101010010101001 | 2 | + | 1010101010101001 | 0 | - |
| 4E | 0101010101010001 | 2 | + | 1010100010000001 | 0 | - |
| 4F | 0101000100000001 | 2 | + | 1010010010010001 | 0 | - |
| 50 | 0100101001010101 | 2 | + | 1010010101010101 | 0 | - |
| 51 | 0100101010101001 | 2 | + | 1010001000101001 | 0 | - |
| 52 | 0100100010000001 | 2 | + | 1010000100000101 | 0 | - |
| 53 | 0100010001000001 | 2 | + | 1001010010000001 | 0 | - |
| 54 | 0100010101010101 | 2 | + | 0101010100000001 | -2 | - |
| 55 | 0100001000101001 | 2 | + | 0101001001000001 | -2 | - |
| 56 | 0100000100000101 | 2 | + | 0101000010010101 | -2 | - |
| 57 | 0010100100000001 | 2 | + | 0101000010010001 | -2 | - |
| 58 | 0010010010000001 | 2 | + | 0100101010000001 | -2 | - |
| 59 | 0010001001010001 | 2 | + | 0100100000101001 | -2 | - |
| 5A | 0010000010010101 | 2 | + | 0100100010100101 | -2 | - |
| 5B | 0010000100010001 | 2 | + | 0100100001010101 | -2 | - |
| 5C | 0001010101000001 | 2 | + | 0010101001010001 | -2 | - |
| 5D | 0001001010000001 | 2 | + | 0010100010001001 | -2 | - |
| 5E | 0001000001010101 | 2 | + | 0010100100100001 | -2 | - |
| 5F | 0001000100101001 | 2 | + | 0010010001001001 | -2 | - |
| 60 | 0001000101010001 | 2 | + | 0010010010100001 | -2 | - |
| 61 | 1010101001010001 | 2 | + | 0010010101010001 | -2 | - |
| 62 | 1010100010010101 | 2 | + | 0010000100000001 | -2 | - |
| 63 | 1010100010001001 | 2 | + | 0001010010010101 | -2 | - |
| 64 | 1010010010010101 | 2 | + | 0001010010100001 | -2 | - |
| 65 | 1010010010101001 | 2 | + | 0001001001000101 | -2 | - |
| 66 | 1010010101010001 | 2 | + | 0001001010100001 | -2 | - |
| 67 | 1010000100000001 | 2 | + | 0001000010100001 | -2 | - |
| 68 | 1001010010000101 | 2 | + | 1010100100000001 | -2 | - |
| 69 | 1001010101001001 | 2 | + | 1010010010010001 | -2 | - |
| 6A | 1001001001010101 | 2 | + | 1010001001010001 | -2 | - |
| 6B | 1001001010101001 | 2 | + | 1010000010000101 | -2 | - |
| 6C | 1001000010000001 | 2 | + | 1010000100100101 | -2 | - |
| 6D | 1000101010010101 | 2 | + | 1001010100000001 | -2 | - |
| 6E | 1000100010010001 | 2 | + | 1001001010001001 | -2 | - |
| 6F | 1000100100101001 | 2 | + | 1001001000010101 | -2 | - |
| 70 | 1000010000101001 | 2 | + | 1001000010100001 | -2 | - |
| 71 | 1000001000010101 | 2 | + | 1001000101010001 | -2 | - |

FIG. 54

| 8-bit DATA | T21 (SUBCODE OF T2) CODEWORD | CDS | P |
|---|---|---|---|
| 3C | 01010100010010 | 2 | − |
| 3D | 01010100100100 | 2 | − |
| 3E | 01010010001010 | 2 | − |
| 3F | 01010010010100 | 2 | − |
| 40 | 01001010010010 | 2 | − |
| 41 | 01001010100100 | 2 | − |
| 42 | 01001001001010 | 2 | − |
| 43 | 01001001010100 | 2 | − |
| 44 | 01000100101010 | 2 | − |
| 45 | 01000101010010 | 2 | − |
| 46 | 01000010000100 | 2 | − |
| 47 | 01000001000010 | 2 | − |
| 48 | 00101010001010 | 2 | − |
| 49 | 00101010010100 | 2 | − |
| 4A | 00100101001010 | 2 | − |
| 4B | 00100101010100 | 2 | − |
| 4C | 00100010101010 | 2 | − |
| 4D | 00100000100010 | 2 | − |
| 4E | 00100001000100 | 2 | − |
| 4F | 00010000010010 | 2 | − |
| 50 | 00010000100100 | 2 | − |
| 51 | 00001000001010 | 2 | − |
| 52 | 00001000010100 | 2 | − |
| 53 | 01000010010010 | 2 | + |
| 54 | 01010100010101 | 2 | + |
| 55 | 01010100101001 | 2 | + |
| 56 | 01010101010001 | 2 | + |
| 57 | 01010001000001 | 2 | + |
| 58 | 01001010010101 | 2 | + |
| 59 | 01001010101001 | 2 | + |
| 5A | 01001000100001 | 2 | + |
| 5B | 01000100010001 | 2 | + |
| 5C | 01000101010101 | 2 | + |
| 5D | 01000010001001 | 2 | + |
| 5E | 01000001000101 | 2 | + |
| 5F | 00101001000001 | 2 | + |
| 60 | 00100100100001 | 2 | + |
| 61 | 00100010010001 | 2 | + |
| 62 | 00100000100101 | 2 | + |
| 63 | 00100001001001 | 2 | + |
| 64 | 00010101000001 | 2 | + |
| 65 | 00010010100001 | 2 | + |
| 66 | 00010000010101 | 2 | + |
| 67 | 00010000101001 | 2 | + |
| 68 | 00010001010001 | 2 | + |
| 69 | 01010100000100 | 2 | + |
| 6A | 01010010000010 | 2 | + |
| 6B | 01001010000100 | 2 | + |
| 6C | 01001001000010 | 2 | + |
| 6D | 01000100100010 | 2 | + |
| 6E | 01000101000100 | 2 | + |

FIG. 55

| 8-bit DATA | T31 ( SUBCODE OF T3 ) | | |
|---|---|---|---|
| | CODEWORD | CDS | P |
| 54 | 01010100100001 | -2 | - |
| 55 | 01010010010001 | -2 | - |
| 56 | 01010000100101 | -2 | - |
| 57 | 01010001001001 | -2 | - |
| 58 | 01001010100001 | -2 | - |
| 59 | 01001000010101 | -2 | - |
| 5A | 01001000101001 | -2 | - |
| 5B | 01001001010001 | -2 | - |
| 5C | 00101010010001 | -2 | - |
| 5D | 01010101000001 | -4 | - |
| 5E | 01010010100001 | -4 | - |
| 5F | 01010000010101 | -4 | - |
| 60 | 01010000101001 | -4 | - |
| 61 | 01010001010001 | -4 | - |
| 62 | 00101010100001 | -4 | - |
| 63 | 00101000010101 | -4 | - |
| 64 | 00101000101001 | -4 | - |
| 65 | 00101001010001 | -4 | - |
| 66 | 00010100010101 | -4 | - |
| 67 | 00010100101001 | -4 | - |
| 68 | 00010101010001 | -4 | - |
| ... | ... | | |
| 90 | 01010101001010 | -2 | + |
| 91 | 01010101010100 | -2 | + |
| 92 | 01010010101010 | -2 | + |
| 93 | 01010000100010 | -2 | + |
| 94 | 01010001000100 | -2 | + |
| 95 | 01001000010010 | -2 | + |
| 96 | 01001000100100 | -2 | + |
| 97 | 01000100001010 | -2 | + |
| 98 | 01000100010100 | -2 | + |
| 99 | 00101010101010 | -2 | + |
| 9A | 00101000100101 | -2 | - |
| 9B | 00101001001001 | -2 | - |
| 9C | 00100100010101 | -2 | - |
| 9D | 00100100101001 | -2 | - |
| 9E | 00100101010001 | -2 | - |
| 9F | 00100001000001 | -2 | - |
| A0 | 00010100100101 | -2 | - |
| A1 | 00010101001001 | -2 | - |
| A2 | 00010010010101 | -2 | - |
| A3 | 00010010101001 | -2 | - |
| A4 | 00010000100001 | -2 | - |
| A5 | 00001010100101 | -2 | - |
| A6 | 00001000010001 | -2 | - |
| A7 | 00001001010101 | -2 | - |
| A8 | 00001000010010 | -2 | - |

FIG. 56

| LAST CODE-WORD | | DUMMY CODE | | NEXT DUMMY CODE | | | DECISION SELECTION TABLE |
|---|---|---|---|---|---|---|---|
| k | LSB | SELECTION TABLE | k' | LSB | SELECTION TABLE | ABSOLUTE VALUE OF END DSV | |
| ≥0 | "0" | $T_0$ | ≥0 | "0" | $T_0$ | — | $T_0$ |
| | | | | "1" | $T_2$ | — | |
| | | | <0 | "0" | $T_1$ | — | |
| | | | | "1" | $T_3$ | 8 OR LESS | |
| | | | | | | MORE 8 | $T_{01}$ |
| | "1" | $T_2$ | ≥0 | "0" | $T_0$ | — | $T_2$ |
| | | | | "1" | $T_2$ | — | |
| | | | <0 | "0" | $T_1$ | — | |
| | | | | "1" | $T_3$ | 8 OR LESS | |
| | | | | | | MORE 8 | $T_{21}$ |
| <0 | "0" | $T_1$ | ≥0 | "0" | $T_0$ | — | $T_1$ |
| | | | | "1" | $T_2$ | — | |
| | | | <0 | "0" | $T_1$ | — | |
| | | | | "1" | $T_3$ | 8 OR LESS | |
| | | | | | | MORE 8 | $T_{11}$ |
| | "1" | $T_3$ | ≥0 | "0" | $T_0$ | — | $T_3$ |
| | | | | "1" | $T_2$ | — | |
| | | | <0 | "0" | $T_1$ | — | |
| | | | | "1" | $T_3$ | 8 OR LESS | |
| | | | | | | MORE 8 | $T_{31}$ |

NOTE1) k(or k')=DSV×Pe
DSV:END DSV OF CODEWORD
Pe:END CONDITION
NOTE2) $T_{01}, T_{11}, T_{21}, T_{31}$ ARE SUBCODE TABLES FOR $T_0, T_1, T_2, T_3$ RESPECTIVELY

FIG. 74

| No. | CDS | P | CODEWORD | CORRESPONDING DATA (HEX) |
|---|---|---|---|---|
| 1 | 0 | +1 | 01010100100101 | 90 |
| 2 | +2 | +1 | 01010100010101 | 54 |
| 3 | −2 | −1 | 01010100100001 | 54 |
| 4 | +4 | +1 | 01001001000001 | 84 |
| 5 | −4 | −1 | 00010001000001 | 7B |

FIG. 75

| SYNC. SIGNAL END k'=DSV×Pe | | | DSV RESET DATA CDS,P (CODEWORD No.) | | DSV RESET DATA END | | |
|---|---|---|---|---|---|---|---|
| | | | DR1 | DR1 | DSV | Pe | k |
| k'=−8 | +8 | −1 | +4,+1(No.4) | +4,+1(No.4) | 0 | −1 | 0 |
| | −8 | +1 | | | 0 | +1 | |
| k'=−6 | +6 | −1 | +4,+1(No.4) | +2,+1(No.2) | 0 | −1 | 0 |
| | −6 | +1 | | | 0 | +1 | |
| k'=−4 | +4 | −1 | +4,+1(No.4) | 0,+1(No.1) | 0 | −1 | 0 |
| | −4 | +1 | | | 0 | +1 | |
| k'=−2 | +2 | −1 | +2,+1(No.2) | 0,+1(No.1) | 0 | −1 | 0 |
| | −2 | +1 | | | 0 | +1 | |
| k'=0 | 0 | +1 | 0,+1(No.1) | 0,+1(No.1) | 0 | +1 | 0 |
| | 0 | −1 | | | 0 | −1 | |
| k'=2 | +2 | +1 | −2,−1(No.3) | 0,+1(No.1) | 0 | −1 | 0 |
| | −2 | −1 | | | 0 | +1 | |
| k'=4 | +4 | +1 | −4,−1(No.5) | 0,+1(No.1) | 0 | −1 | 0 |
| | −4 | −1 | | | 0 | +1 | |
| k'=6 | +6 | +1 | −4,−1(No.5) | +2,+1(No.2) | 0 | −1 | 0 |
| | −6 | −1 | | | 0 | +1 | |
| k'=8 | +8 | +1 | −4,−1(No.5) | +4,+1(No.4) | 0 | −1 | 0 |
| | −8 | −1 | | | 0 | +1 | |

FIG. 82

| END DSV<br>OF LAST BLOCK<br>(SYNC. SIGNAL)<br>(END DSV) | ID1 DATA<br>(HEX) |
|---|---|
| −8 | 09 |
| −6 | 07 |
| −4 | 05 |
| −2 | 03 |
| 0 | 01 |
| +2 | 02 |
| +4 | 04 |
| +6 | 06 |
| +8 | 08 |

DATA CONVERSION METHOD AND RECORDING AND REPRODUCTION APPARATUS

BACKGROUND OF THE INVENTION

1. Field of the Invention

The present invention relates to a data conversion method for converting digital data into signals suitable for a recording or transmission system used for recording or transmitting the digital data, and also relates to a magnetic recording and reproduction apparatus employing the same data conversion method.

2. Description of the Related Art

Generally, when transmitting data through a transmission channel, it is required to use the transmission channel effectively and transmit data with minimum data degradation during transmission. The achieve this, various data conversion methods have been proposed, depending on the kind of the information source and the characteristics of the transmission channel. On the other hand, the characteristics required of the data conversion method vary according to the characteristics of the transmission channel. One example is a transmission channel system having a band-pass characteristic, one such system being a magnetic recording and reproduction system.

Specifically, in a magnetic recording and reproduction apparatus such as a rotary head type VTR, since signals for recording or reproduction are passed through a rotary transformer, head amplifier capacitors, etc., the DC component and low-frequency components are cut off. If the DC component and low-frequency components cannot be recorded or reproduced, waveform distortion and fluctuations in the DC level will be caused in the reproduced digital signal, which tends to result in digital signal errors. To avoid this, data conversion is performed on the digital signal to be recorded so that the digital signal, when recorded or reproduced, contains as little DC component and low-frequency components as possible. Such a data conversion method is generally known as a DC-free data conversion method. Examples of the DC-free conversion method include an 8-10 modulat on method, such as described in Japanese Patent Application Laid-Open Nos. 56-19506(1981) and 60-48646(1985), "THE DAT CONFERENCE STANDARD" (issued in June 1987), etc., and an 8-14 modulation method, such as disclosed in Japanese Patent Application Laid-Open Nos. 61-30818(1986) and 3234146(1991), etc.

The 8-10 modulation method is a data conversion method for converting 8-bit digital data (dataword) into 10-bit digital data (codeword), and the 8-14 modulation method is a data conversion method for converting an 8-bit dataword into a 14-bit codeword. These DC-free data conversion methods convert data so that the DSV (digital sum variation) becomes zero.

The DSV represents the value of the integral of binary levels of 1 (high level) and 0 (low level) which are represented by +1 (positive) and −1 (negative), respectively. The DSV has a value taken over a given period at a given time. When the DSV is obtained for a continuing binary signal, if the DSV increases or decreases infinitely, the binary signal has a DC component, and if the DSV is finite, then the binary signal does not have a DC component. A CDS (codeword digital sum) represents a DSV from the beginning to the end of a codeword.

There are three kinds of codewords: a codeword with CDS<0, a codeword with CDS=0, and a codeword with CDS<0. For example, in the data conversion method disclosed in Japanese Patent Application Laid-Open No. 59-123343(1984), codewords with CDS=0 are mapped in one-to-one corresponding relationship to datawords, while codewords with CDS>0 and CDS<0 are paired together and each pair is mapped in corresponding relationship to one dataword. By monitoring the DSV, a codeword with CDS≦0 is selected when DSV>0, and a codeword with CDS≧0 is selected when DSV<0. When DSV=0, an appropriate codeword is selected.

For magnetic recording and reproduction apparatus such as rotary head type VTRs, it is desirable that Tw×Tmin be large and yet high-density recording be made possible (Tw is the detection window width that represents the margin against symbol errors when the time base for the reproduced signal becomes unstable due to jitter, and Tmin is the minimum spacing between magnetic reversals that corresponds to the resolution of the recording system). Furthermore, it is desirable that the peak shift due to intersymbol interference be small and also that Tmax/Tmin (where Tmax is the maximum spacing between magnetic reversals) be small for improved overwrite characteristics due to signal overwriting. It is also desired that Tmin be large in order to minimize the high-frequency components. FIG. 1 shows the values of Tmin, Tmax, Tmax/Tmin, Tw, Tw×Tmin, and DSVmax in 8-10 modulation and 8-14 modulation.

FIG. 2 is a diagram showing the configuration of a modulation circuit employing the 8-10 modulation method, FIG. 3 is a diagram for explaining the operation of the same, and FIG. 4 is a diagram showing a part of a data conversion table. In FIG. 2, the reference numeral 70 designates an encoder which accepts 8-bit digital data and a 1-bit table selection signal (Q') at its inputs and which bit signal (Q) for selecting the table for the next codeword; and 71 indicates a flip-flop for delaying the codeword table selection signal by one dataword. The encoder 70 includes a read-only memory (ROM) or the like that holds the contents of the data conversion table shown in FIG. 4; in the table, codewords with CDS=0 are mapped in one-to-one corresponding relationship to 256 datawords from "00" to "FF" hex, while in the case of codewords of CDS≠0, pairs of codewords, one with CDS=+2 and the other with CDS=−2, are each mapped in corresponding relationship to one dataword, the table for Q'=−1 consisting of codewords with CDS =+2 and the table for Q'=+1 consisting of codewords with CDS=−2. The table selection signal Q is used to select the CDS (the table) of the direction that suppresses the divergence of charges in the code sequence.

Next, the operation of the above circuit will be described with reference to FIGS. 2 and 3. As shown in FIG. 3, an 8-bit dataword "FF" first input to the encoder 70 has a table selection signal Q'=−1, and consequently, the encoder 70 outputs a 10-bit codeword "1111101010" with CDS=+2 corresponding to "FF" for Q'=−1. At the same time, the table selection signal Q=−1 is outputted for table selection for the next codeword. This 10-bit parallel signal is then converted to a serial signal with MSB as the leading bit, after which the signal is NRZI-modulated. As a result, the DSV value at the end of the codeword becomes +2.

Next, when "00" is inputted to the encoder 70, the encoder 70 outputs Q=1 together with a 10-bit signal "101010101" with CDS=0 corresponding to "00" for Q'=−1 delayed by one symbol from the immediately preceding output Q=−1. As a result, the DSV value at the end of the codeword after NRZI modulation remains at +2. Then, when "FF" is inputted to the encoder 70, the encoder 70 outputs Q=−1 together with a 10-bit signal with CDS=−2 corresponding to "FF" for Q'=1. As a result, the DSV at the end of the codeword after NRZI modulation becomes zero. In this manner, for each 8-bit dataword inputted to the encoder 70, a codeword to be output is selected from the table for either Q'=−1 or Q'=1 corresponding to the dataword on the basis of the immediately preceding table selection signal output. Consequently, the value of the DSV at the end of each codeword after NRZI modulation is limited to 0, +2 or −2. This indicates that the DSV divergence is suppressed, thus realizing DC-free data conversion that has no DC component.

In the data conversion method of the prior art, as described above, codewords with CDS=0 are mapped in one-to-one corresponding relationship to datawords; the problem here is that when DSV>0 or DSV<0, if a dataword corresponding one-to-one to a codeword with CDS=0 is input, the DSV cannot be converged fast enough.

In the prior art 8-10 modulation method, since Tmin is as small as 0.8 data clock cycle (T), the intersymbol interference is large, and since Tw×Tmin shows a relatively small value of 0.64, there remains some problem in realizing high-density recording. On the other hand, in the prior art 8-14 modulation method, since Tmax/Tmin shows a relatively large value of 3.5, the prior art has had the problem that the peak shift due to intersymbol interference tends to occur and the signal overwrite characteristics tend to degrade.

SUMMARY OF THE INVENTION

It is an object of the present invention to provide a data conversion method capable of further suppressing the low-frequency components by reducing the probability of occurrence of codewords whose DSV in absolute value terms is large.

It is another object of the invention to provide a data conversion method capable of preventing the occurrence of peak shift due to intersymbol interference, having good overwrite characteristics and achieving high-density recording, and a recording and reproduction apparatus for recording codewords generated by same data conversion method and for reproducing the original datawords from the recorded codewords.

According to the first data conversion method of the invention, for codewords with CDS=0, codewords with CDS>0 and codewords with CDS<0 are paired together, and when converting a dataword into a codeword, the matching codeword is selected while monitoring the condition of the DSV. More specifically, instead of mapping codewords with CDS=0 in one-to-one relationship to datawords, as many codewords with CDS≠0 as the number of codewords allows are paired between opposite polarities and are mapped to datawords corresponding to the codewords with CDS=0, and the codewords are selected so that the DSV after NRZI modulation becomes zero. This enables the DSV to be converged fast enough, reduces the DC component and low-frequency components after encoding, and realizes transmission with minimum probability of symbol error even with a transmission channel and recording apparatus that are not capable of transmitting DC component.

According to the second data conversion method of the invention, a codeword to be generated for output is selected, based on the least significant bit of the codeword generated immediately preceding the current dataword about to be converted and also on the current dataword about to be converted and the next dataword to be converted. In the second data conversion method, a conversion table in which a plurality of codewords having different CDSs or different least significant bits are mapped to a single dataword is provided, and the DSV expected at the end of a codeword corresponding to the next dataword to be converted is calculated for each of two cases, i.e. a case where a first codeword in the conversion table is selected and a case where a second codeword in the conversion table is selected, and based on the thus calculated DSV, a codeword corresponding to the current dataword is selected from the conversion table. Alternatively, in the second data conversion method, different conversion tables are used for codeword selection, depending on the DSV at the end of a codeword corresponding to the immediately preceding dataword and on the level at the end of the immediately preceding codeword.

Thus, according to the second data conversion method, the DSV is finite and DC-free modulation is realized; furthermore, Tmax and Tmax/Tmin are smaller than those obtained with the prior art 8-14 modulation method, while Tmin and Tw×Tmin are larger than those obtained with the prior art 8-10 modulation method. Accordingly, this data conversion method of the invention is much less likely to cause a peak shift due to intersymbol interference, provides good overwrite characteristics, and permits high-density recording.

The recording and reproduction apparatus of the invention employs the second data conversion method described above. With this apparatus, if errors occur in the reproduction signal, the DSV value in the reproduction signal can be restored to the correct value, and codewords generated by the second data conversion method can be decoded into the original datawords.

The above and further objects and features of the invention will more fully be apparent from the following detailed description with accompanying drawings.

BRIEF DESCRIPTION OF THE DRAWINGS

FIG. 1 is a diagram showing a comparison of modulation parameters between a prior art 8-14 modulation method, a prior art 8-10 modulation method, and a data conversion method of the present invention;

FIG. 4 is a diagram showing a conversion table used in the prior art data conversion apparatus;

FIG. 5 is a diagram showing a table in which 10-bit codewords are classified by CDS;

Figure 6:
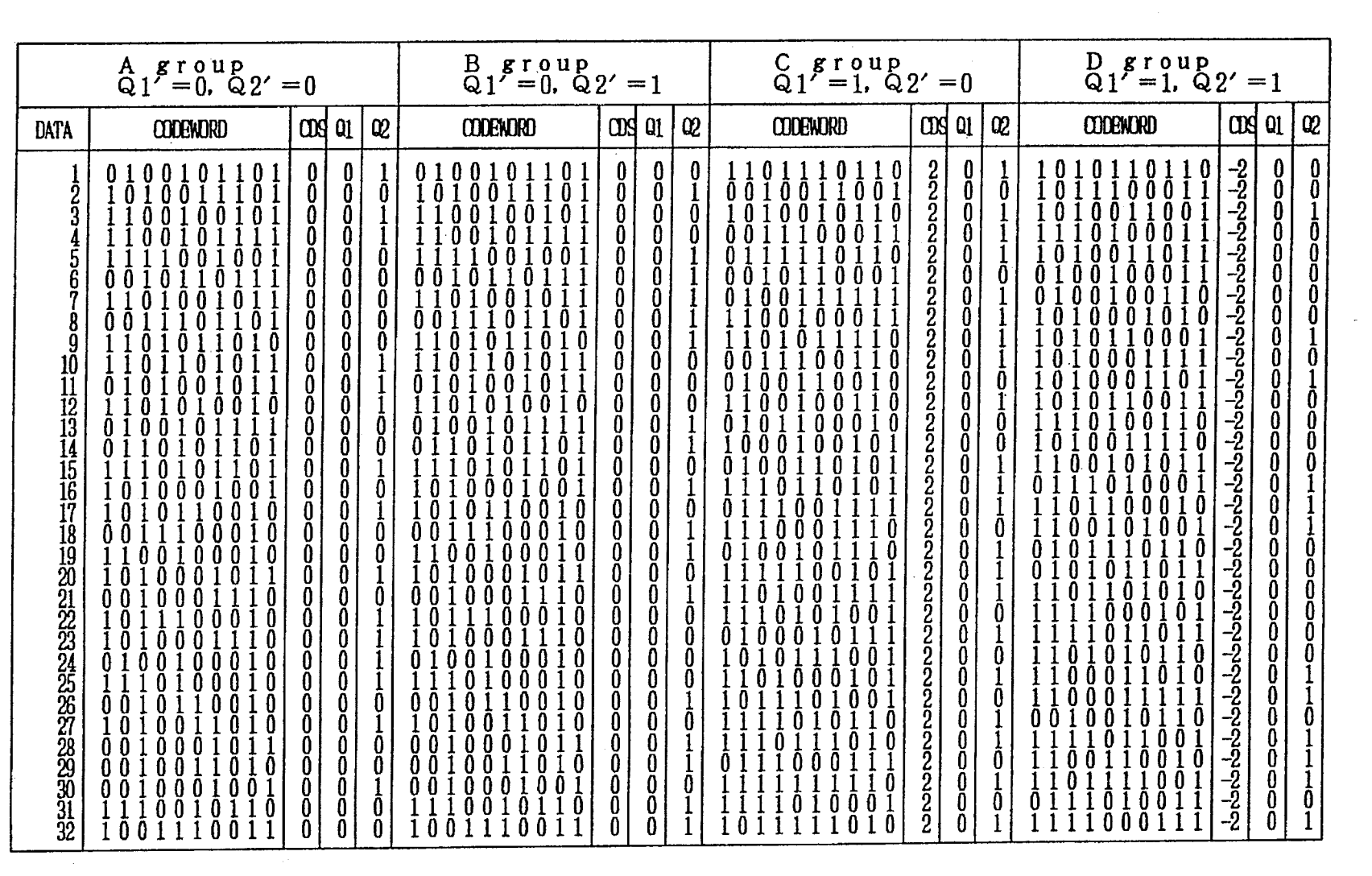

FIG. 6 is a diagram showing a table in Embodiment 1;

Figure 7:
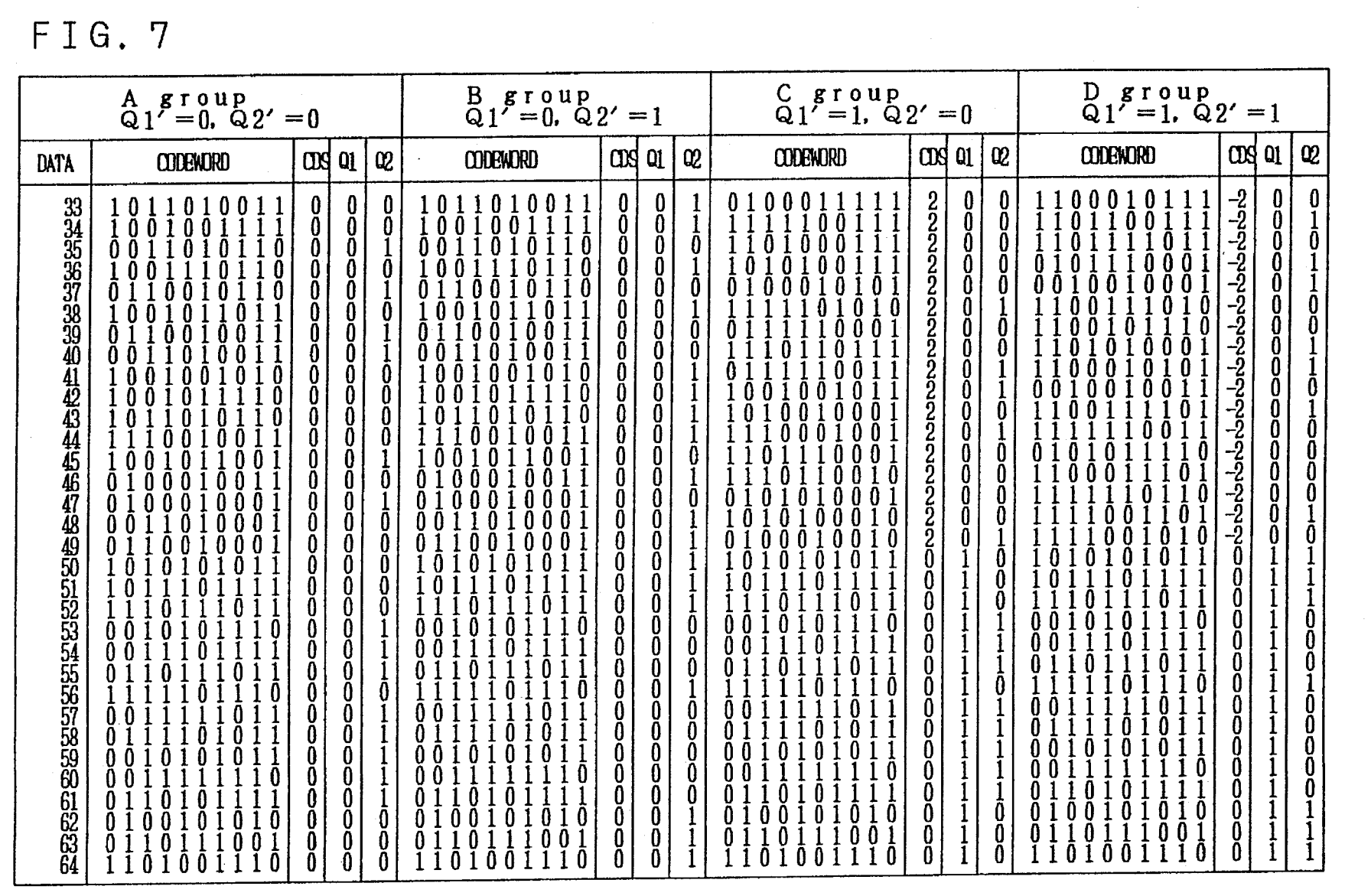

FIG. 7 is a diagram showing a table in Embodiment 1;

Figure 8:
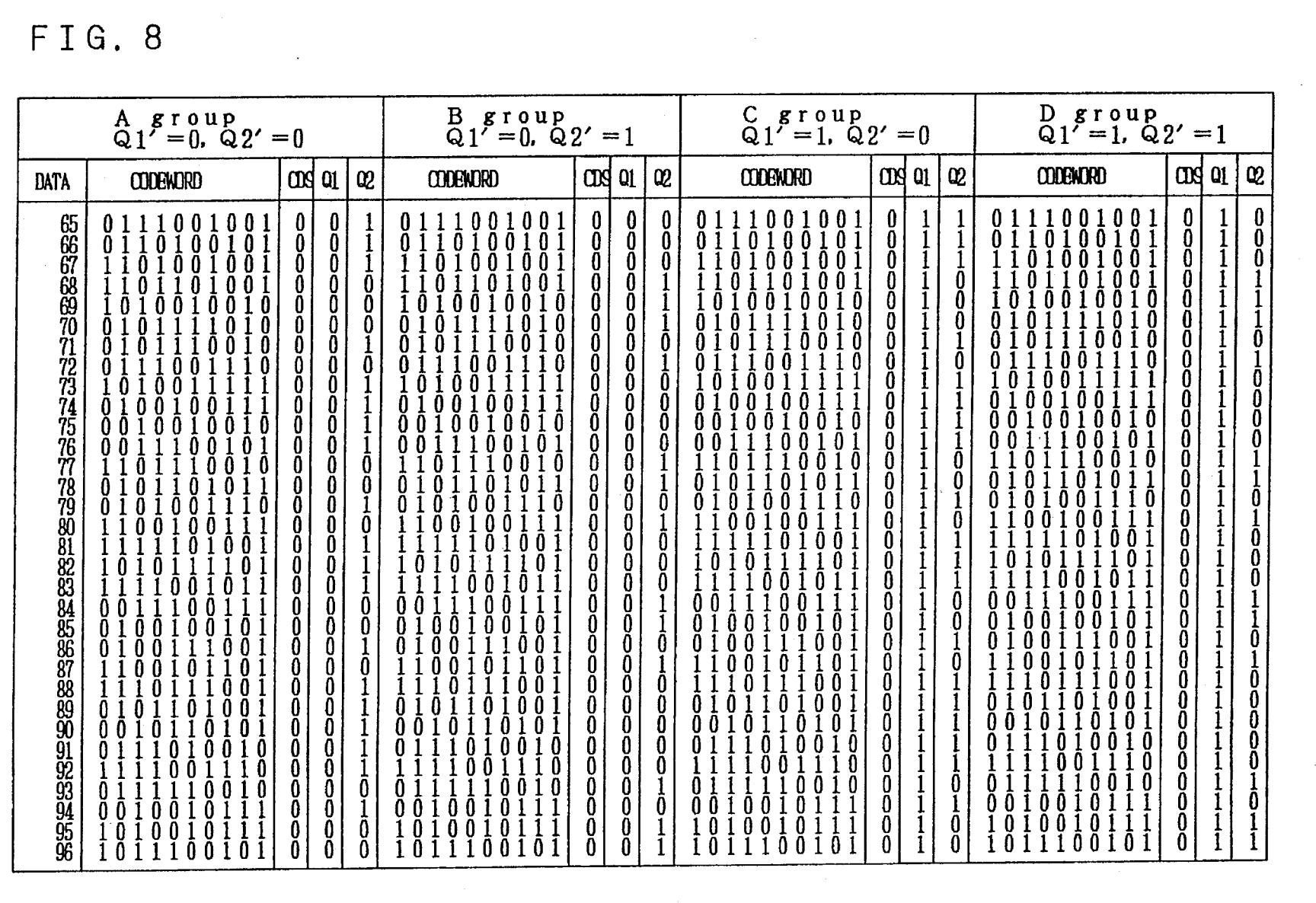

FIG. 8 is a diagram showing a table in Embodiment 1;

Figure 9:
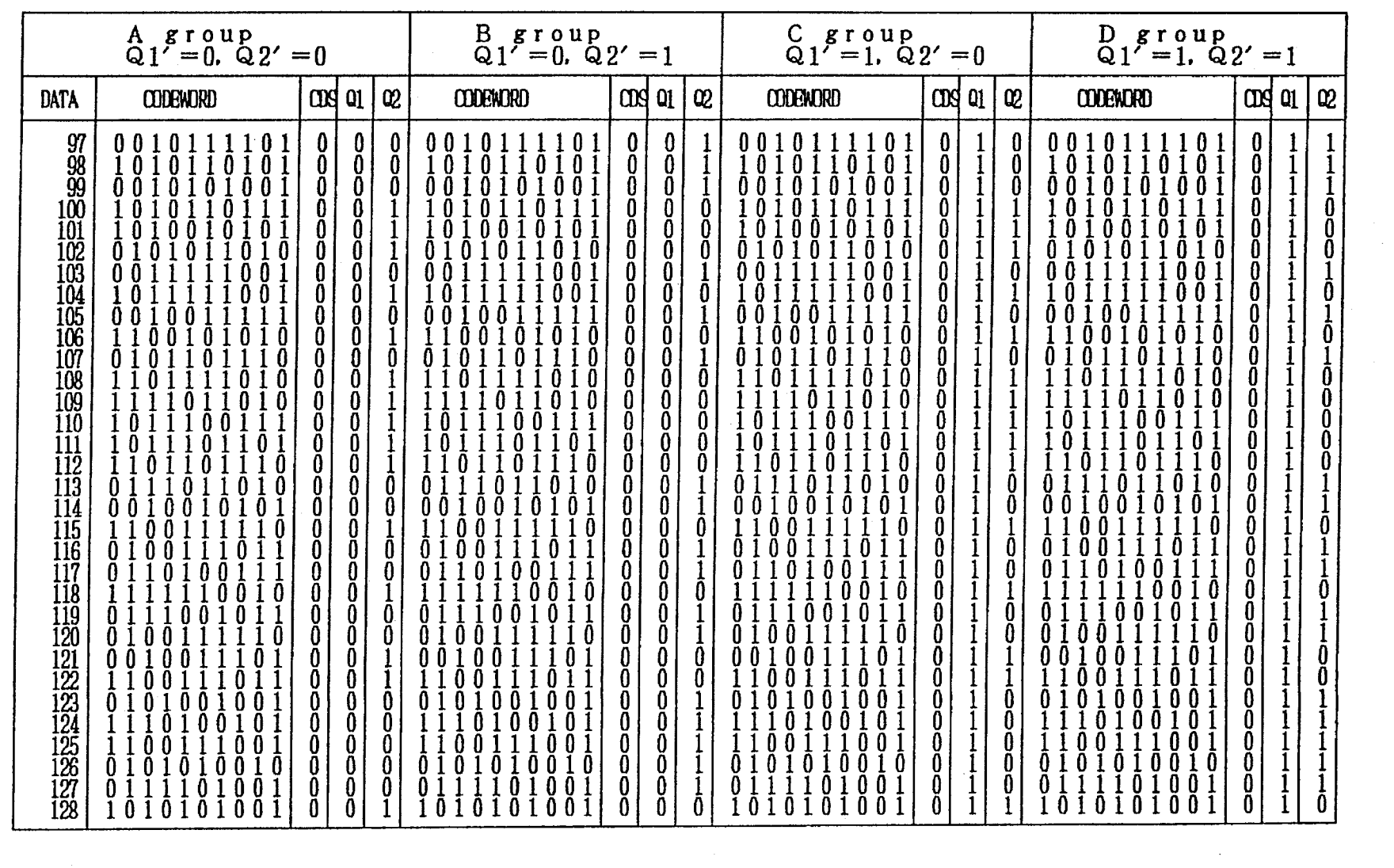

FIG. 9 is a diagram showing a table in Embodiment 1;

FIG. 10 is a diagram showing a table in Embodiment 1;

Figure 11:
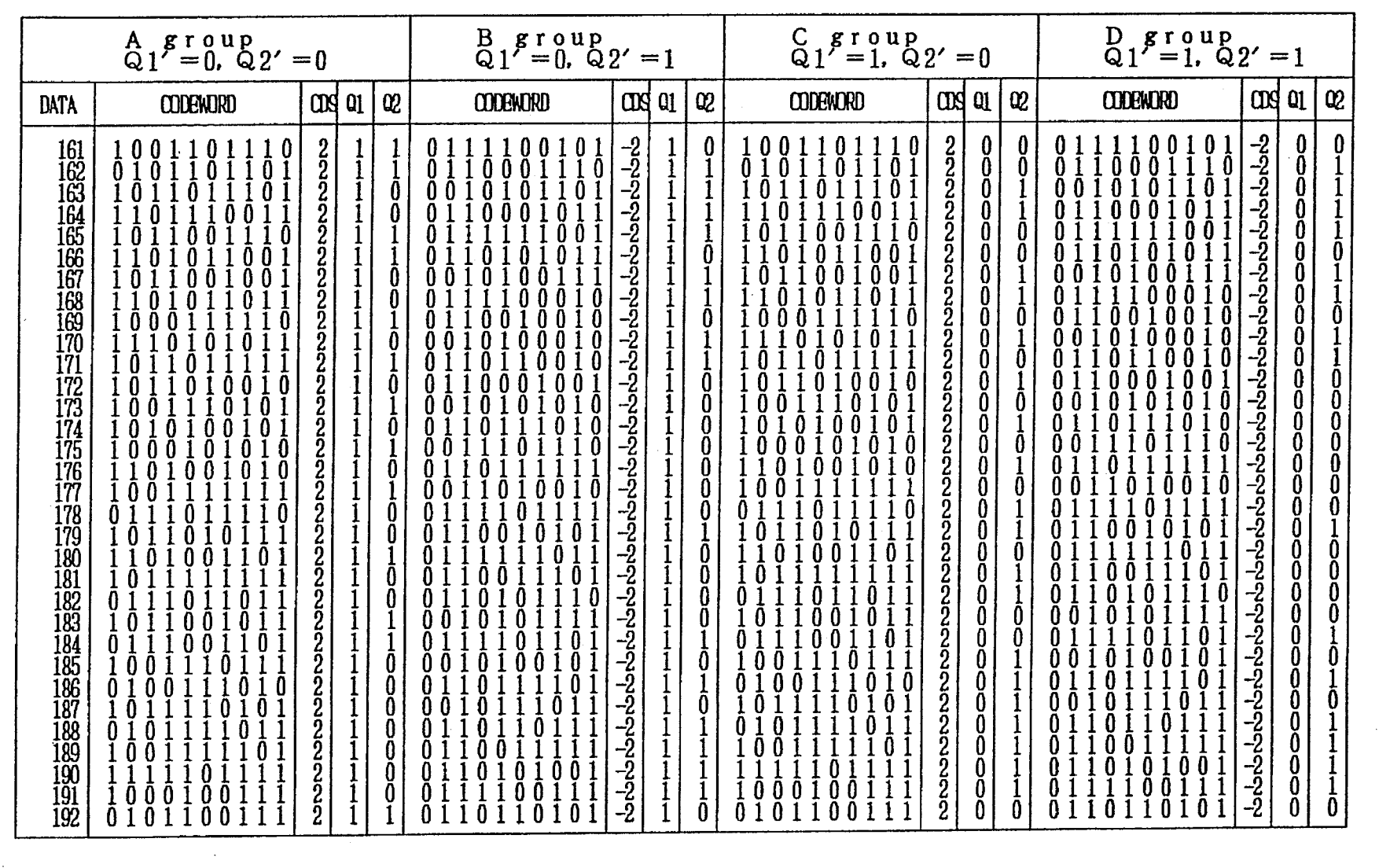

FIG. 11 is a diagram showing a table in Embodiment 1;

Figure 12:
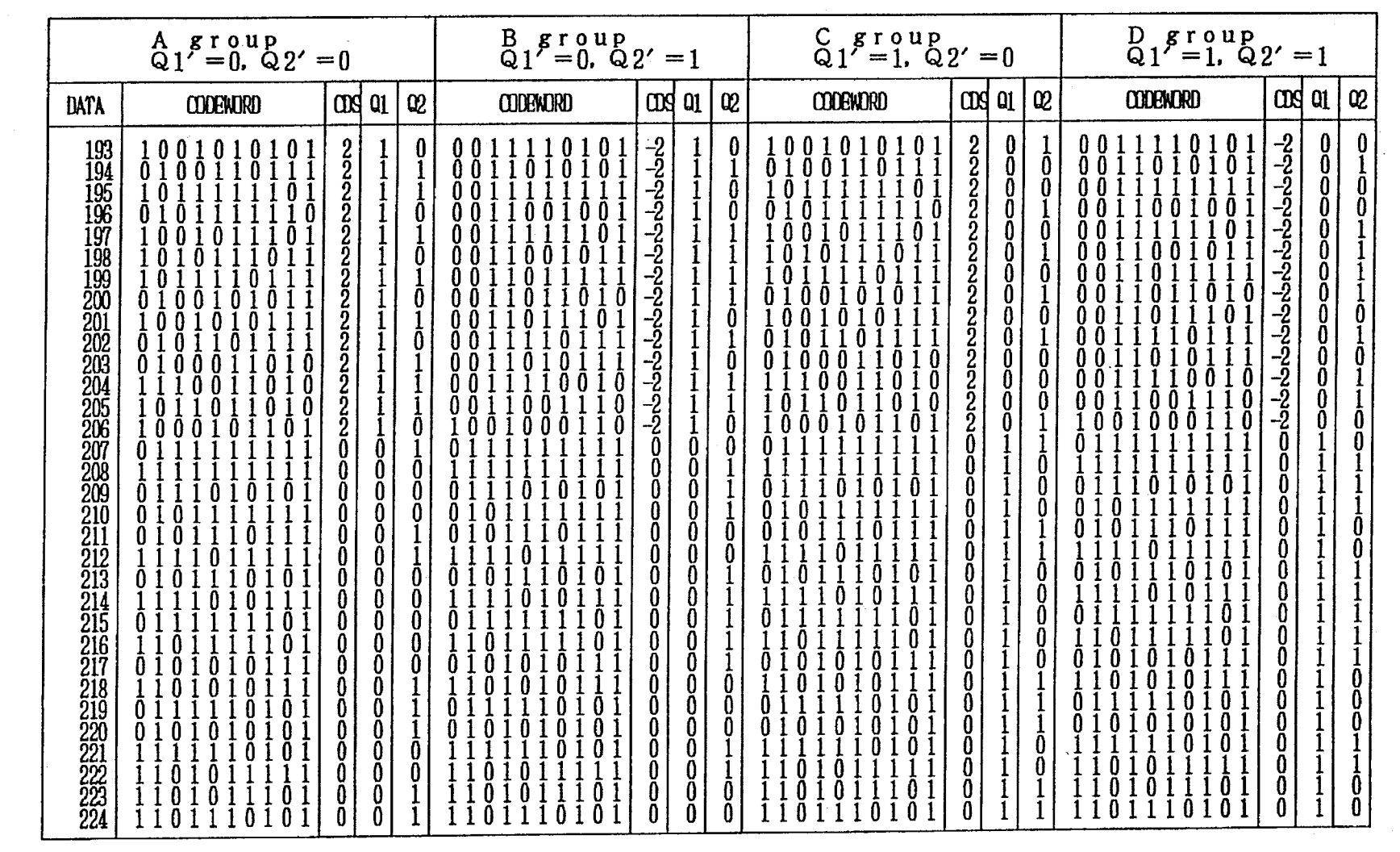

FIG. 12 is a diagram showing a table in Embodiment 1;

Figure 13:
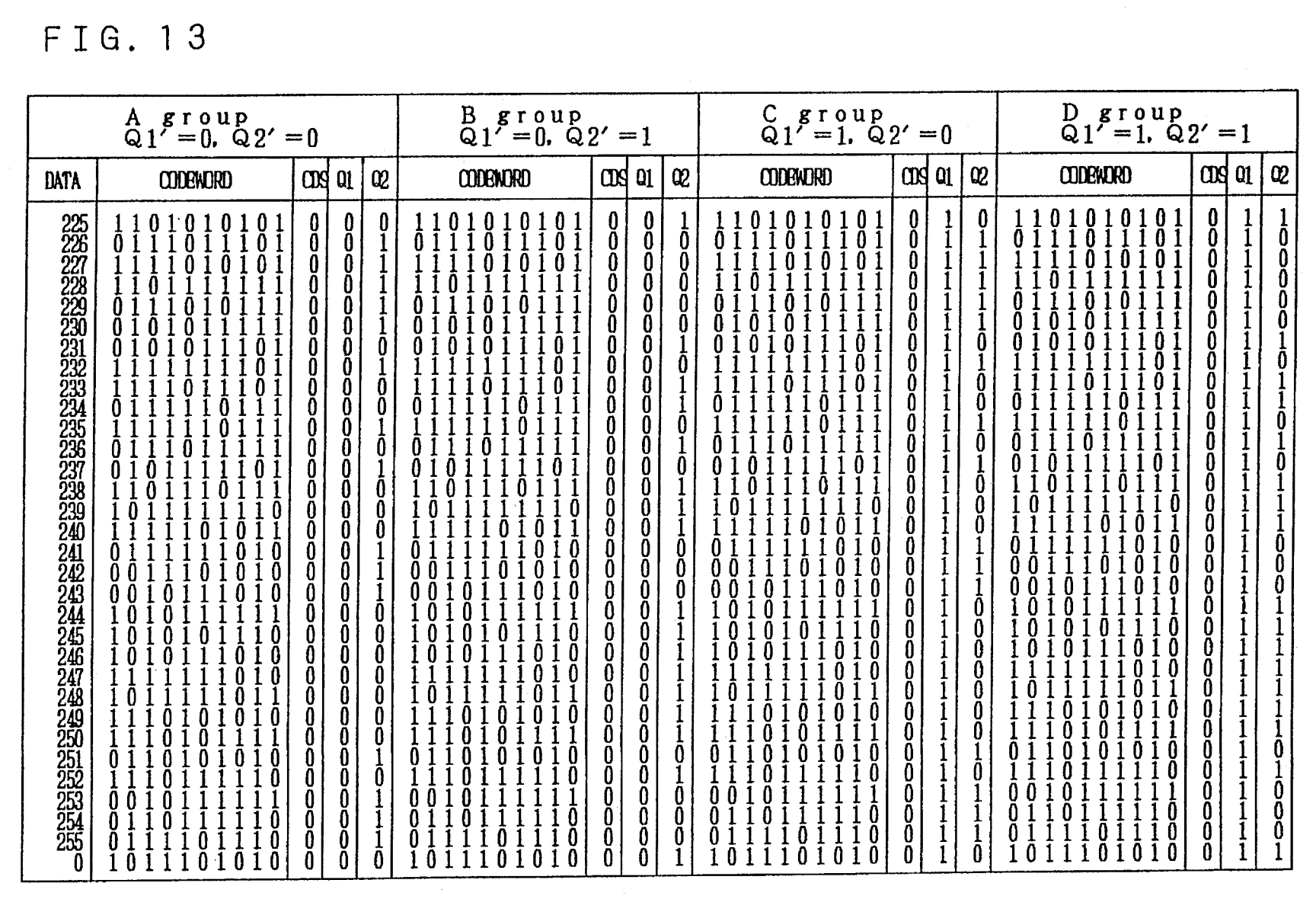

FIG. 13 is a diagram showing a table in Embodiment 1;

FIG. 15 is a diagram showing the relationship between Q1/Q2, input/output polarity after NRZI, and CDS in group A;

FIG. 16 is a diagram showing the relationship between Q1/Q2, input/output polarity after NRZI, and CDS in group B;

FIG. 17 is a diagram showing the relationship between Q1/Q2, input/output polarity after NRZI, and CDS in group C;

FIG. 18 is a diagram showing the relationship between Q1/Q2, input/output polarity after NRZI, and CDS in group D;

Figure 20:
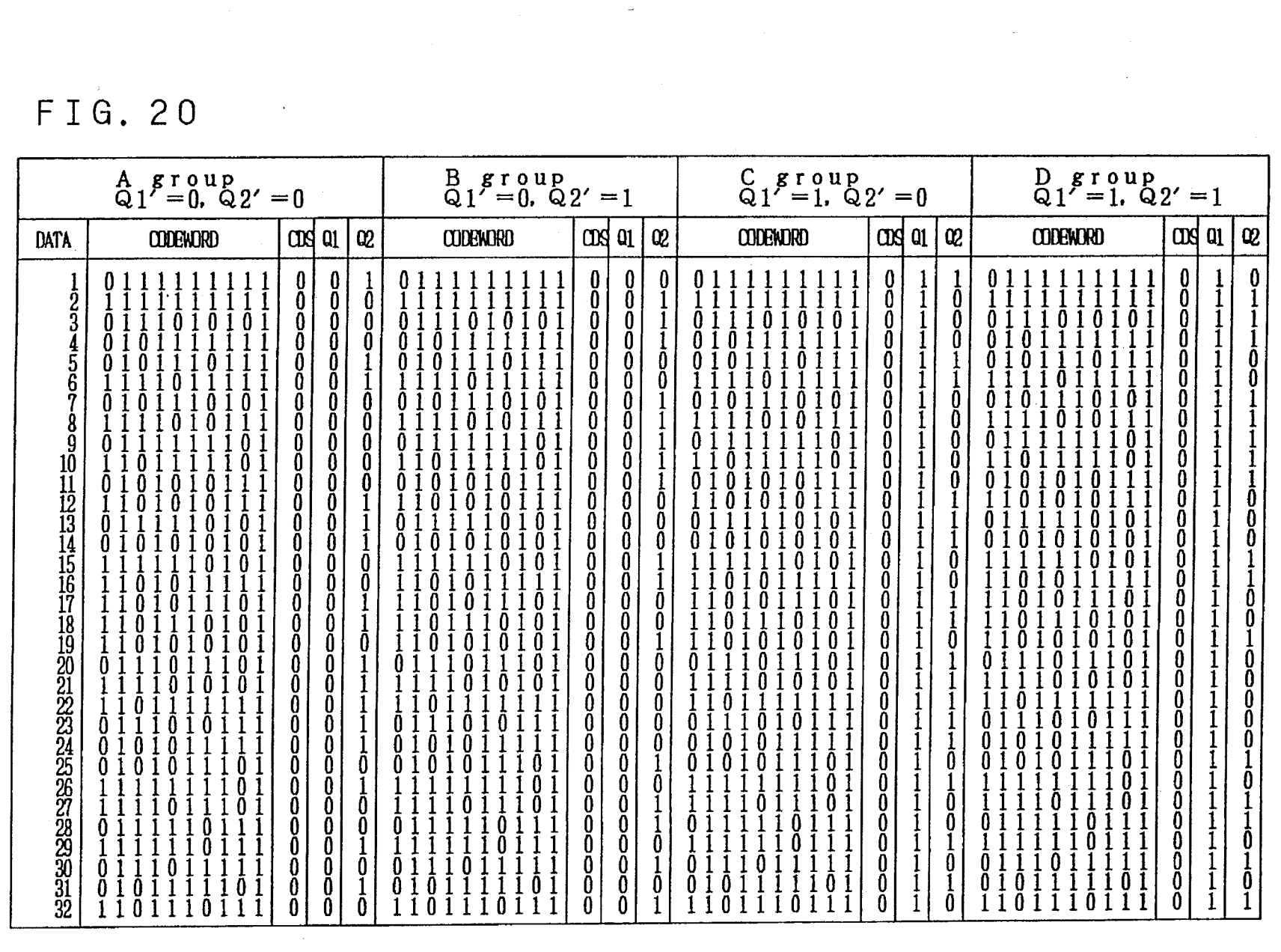

FIG. 20 is a diagram showing a table in Embodiment 2;

Figure 21:
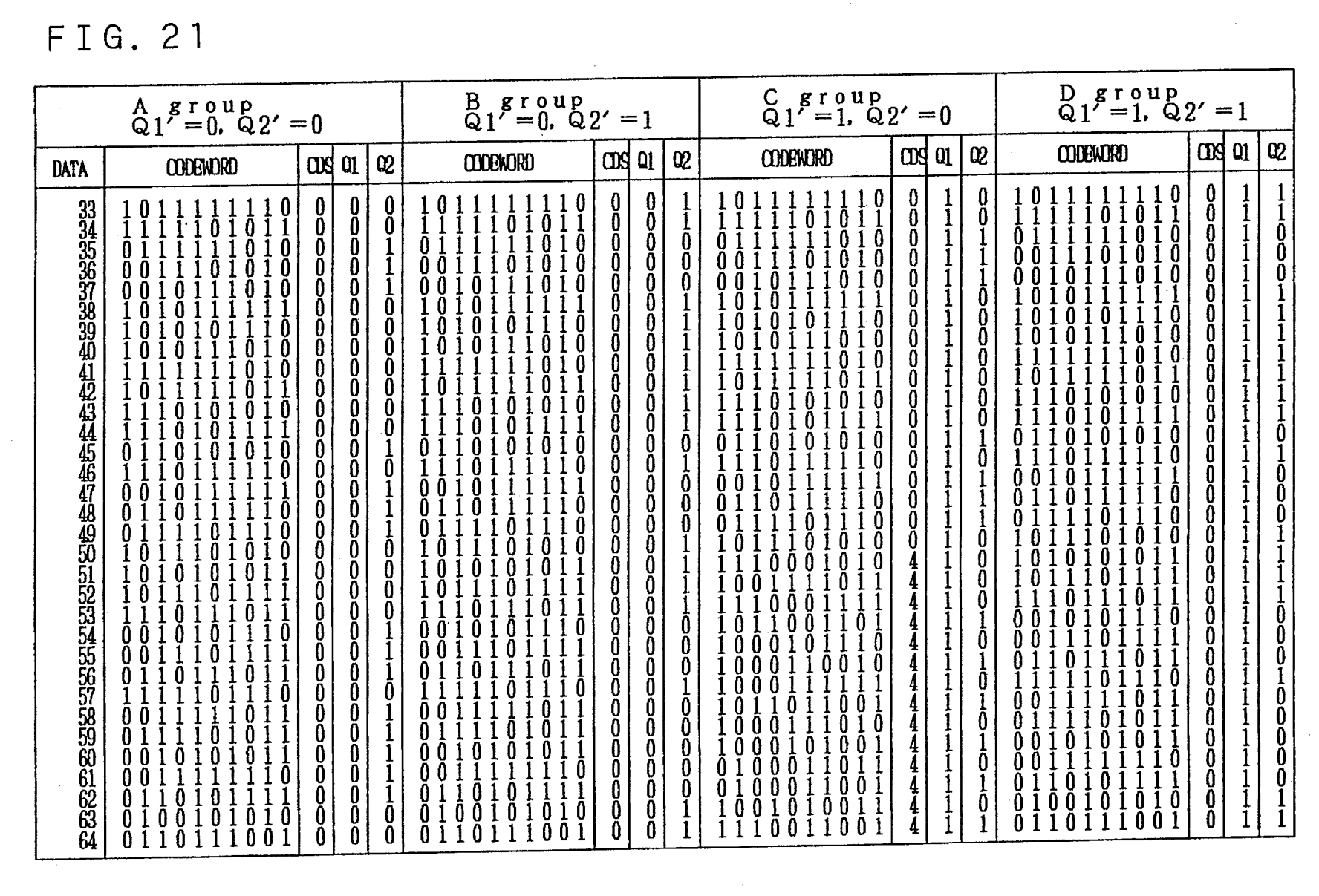

FIG. 21 is a diagram showing a table in Embodiment 2;

Figure 22:
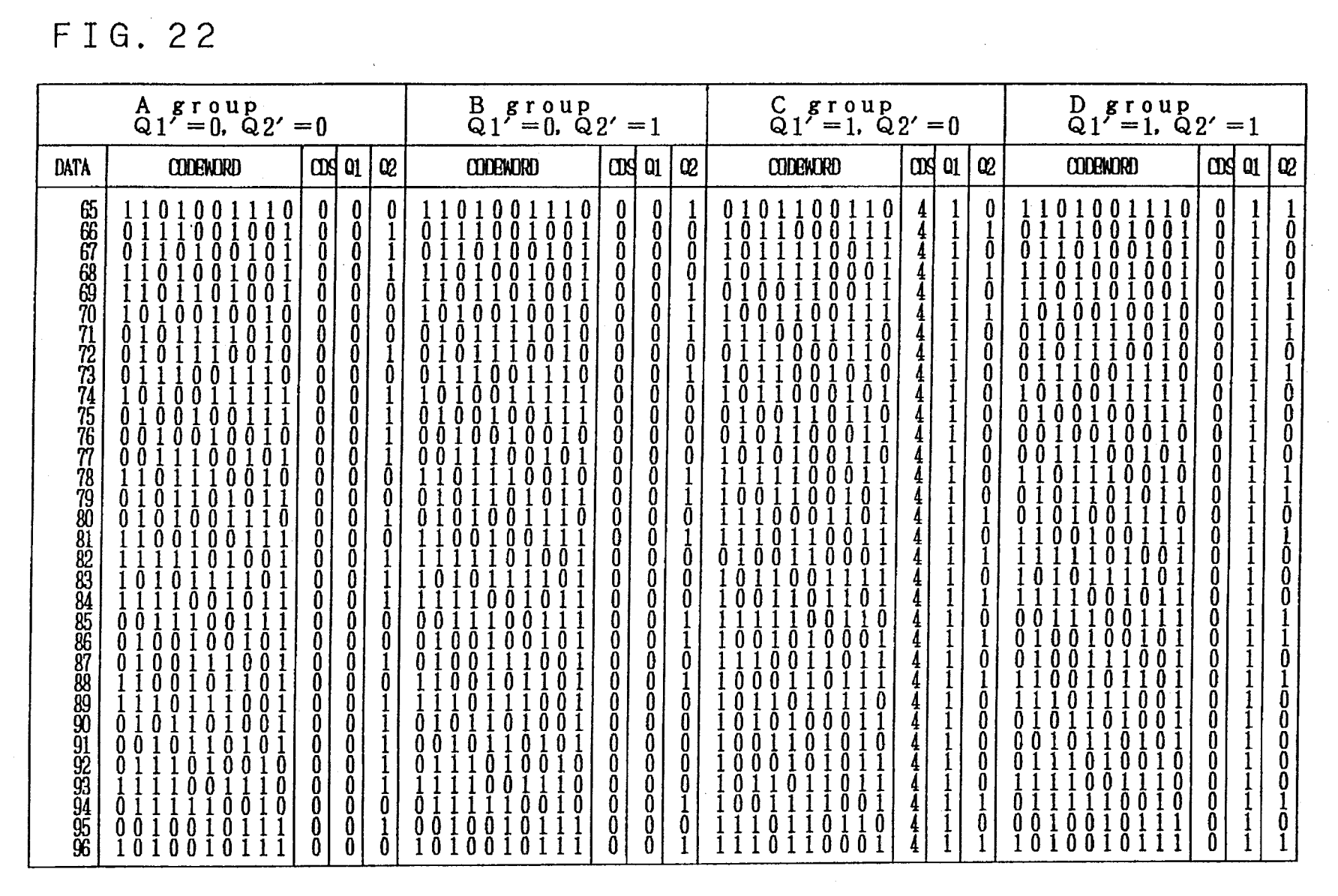

FIG. 22 is a diagram showing a table in Embodiment 2;

Figure 23:
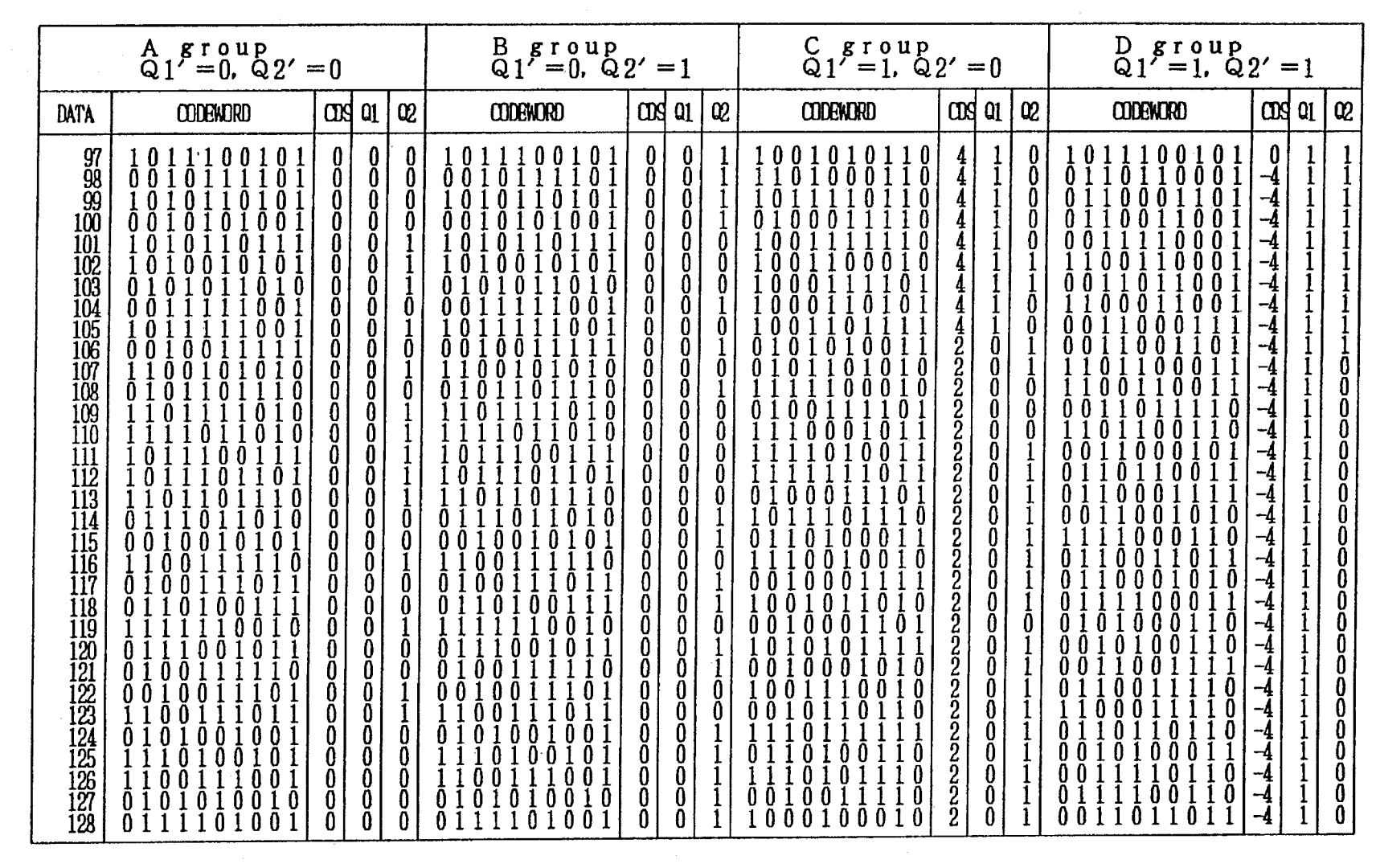

FIG. 23 is a diagram showing a table in Embodiment 2;

Figure 24:
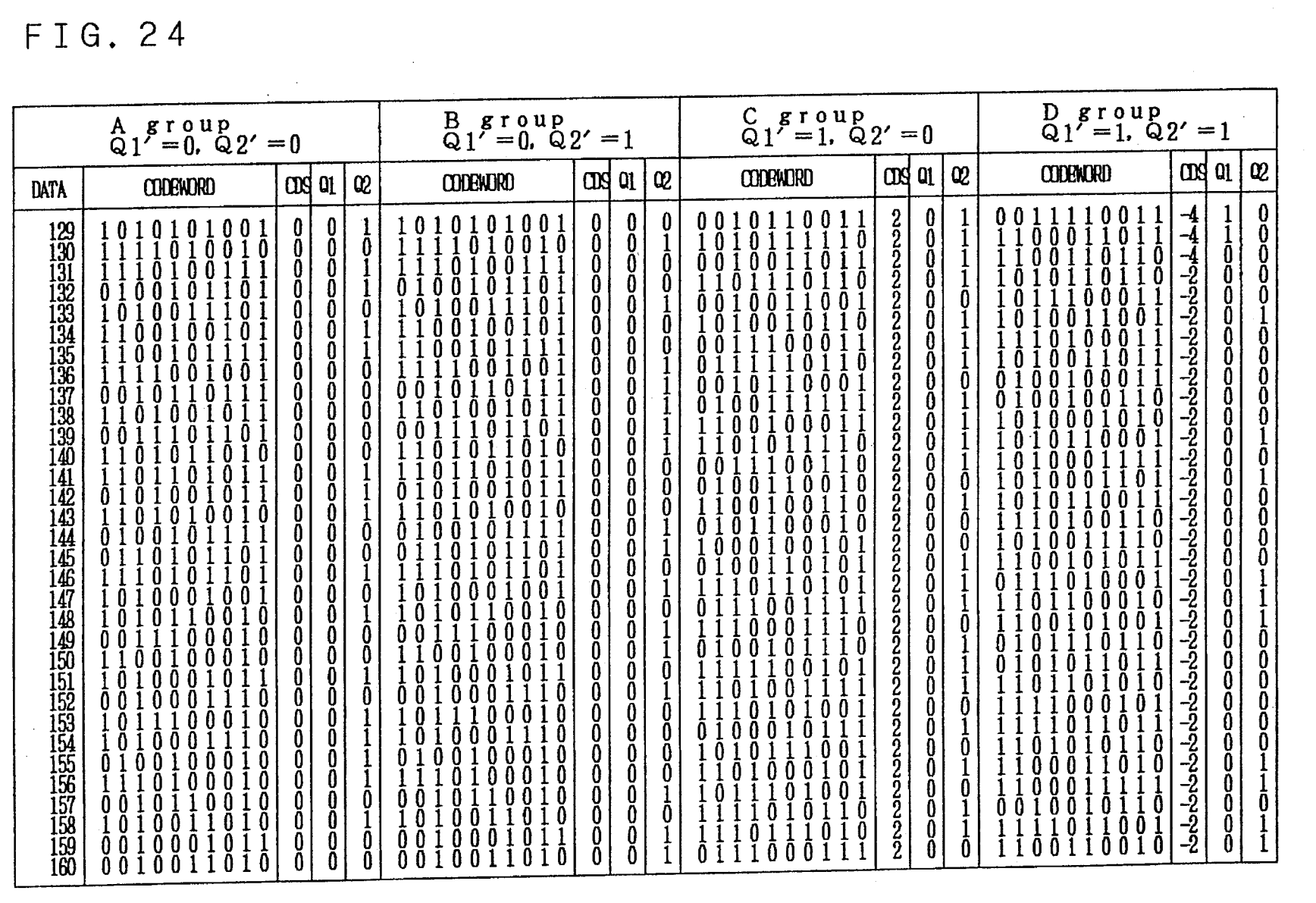

FIG. 24 is a diagram showing a table in Embodiment 2;

Figure 25:
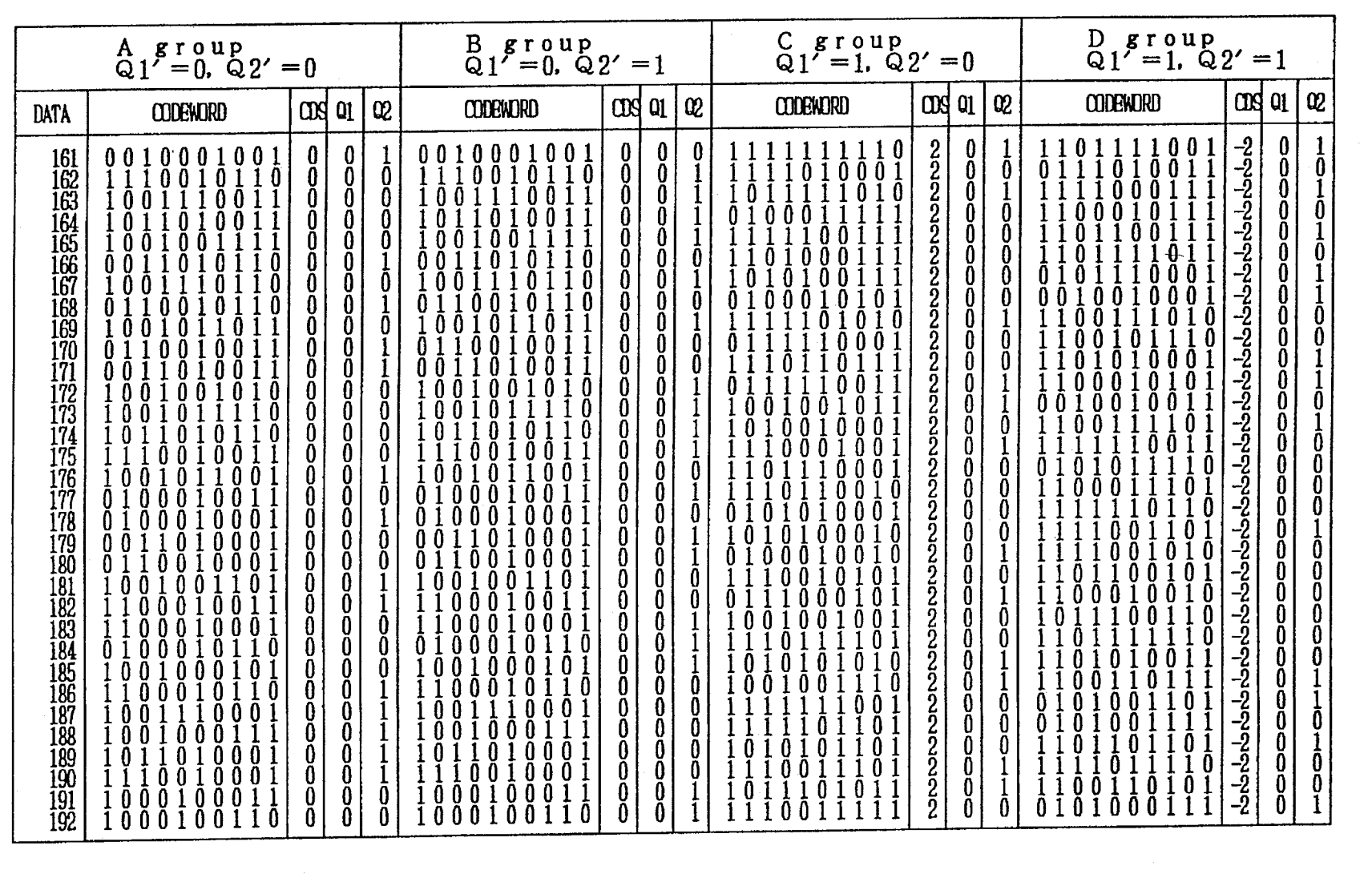

FIG. 25 is a diagram showing a table in Embodiment 2;

Figure 26:
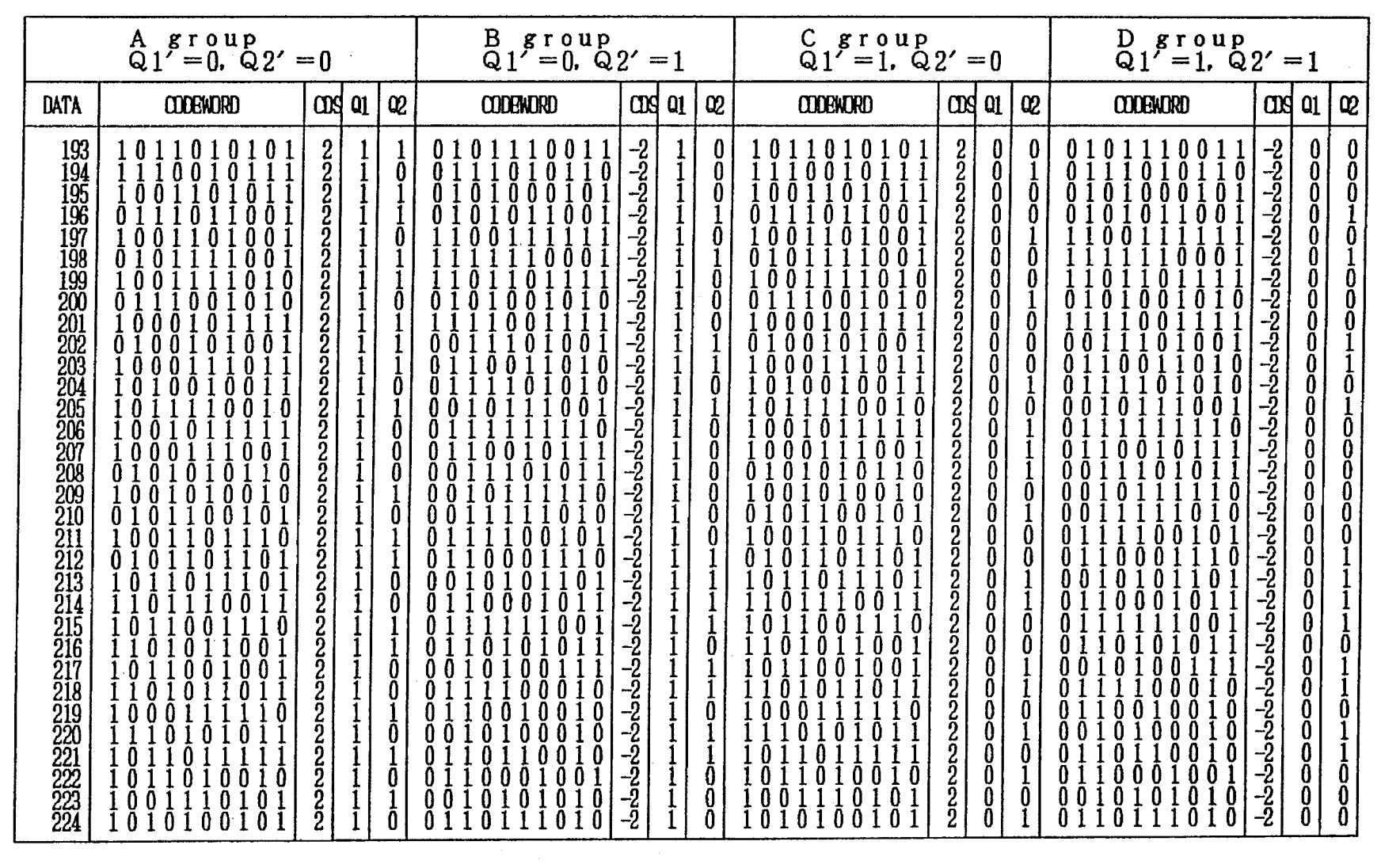

FIG. 26 is a diagram showing a table in Embodiment 2;

Figure 27:
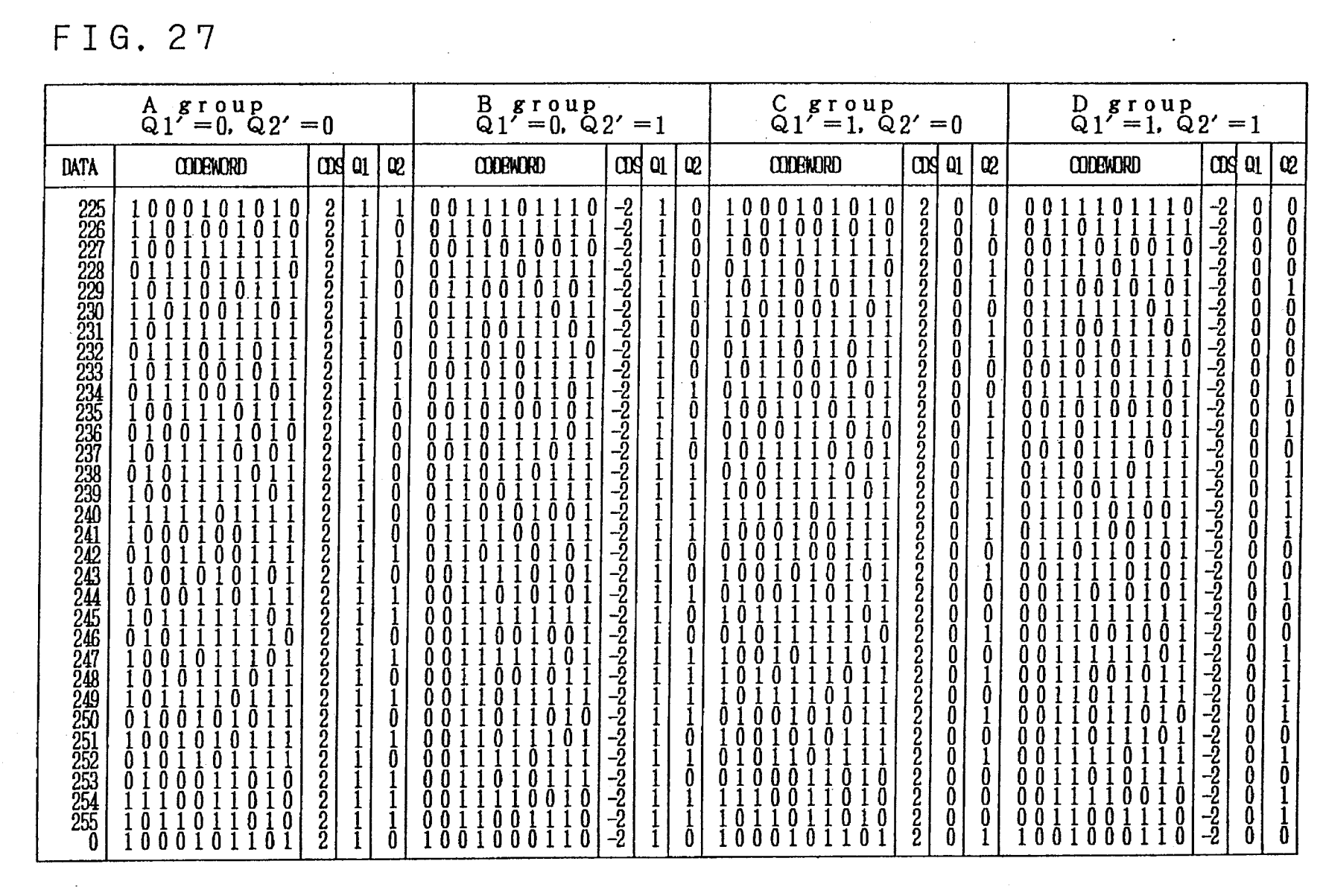

FIG. 27 is a diagram showing a table in Embodiment 2;

FIGS. 28A and 28B are diagrams showing the numbers of codewords in Embodiment 3;

FIG. 29 is a diagram showing the numbers of codewords according to the state at codeword end in Embodiment 3;

FIG. 30 is a diagram showing the numbers of codewords according to the state at codeword end in Embodiment 3;

FIG. 31 is a diagram showing the numbers of codewords according to the state at codeword end in Embodiment 3;

FIG. 32 is a diagram showing the numbers of codewords according to the state at codeword end in Embodiment 3;

FIG. 33 is a diagram for deriving a conversion table T0 in Embodiment 3;

FIG. 34 is a diagram for deriving a conversion table T1 in Embodiment 3;

FIG. 35 is a diagram for deriving a conversion table T2 in Embodiment 3;

FIG. 36A and 36B are diagrams for deriving a conversion table T3 in Embodiment 3;

FIG. 37 is a diagram for deriving a conversion table T01 in Embodiment 3;

FIG. 38 is a diagram for deriving a conversion table T11 in Embodiment 3;

FIG. 39 is a diagram for deriving a conversion table T21 in Embodiment 3;

FIG. 40 is a diagram for deriving a conversion table T31 in Embodiment 3;

FIG. 41 is a diagram showing the conversion tables T0 and T1 in Embodiment 3;

FIG. 42 is a diagram showing the conversion tables T0 and T1 in Embodiment 3;

FIG. 43 is a diagram showing the conversion tables T0 and T1 in Embodiment 3;

FIG. 44 is a diagram showing the conversion tables T0 and T1 in Embodiment 3;

FIG. 45 is a diagram showing the conversion tables T0 and T1 in Embodiment 3;

FIG. 46 is a diagram showing the conversion tables T0 and T1 in Embodiment 3;

FIG. 47 is a diagram showing the conversion tables T2 and T3 in Embodiment 3;

FIG. 48 is a diagram showing the conversion tables T2 and T3 in Embodiment 3;

FIG. 49 is a diagram showing the conversion tables T2 and T3 in Embodiment 3;

FIG. 50 is a diagram showing the conversion tables T2 and T3 in Embodiment 3;

FIG. 51 is a diagram showing the conversion tables T2 and T3 in Embodiment 3;

FIG. 52 is a diagram showing the conversion tables T2 and T3 in Embodiment 3;

FIG. 53 is a diagram showing the conversion tables T01 and T11 in Embodiment 3;

FIG. 54 is a diagram showing the conversion table T21 in Embodiment 3;

FIG. 55 is a diagram showing the conversion table T31 in Embodiment 3;

FIG. 56 is a diagram showing a conversion table selection method in Embodiment 3;

FIG. 74 is a diagram showing an example of DSV reset data in the data conversion apparatus of Embodiment 6;

FIG. 75 is a diagram for explaining the method of using the DSV reset data in the data conversion apparatus of Embodiment6;

FIG. 82 is a diagram showing an example of ID1 codeword data in the data conversion apparatus of Embodiment 9;

DESCRIPTION OF THE PREFERRED EMBODIMENTS

Figure 2:
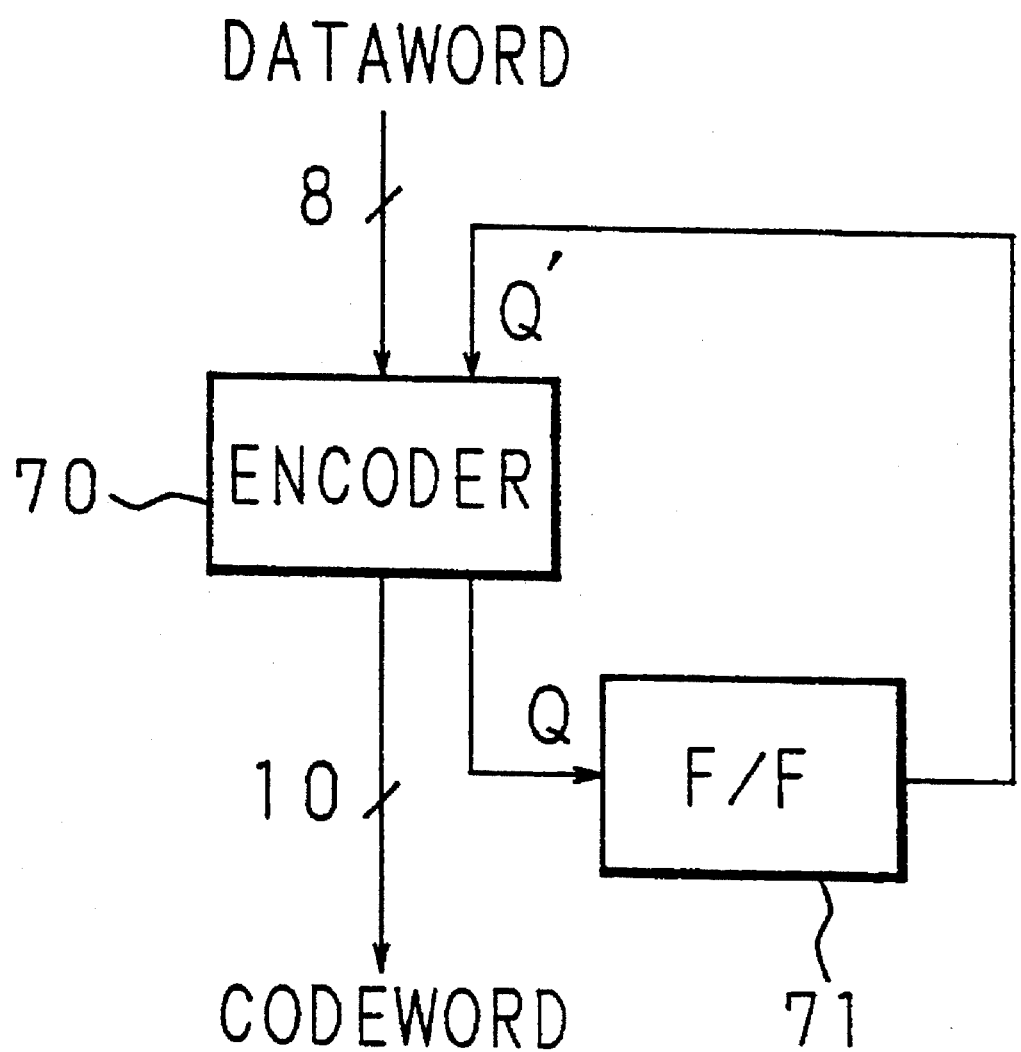
FIG. 2 is a block diagram showing a prior art, data conversion apparatus.
Figure 3:
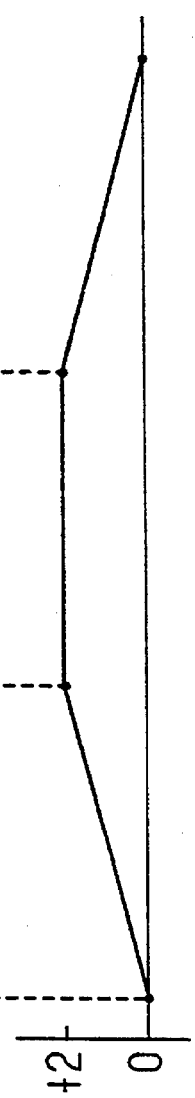
FIG. 3 is a diagram for explaining the operation of the prior art data conversion apparatus.

The present invention will now be described in detail below with reference to the drawings illustrating the preferred embodiments.

Embodiment 1

Embodiment 1 of the invention hereinafter described concerns an example in which NRZI modulation is performed for conversion of a dataword of m=8 bits into a codeword of n=10 bits. There are two types of NRZI modulation: one involving a reversal of polarity at the center of a bit cell and the other involving a reversal of polarity at the start of a bit cell. In NRZI modulation, the polarity reversal bears significance, and the level during the interval between polarity reversals is constant. Embodiment 1 can be applied to either type of NRZI modulation. The following description deals with the type of NRZI modulation wherein a polarity reversal occurs at the start of a bit cell.

Ten-bit codewords are classified according to the CDS. Here, in order to suppress the low-frequency components, the number of successive 0s is limited to 3, with a maximum sequence of two 0s at the start of a codeword and a maximum sequence of one 0 at the end of a codeword. It is also assumed that the polarity of the NRZI waveform immediately preceding any given codeword is negative. When classified according to the above condition, there are six codewords with CDS=+6, 55 codewords with CDS=+4, 151 codewords with CDS=+2, 192 codewords with CDS=0, 125 codewords with CDS=–2, 33 codewords with CDS=–4, and one codeword with CDS=–6. Further, a maximum or a minimum value of the DSV change within each codeword is determined. The results are shown in FIG. 5.

We will now explain how the codewords are mapped in correspondence with the datawords. There are 256 datawords of m=8. First, all the codewords with CDS=0 are mapped one-to-one to datawords. Then, the codewords with the smaller CDS in absolute value terms, i.e. codewords with CDS=+2 and codewords with CDS=–2, are paired together and are sequentially mapped to the remaining 64 datawords. Now, there remain 87 codewords with CDS=+2 and 62 codewords with CDS=–2. From these codewords whose CDS is 2 in absolute value terms, 62 pairs of codewords of opposite polarity are formed. Of these pairs, the pair containing the codeword with CDS=–2 and having a maximum DSV value of 3 is discarded. The remaining 61 pairs are further paired with codewords with CDS=0. In this case, the 61 pairs are paired with codewords with CDS=0 in decreasing magnitude of the DSV change. As can be seen from FIG. 5, the DSV changes within a codeword even if its CDS is 0. That is, the 61 pairs are sequentially paired with the codewords having larger maximum or minimum values of the DSV change in absolute value terms, that is, in the order of 4, 3, and 2. The results of the codeword mapping thus performed are shown in FIGS. 6 to 13.

In FIGS. 6 to 13, group A is a group that is selected when the DSV immediately preceding the codeword to be selected is 0 and the polarity of the NRZI-modulated word immediately preceding the codeword is negative, while group B is a group that is selected when the DSV immediately preceding the codeword to be selected is 0 and the polarity of the NRZI-modulated word immediately preceding the codeword is positive. Group C is a group that is selected when the DSV immediately preceding the codeword to be selected is –2 and the polarity of the NRZI-modulated word immediately preceding the codeword is negative or when the DSV is +2 and the polarity is positive, while group D is a group that is selected when the DSV immediately preceding the codeword to be selected is –2 and the polarity of the NRZI-modulated word immediately preceding the codeword is positive or when the DSV is +2 and the polarity is negative.

Figure 14:
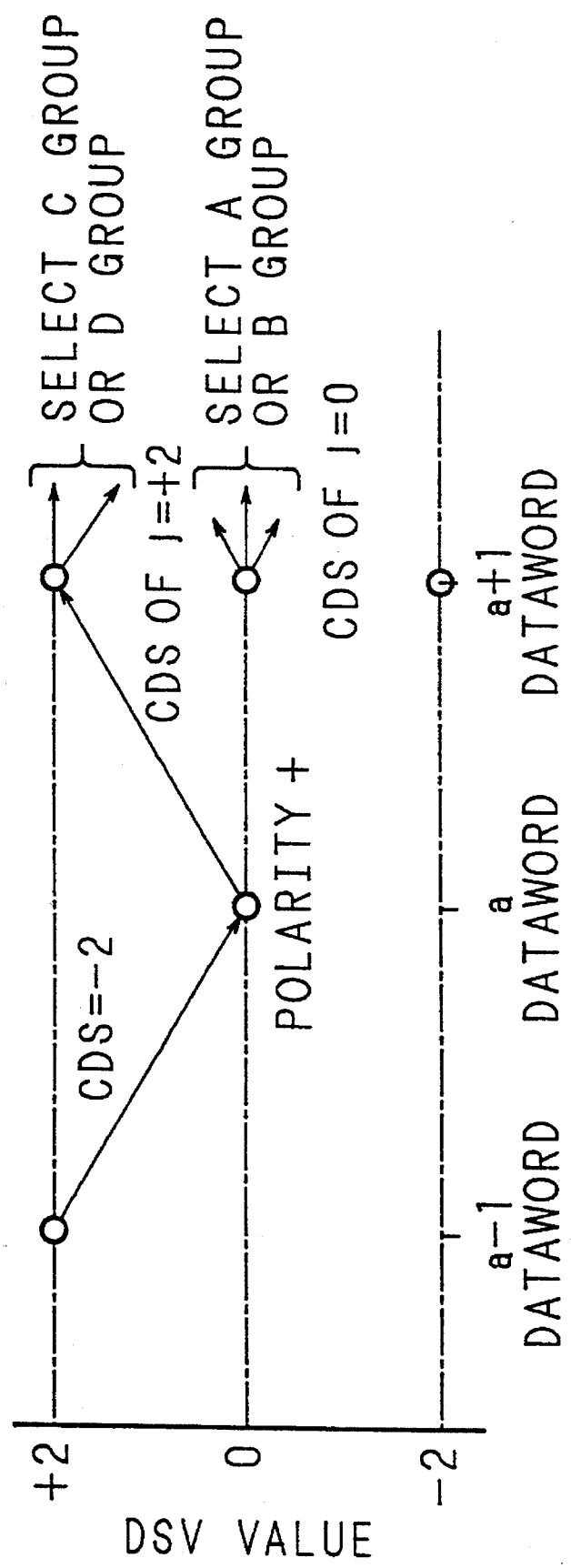
FIG. 14 is a diagram showing a DSV change during data conversion.

Next, we will explain the change of the DSV value. Refer to FIG. 14, where datawords are successively converted to codewords. Here, when a codeword corresponding to a dataword a −1 is outputted and the CDS of that codeword is −2, if the DSV at the time of outputting a codeword corresponding to the next dataword a is 0 and the polarity after NRZI modulation is negative, then a codeword j in group A is selected as the codeword corresponding to the dataword a. For any codeword in group A, the CDS is 0 or +2. If the CDS of the codeword j is 0 and the polarity at the end of the codeword j after NRZI modulation is negative, then group A is selected when selecting a codeword j+1 corresponding to a dataword a +1; if the CDS of the codeword j is 0 and the polarity is positive, then group B is selected. On the other hand, if the CDS of the codeword j is +2 and the polarity at the end of the codeword j after NRZI modulation is negative, then a codeword in group D is selected as the codeword j+1; if the CDS of the codeword j is +2 and the polarity is positive, then group C is selected.

In other words, when the DSV is 0, a codeword with CDS =0 is selected with a probability of 192/256, and a codeword with CDS=2 or CDS=−2 is selected with a probability of 64/256. When DSV is +2, a codeword with CDS=−2 is selected with a probability of 125/256, and a codeword with CDS=0 is selected with a probability of 131/256. When DSV is −2, a codeword with CDS=+2 is selected with a probability of 125/256, and a codeword with CDS=0 is selected with a probability of 131/256. As a result, the change of the DSV is limited to within the range of −2≦DSV≦2 between codewords, which enables the DSV to converge to 0 fast enough.

Next, explanation will be given of Q1 and Q2. Group A is selected when the polarity of the previous codeword after NRZI modulation is positive and the DSV is 0; that is, the DSV and the polarity at the end of a selected codeword determine the codeword group from which the next codeword is selected. The DSV value at the end of a selected codeword is obtained by adding the CDS of the selected codeword to the DSV preceding the selection of the codeword. Accordingly, when the CDS of the selected codeword is 0 and the polarity is negative, group A is selected for the next codeword, and when the CDS is 0 and the polarity is positive, group B is selected. On the other hand, when the CDS is 2 and the polarity is positive, group C is selected, and when the CDS is 2 and the polarity is negative, group D is selected. This is summarized in FIG. 15. The situation is the same for group B, group C, and group D, which are summarized in FIGS. 16 to 18, respectively.

Figure 19:
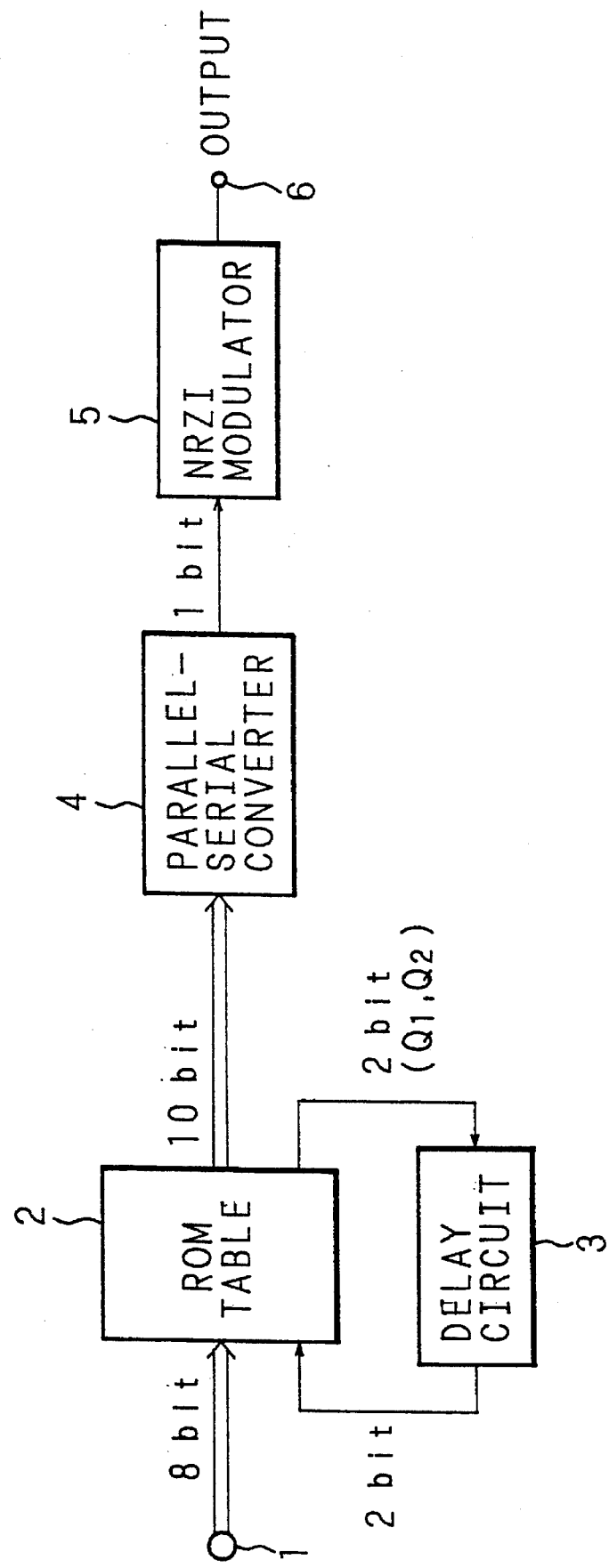
FIG. 19 is a diagram showing the configuration of a data conversion apparatus for implementing the data conversion method of Embodiments 1 and 2.

FIG. 19 is a block diagram showing an example of an encoding circuit used for dataword-to-codeword conversion as described above. In FIG. 19, the numeral 1 indicates a data input terminal via which 8-bit parallel data as a dataword is inputted. The parallel data is fed via the data input terminal 1 to a ROM table 2 that contains a conversion table. To the ROM table 2 is connected a delay circuit 3 for delaying Q1, Q2 by one dataword. The ROM table 2 outputs 10-bit parallel data, a codeword corresponding to the input dataword, which is fed to a parallel-serial converter 4. The parallel-serial converter 4 converts the input parallel data into serial data which is fed to an NRZI modulator 5. The NRZI modulator 5 NRZI-modulates the input data before it is output through an outputted terminal 6.

Next, the circuit operation for encoding will be described. In FIG. 19, 8-bit parallel data a (dataword) is inputted via the data input terminal and applied to address terminals of the ROM table 2. At the same time, the outputs Q1, Q2 from parallel data a −1 (the immediately-preceding dataword) are applied via the delay circuit 3 to address terminals of the ROM table 2. Ten-bit parallel data (codeword) corresponding to the dataword a is outputted from the ROM table 2 and fed to the parallel-serial converter 4, while at the same time, two bits, Q1 and Q2, are fed into the delay circuit 3. The 10-bit codeword is outputted as serial data from the parallel-serial converter 4, and is fed to the NRZI modulator 5 where it is NRZI-modulated and then outputted through the output terminal 6.

For decoding in Embodiment 1, the circuit configuration will not be described here, but it will suffice to say that an 8-bit dataword is outputted for each 10-bit codeword, the dataword being determined uniquely for each codeword.

Embodiment 2

Embodiment 2, as in Embodiment 1, concerns an example in which an 8-bit dataword is converted to a 10-bit codeword and NRZI modulation is performed. In Embodiment 2, of the codewords classified by CDS as shown in FIG. 5, all the codeword is that fall within −4≦CDS≦4 are used.

We will explain how the codewords are mapped. First, all the 192 codewords with CDS=0 are mapped to datawords. For the remaining 64 datawords, codewords with CDS=2 and codewords with CDS=−2 are paired together and mapped to these datawords. Of the codewords that fall within 4≧CDS≧2, 142 codewords are mapped to the datawords to which the codewords with CDS=0 were mapped. Furthermore, of the codewords that fall within −4≦CDS≦−2, 95 codewords are mapped to the datawords to which the codewords with CDS=0 were mapped. The codewords thus mapped are shown in FIGS. 20 to 27. In FIGS. 20 to 27, group A, group B, group C, and group D are selected in the same manner as described in Embodiment 1. The encoding and decoding circuits used are the same as those for Embodiment 1.

Embodiment 3

Embodiment 3 hereinafter described deals with the construction of a codeword, with dataword m=8 bits, codeword n=14 bits, and Tmax/Tmin=3.0. In this case, d=1 (d is the minimum number of 0s between an arbitrary "1" and the next "1"), and k=5 (k is the maximum number of 0s between an arbitrary "1" and the next "1"). The NRZI(F) rule is used to construct the codeword.

To achieve such data conversion, for each codeword the maximum number of successive 0s ("0" run length) on the LSB (least significant bit) side is set to 2, and within the codeword, the minimum number of successive 0s is set to 1 and the maximum number is set to 5. In this case, the "0" run length condition for the MSB (most significant bit) side that can satisfy d=1 and k=5 is provided in two ways: the "0" run length of 0 at minimum and 3 at maximum that allows codeword connection when the LSB of the immediately-preceding codeword is "0", and the "0" run length of 1 at minimum and 5 at maximum that enables codeword connection when the LSB of the immediately-preceding codeword is "1". The codewords are obtained in the numbers shown in FIGS. 28A and 28B.

To form DC-free codewords by controlling and suppressing the DSV divergence at each codeword end, codewords of opposite CDS polarities are paired together to provide $2^8$ pairs (256 pairs) corresponding to 8-bit data. The codewords thus obtained are divided into two groups to construct respective conversion 'tables. When forming a codeword sequence, the conversion tables are selected appropriately so that the CDSs of the selected codewords are in the direction that reduces the DSV value. Here, the codewords with CDS=0 can be used in either of the two groups.

To construct the codewords as described above, codewords with CDS≧0 and codewords with CDS≦0 are selected in pairs to form 256 pairs from each of the codeword groups shown in FIGS. 28A and 28B: FIG. 28A shows a group of codewords, with the MSB-side "0" run length of 3 at maximum, that can be used when the LSB of the immediately-preceding codeword is "0", and FIG. 28B shows a group of codewords, with the MSB-side "0" run length of 1 at minimum and 5 at maximum, that can be used when the LSB of the immediately-preceding codeword is 1. More specifically, in the case of FIG. 28A, of the codewords with CDS=+2, 100 codewords are selected and paired with the 100 codewords with CDS=−2; of the codewords with CDS=+4, 37 codewords are selected and paired with the 37 codewords with CDS=−4; of the codewords with CDS=+6, six codewords are selected and paired with the six codewords with CDS=−6; and the 147 codewords with CDS=0 are used in both groups to form 147 pairs; also, of the codewords with CDS≠0, the codewords with CDS>0 and the codewords with CDS<0 are used in pairs, while the codewords with CDS=0 are used in both groups. The total number of codeword pairs in this case is 147+100+37+6=290, which is enough to cover the 256 pairs to handle 8-bit data.

On the other hand, in the case of FIG. 28B, of the codewords with CDS=−2, 71 codewords are selected and paired with the 71 codewords with CDS=+2; of the codewords with CDS=−4, 27 is selected and paired with the 27 codewords with CDS=+4; of the codewords with CDS=−6, three codewords are selected and paired with the three codewords with CDS=+6; and the 100 codewords with CDS=0 are used in both groups to form 100 pairs; also, of the codewords with CDS≠0, the codewords with CDS>0 and the codewords with CDS<0 are used in pairs, while the codewords with CDS=0 are used in both groups. The total number of codeword pairs in this case is 100+71+27+3=201, which is 55 pairs short of the 256 pairs necessary to handle 8-bit data. To fill the shortage, the remaining 55 codewords with CDS= −2, −4, −6, and −8 are used in both groups of codewords with CDS≧0 and CDS≦0, and by suppressing the DSV divergence in the manner described below, DC-free codewords (codewords with finite DSV value) are constructed.

First, the suppression of the DSV divergence is accomplished in two ways: one is by controlling the suppression of the DSV divergence at each codeword end, and the other is by performing control so that the DSV is in the converging direction at the end of the next codeword to be connected. For this purpose, of the codeword pairs that are used when the LSB of the immediately-preceding codeword is 1, two codewords with CDS<0 (hereinafter called NG codewords) forming each codeword pair used to fi]]the shortage are each selected to have "0" as the LSB. That is, by selecting a codeword whose LSB is "0" as an NG codeword, the codeword succeeding the NG codeword always has a codeword with CDS≧ 0 and a codeword with CDS>0 as a pair and is therefore selected from among the codewords that are made to correspond to 8-bit data and are used when the LSB of the immediately-preceding codeword is "0". As a result, the DSV divergence at the end of the codeword succeeding the NG codeword can be converged or suppressed.

Second, when a codeword other than an NG codeword is Followed by an NG codeword, and when the DSV at the end of the NG codeword becomes larger than the DSV at the start of the non-NG codeword or the absolute value of the DSV exceeds a predetermined value, a codeword whose CDS is opposite in polarity to the CDS of that codeword is added as a subcode. As the subcode, a codeword is used which has the characteristic that there cannot be a case where the subcode is followed by an NG codeword whose DSV is in the diverging direction, and that, after the use of the subcode, the DSV at the codeword end temporarily moves in the diverging direction, but at the end of the next codeword to be connected, the DSV tending toward the diverging direction is converged to the same value as the DSV at the start of the subcode or to a value closer to 0 than it. For this purpose, the codeword to be connected after the subcode, that is, a codeword selected from the other conversion table containing codewords corresponding to the same 8-bit data as the NG codewords, is chosen to have the CDS of such a value as to bring the DSV, tending toward the diverging direction because of the subcode, back to its original value or to make the DSV smaller in absolute value terms than the DSV at the start of the subcode.

FIGS. 29 to 32 show the numbers of codewords, shown in FIGS. 28A and 28B, broken down by codeword LSB in relation to the CDS and the codeword end state (denoted by P) in a codeword sequence to consider the CDS to be selected for the next codeword to be connected. In each figure, P indicates the state transition within a codeword and the codeword end state after NRZI modulation; assuming that NRZI modulation is started at the low level, when the level at the end of a codeword is high, the state is indicated as P=−1 (which means the level at the end is opposite in polarity to that at the start of the codeword), and when the level at, the end of a codeword is low, the state is indicated as P=+1 (which means the level at the end is the same in polarity as that at the start of the codeword). FIGS. 29 and 30 show the numbers of codewords, with the MSB-side "0" run length of 3 at maximum, that are used when the LSB of the immediately-preceding codeword is "0", and FIGS. 31 and 32 show the numbers of codewords, with the MSB-side "0" run length from 1 to 5, that are used when the LSB of the immediately preceding codeword is 1.

Of the codewords, shown in FIGS. 29 and 30, that are used when the LSB of the immediately-preceding codeword is "0", the 72 codewords with CDS<0 in the codeword group of LSB "0", the 49 codewords with CDS=−2 in the codeword group of LSB "1", 42 codewords out of the codewords with CDS =0, and the 17 codewords with CDS=−4 and P=−1, a total of 180 codewords, are selected, and likewise, the 119 codewords with CDS>0 in the codeword group of LSB 0, 50 codewords out of the codewords with CDS=+2 in the codeword group of LSB "1", and 11 codewords out of the codewords with CDS=+4 and P=−1, a total of 180 codewords, are selected. These codewords are paired between CDS≦0 and CDS≧0, and the 76 codewords with CDS=0 in the codeword group of LSB "0" are used for both, which gives 180+76=256 pairs which can be made to correspond to 8-bit data. On the other hand, of the codewords, shown in FIGS. 31 and 32, that are used when the LSB of the immediately-preceding codeword is "1", 10 codewords out of the codewords with CDS=−2 in the codeword group of LSB "0", the 11 codewords with CDS= −6, and the 77 codewords with CDS<0 in the codeword group of LSB "1", a total of 98 codewords, are selected, and likewise, the 52 codewords with CDS>0 in the codeword group of LSB "0", and 46 codewords out of the codewords with CDS>0 in the codeword group of LSB "1", a total of 98 codewords, are selected. These codewords are paired between CDS<0 and CDS>0, and the 100 codewords with CDS=0 in both codeword groups of LSB "0" and "1" are used for both, which gives 98+100=198 pairs. To fill the shortage 256−198=58 pairs, the remaining 34 codewords with CDS=−2 in the codeword group of LSB "0" and the 24 codewords with CDS=−4, a total of 58 codewords, are used for both CDS<0 and CDS>0. As a result, the codewords with CDS=−2 and −4 in the codeword group of LSB "0" and used for CDS>0 correspond to the previously-mentioned NG codewords; since the LSB of the codeword is "0", the next codeword to be connected is always a pair of a codeword with CDS≧0 and a codeword with CDS≦0, described above, selected from the codeword group used when the LSB of the immediately-preceding codeword is "0".

To construct a codeword conversion table for implementing the above method of suppressing the DSV divergence, a function k for the DSV (DSV') at the end of the immediately-preceding codeword and the state (Pe) at the end of the immediately-preceding codeword in a codeword sequence is obtained, which is expressed as k=DSV'×Pe, and codewords are selected on the basis of the polarity of k and the LSB of the immediately preceding codeword. Here, Pe is related to the previously-mentioned P, i.e., Pe=−1 when the level at the codeword end is high, and Pe=+1 when it is low. At this time, for the codeword to be selected, DSV'>0 and Pe=+1 or DSV' <0 and Pe=−1 when k>0, so that it provides CDS≦0 that works in the direction of converging the DSV; conversely, when k<0, DSV'>0 and Pe=−1 or DSV'<0 and Pe=+1, resulting in CDS≧0 that works in the direction of converging the DSV. When k=0, the polarity of the CDS to be selected is not significant; in this case, whether the LSB of the immediately-preceding codeword is "0" or "1", there are as many codewords as can match 8-bit data, and a codeword with CDS<=0 where no NG codewords are used is selected.

From the above, the codeword pairs between CDS≧0 and CDS<0, classified by the LSB value of the immediately preceding codeword, can be divided into the following four groups according to the value of k at the end of the immediately-preceding codeword and the LSB of the immediately-preceding codeword.

(1) T0 group consisting of codewords with CDS≦0 that are selected when the LSB of the immediately preceding codeword is "0" and k≧0.

(2) T1 group consisting of codewords with CDS≧0 that are selected when the LSB of the immediately preceding codeword is "0" and k<0.

(3) T2 group consisting of codewords with CDS≦0 that are selected when the LSB of the immediately preceding codeword is "1" and k≧0.

(4) T3 group consisting of codewords with CDS≧0 that are selected when the LSB of the immediately preceding codeword is "1" and k<0.

Groups of (1) and (2) are used as a pair and groups of (3) and (4) are used as a pair according to the LSB of the immediately-preceding codeword.

Within each of the above groups the codewords are classified by the connection condition for the next codeword. The classification within the respective groups and the correspondence with 8-bit data in the conversion table are shown in FIGS. 33 to 36. In the figures, the data are given in hexadecimal. As shown, the codewords are classified as follows:

(a) Codewords whose LSB is "0" and that can be connected to a codeword of MSB "1". (Connected to a codeword in T0 or T1 group)

(b) Codewords whose LSB is "1" and that cannot be connected to a codeword of MSB "1" but, are connected to a codeword in T2 group. (Not connected to an NG codeword when k≧0 at codeword end)

(c) Codewords whose LSB is "1" and that cannot be connected to a codeword of MSB "1" (but are connected to a codeword in T2 or T3 group) and that has the characteristic that even when the next codeword is an NG codeword, the absolute value of the DSV at the end of the NG codeword does not exceed a predetermined value n. In this case, the codewords are constructed with the predetermined value n that is set at 8.

(d) Codewords whose LSB is "1" and that cannot be connected to a codeword of MSB "1" (but are connected to a codeword in T2 or T3 group) and that has the characteristic that if the next codeword is an NG codeword, the absolute value of the DSV at the end of the NG codeword may exceed the predetermined value n.

In T3 group shown in FIGS. 36A, 36B, NG codewords are made to correspond to data "C6"–"FF", and in the other groups, codewords the absolute value of whose CDS is 2 or larger and that fall in the above class (a) or (c) are made to correspond to these data. For the codewords of class (d) in the above classification, subcodes such as described previously are provided. FIGS. 37 to 40 show the LSB, CDS, and P for the subcode codewords provided for the codewords of class (d) in the respective groups.

The codewords shown in FIG. 37 are used as the subcode for T0 group, and this subcode group is designated as T01 group. This subcode group consists of codewords that fall into T1 group in the class where CDS=+2 and P=+1, and corresponds to the same 8-bit data. If any of these codeword is used when k>0 at the end of the immediately preceding codeword (in this case, k=0 at the end of the immediately-preceding codeword and there is no need to use a subcode), then k>0 at the end of the current codeword and the LSB of the codeword is "1"; therefore, it is connected to a codeword corresponding to the data to which an NG codeword in T2 group corresponds. As a result, the absolute value of the DSV at the end of the codeword connected after the subcode is smaller than the predetermined value n=8. Similarly, the codewords shown in FIG. 38 are used as the subcode for T1 group, and this subcode group is designated as T11 group. This subcode group consists of codewords that fall into T0 group in the class where CDS=0 and P=−1 and CDS=−2 and P=−1, and corresponds to the same 8-bit data. If any of these codewords is used when k<0 at the end of the immediately preceding codeword, then k>0 at the end of the current codeword and the LSB of the codeword is "1"; therefore, it is connected to a codeword corresponding to the data to which an NG codeword in T2 group corresponds. As a result, the absolute value of the DSV at the end of the codeword connected after the subcode is smaller than the predetermined value n=8.

The codewords shown in FIG. 39 are used as the subcode for T2 group, and this subcode group is designated as T21 group. This subcode group consists of codewords that fall into T3 group, and of these codewords, the codewords of LSB "1", CDS=+2, and P=+1 and the codewords of LSB "0", CDS=+2, and P=+1, corresponding to data "69"–"6E", correspond to the same 8-bit data to which the equivalent codewords in T3 group correspond. When any codeword in T21 group is used when k at the end of the immediately preceding codeword is of the polarity (k>0 or k=0) that provides the condition for the selection of codewords in the main T2 group, the LSB of the codeword is "0", so that the codeword is connected to a codeword in T0 group or T1 group, or k>0 at the end of the current codeword and the LSB of the codeword is 1, so that the codeword is connected to a codeword corresponding to the data to which an NG codeword in T2 group correspond. As a result, the absolute value of the DSV at the end of the codeword connected after the subcode is smaller than the predetermined value n=8. Similarly, the codewords shown in FIG. 40 are used as the subcode for T3 group, and this subcode group is designated as T31 group. This subcode group consists of codewords that fall into T2 group, and of these codewords, the codewords of LSB "1", CDS =–2, and P=–1, corresponding to data "54"–"5C", correspond to the same 8-bit data to which the equivalent codewords in T2 group correspond. When any codeword in T31 group is used when k<0 at the end of the immediately-preceding codeword, then k>0 at the end of the current codeword and the LSB of the codeword is "1", so that the codeword is connected to a codeword corresponding to the data to which an NG codeword in T2 group correspond, or k< 0 and the LSB of the codeword is "0", so that the codeword is connected to a codeword corresponding to the data to which an NG codeword in T1 group correspond. As a result, the absolute value of the DSV at the end of the codeword connected after the subcode is smaller than the predetermined value n=8.

The conversion tables and subcode tables are constructed as described above. The codewords that are the same between T2/T21 group and T3/T31 group but are mapped to different data are distinguished from one another by the polarity of k at the end of the immediately preceding codeword. The polarity provides the condition for selecting T2 (or T21) or T3 (or T31).

The above-explained codeword conversion tables are shown in FIGS. 41 to 46 (for T0 and T1 groups) and FIGS. 47 to 52 (for T2 and T3 groups). FIGS. 53 to 55 show the subcode tables. In the figures, "+" designates P=+1 and "–" designates P=–1, and for the codewords corresponding to the 8-bit data not shown in the subcode tables, there are no subcode data; for such codewords, the same codewords as the codewords corresponding to the same data in the main conversion tables are used.

Referring now to FIG. 56, we will explain how codewords are selected using the conversion tables. First, based on the LSB and k (=DSV'×Pe) at the end of the immediately preceding codeword, the dataword to be converted is tentatively converted to a dummy codeword by using the conversion tables T0/T1 and T2/T3 shown in FIGS. 41 to 52, and the LSB and k' are obtained From the DSV and Pe at the end of that dummy codeword. Next, based on the LSB and k' at the end of the dummy codeword, the conversion table used for the conversion of the next dataword is determined; if the next codeword (next dummy codeword) to be connected after the first dummy codeword is selected from the conversion tables T0, T1, or T2, the conversion table used for the conversion into the first dummy codeword is determined as the selection table to be used for converting the current dataword into a codeword. On the other hand, if the next dummy codeword to be connected after the first dummy codeword is selected from the conversion table T3, then the DSV at the end of the next dummy codeword is obtained from the LSB and the DSV and Pe at the end of the first dummy codeword; if the absolute value of the thus obtained DSV is equal to or smaller than the predetermined value n=8, the conversion table used for the conversion into the first dummy codeword is determined as the selection table, which is used for converting the current dataword into a codeword. If the absolute value of the DSV is larger than the predetermined value n=8, an appropriate conversion table for subcode selection is selected from among the conversion tables T01, T11, T21, and T31 shown in FIGS. 53 to 55 and determined as the selection table, to be used for converting the current dataword into a codeword.

By using the above conversion method, data conversion can be achieved wherein the number of successive 0s between an arbitrary "1" and the next "1" is 1 at the minimum and 5 at the maximum, i.e., Tmax/Tmin is 3.0. Furthermore, Tw× Tmin is 0.653 which is the same as the value achieved by the prior art 8-14 modulation method and is larger than 0.64 achieved by the prior art 8-10 modulation method, and thus, high-density recording is made possible. Moreover, the diverging range of the DSV (the separation between the minimum and maximum values of the DSV) is finite, that is, ±12 at codeword end and ±14 within the codeword sequence, which means DC free.

Figure 57:
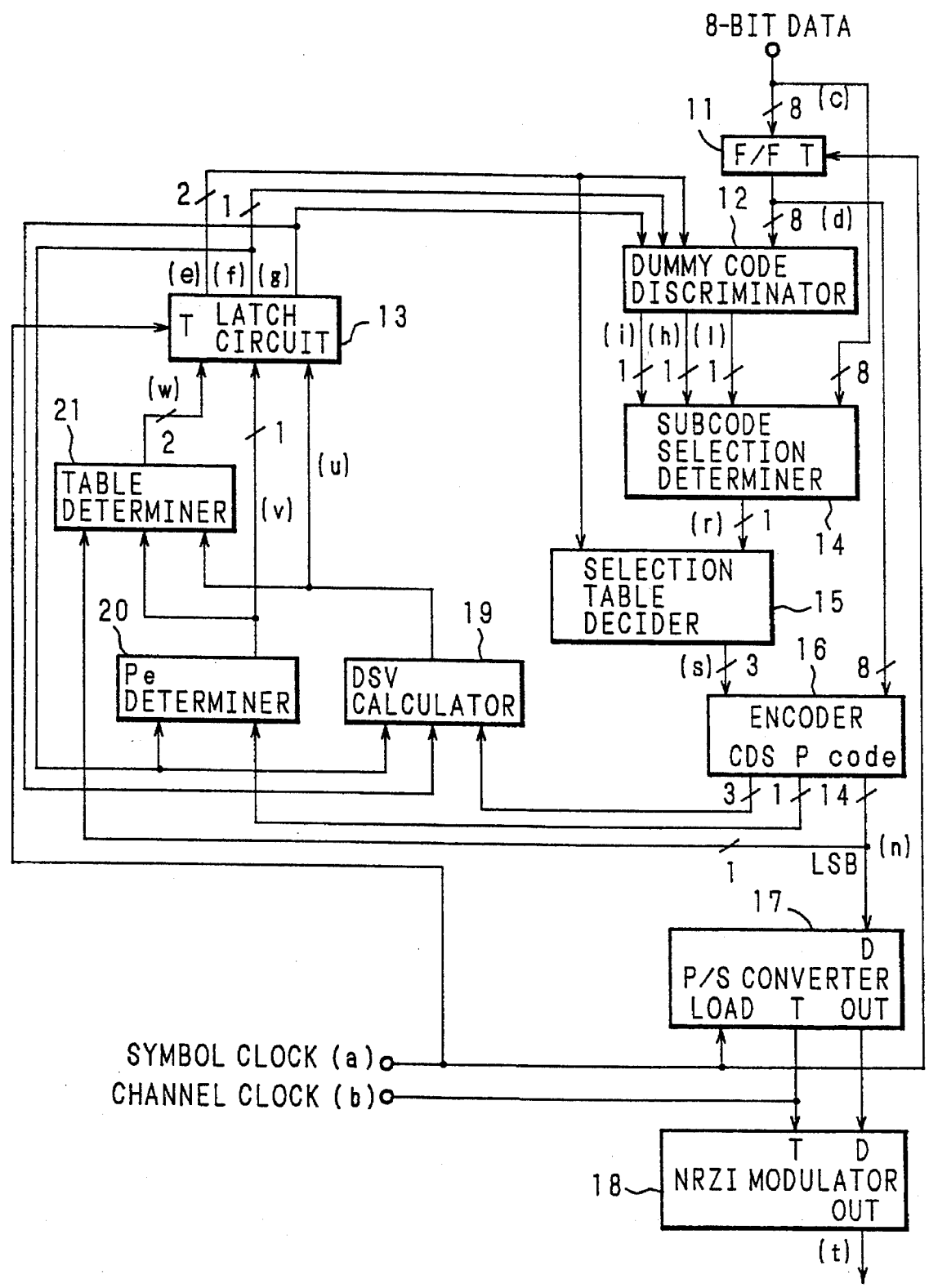
FIG. 57 is a diagram showing the configuration of a data conversion apparatus for implementing the data conversion method of Embodiment 3.

FIG. 57 is a diagram showing an example of a circuit configuration for an apparatus for implementing the data conversion method of Embodiment 3. In the figure, the numeral 11 designates a flip-flop circuit for delaying input 8-bit data (c) by one dataword and for outputting the thus delayed 8-bit data (d) to a dummy code discriminator 12. The dummy code discriminator 12 converts the input 8-bit data (d) into a dummy codeword, based on the DSV and the Pe signal at the end of the immediately-preceding codeword, delayed through a latch circuit 13, and a table selection signal determined on the basis of the DSV and Pe. The dummy code discriminator 12 then outputs the DSV and Pe signal at the end of the dummy codeword and also a signal designating the conversion table to be used for the selection of the next dummy codeword following the first dummy codeword; these signals are inputted to a subcode selection determiner 14. Based on the outputs of the dummy code discriminator 12, the subcode selection determiner 14 converts the input 8-bit data (c) into a codeword as the next dummy codeword, and based on the DSV at the end of the next dummy codeword and the signal designating the conversion table used for the conversion into the next dummy codeword, the subcode selection determiner 14 determines whether to use or not to use the subcode and supplies the result of the decision to a selection table decider 15. Based on the output of the subcode selection determiner 14 and the table selection signal from the latch circuit 13, the selection table decider 15 determines the conversion table to be used for the conversion of the current input data, and supplies a signal designating the conversion table to an encoder 16.

The encoder 16, in which data conversion tables such as shown in FIGS. 41 to 55 are stored, converts the 8-bit data (d), outputted from the flip-flop circuit 11, into a 14-bit codeword by using the conversion table selected in accordance with the signal fed from the selection table decider 15, and supplies the resulting codeword to a parallel-serial converter 17 as well as to a table determiner 21. The encoder 16 also outputs 3-bit data as CDS information associated with the 14-bit codeword to a DSV calculator 19, and a one-bit P signal indicating the state at the end of the codeword ("1" when P=+1, and "0" when P=–1) to a Pe determiner 20.

The 14-bit codeword outputted as a parallel signal from the encoder 16 is loaded into the parallel-serial converter 17 by a symbol clock (a), and converted into a serial signal in synchronism with a channel clock (b), the serial signal then being transferred to an NRZI modulator 18. The NRZI modulator 18 introduces a state transition (from high to low or from low to high) when the input signal is a "1".

The CDS information from the encoder 16 and the signals from the latch circuit 13, representing the DSV and Pe at the end of the immediately-preceding codeword, are inputted to the DSV calculator 19 which then calculates the DSV at the end of the current codeword and supplies the result of the calculation to the latch circuit 13 and also to the table determiner 21. The Pe determiner 20 determines the Pe signal which shows the state at the end of the converted current codewords on the basis of the P signal supplied from the encoder 16 and the Pe signal at the end of the last converted codeword supplied from the latch circuit 13, and outputs the result to the latch circuit 13 and the table determiner 21. The table determiner 21 is supplied at its inputs with the DSV from the DSV calculator 19, the Pe signal from the Pe determiner 20, and the LSB of the 14-bit codeword outputted from the encoder 16, and determines the conversion table to be used for the selection of the next codeword following the current codeword, and supplies a 2-bit table selection signal designating the conversion table to the latch circuit 13. The respective outputs from the DSV calculator 19, Pe determiner 20, and table determiner 21 are thus supplied to the latch circuit 13, where they are delayed by one symbol by using the symbol clock (a), to provide information for the conversion of the next dataword that follows the current codeword.

Figure 58:
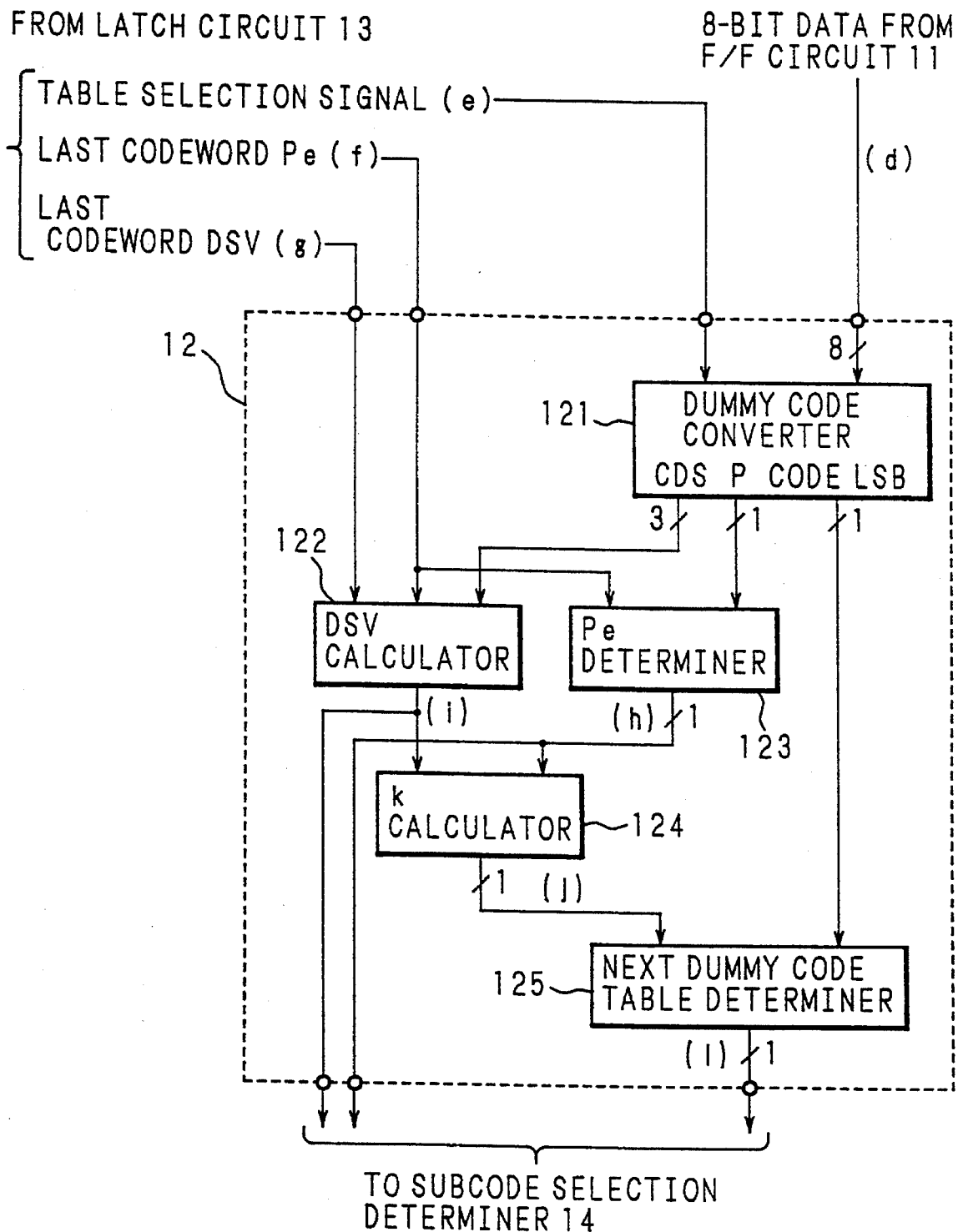
FIG. 58 is a diagram showing the configuration of a dummy code discriminator in the data conversion apparatus shown in FIG. 57.

FIG. 58 is a diagram showing an example of a circuit configuration for the dummy code discriminator 12. The dummy code discriminator 12, in which the LSB, CDS information and P signal for each codeword in the conversion tables of FIGS. 41 to 52 are stored in corresponding relationship to 8-bit data, has: a dummy code converter 121 that outputs the codeword LSB, CDS information, and P signal when the 8-bit data (d) fed from the flip-flop circuit 11 is converted into a dummy codeword in accordance with the table selection signal fed from the latch circuit 13; a DSV calculator 122 that calculates the DSV at the end of the dummy codeword on the basis of the CDS information supplied From the dummy code converter 121 and the DSV and Pe at the end of the immediately preceding codeword supplied from the latch circuit 13; a Pe determiner 123 that determines the state at the end of the dummy codeword on the basis of the P signal supplied from the dummy code converter 121 and the Pe signal at the end of the immediately preceding codeword supplied From the latch circuit 13, and that outputs a Pe signal indicating the result of the decision; a k calculator 124 that obtains a value k (k=DSV×Pe), which provides the condition for the selection of the conversion table for the conversion of the next codeword following the first dummy codeword, on the basis of the DSV and Pe signal at the end of the dummy codeword supplied from the DSV calculator 122 and the Pe determiner 123, and that outputs a signal indicating the polarity of the obtained value; and a next dummy code table determiner 125 that determines the conversion table to be used for the conversion of the next codeword (next dummy codeword) following the first dummy codeword, on the basis of the LSB of the first dummy codeword supplied from the dummy code converter 121 and the signal indicating the polarity of k supplied from the k calculator 124, and that outputs a signal indicating whether the next dummy codeword is to be selected from the conversion table T3 (FIGS. 47 to 52) containing NG codewords or from another conversion table T0, T1, or T2 (FIGS. 41 to 46, 47 to 52). The respective outputs from the DSV calculator 122, Pe determiner 123 and next dummy code table determiner 125 are supplied to the subcode selection determiner 14.

Figure 59:
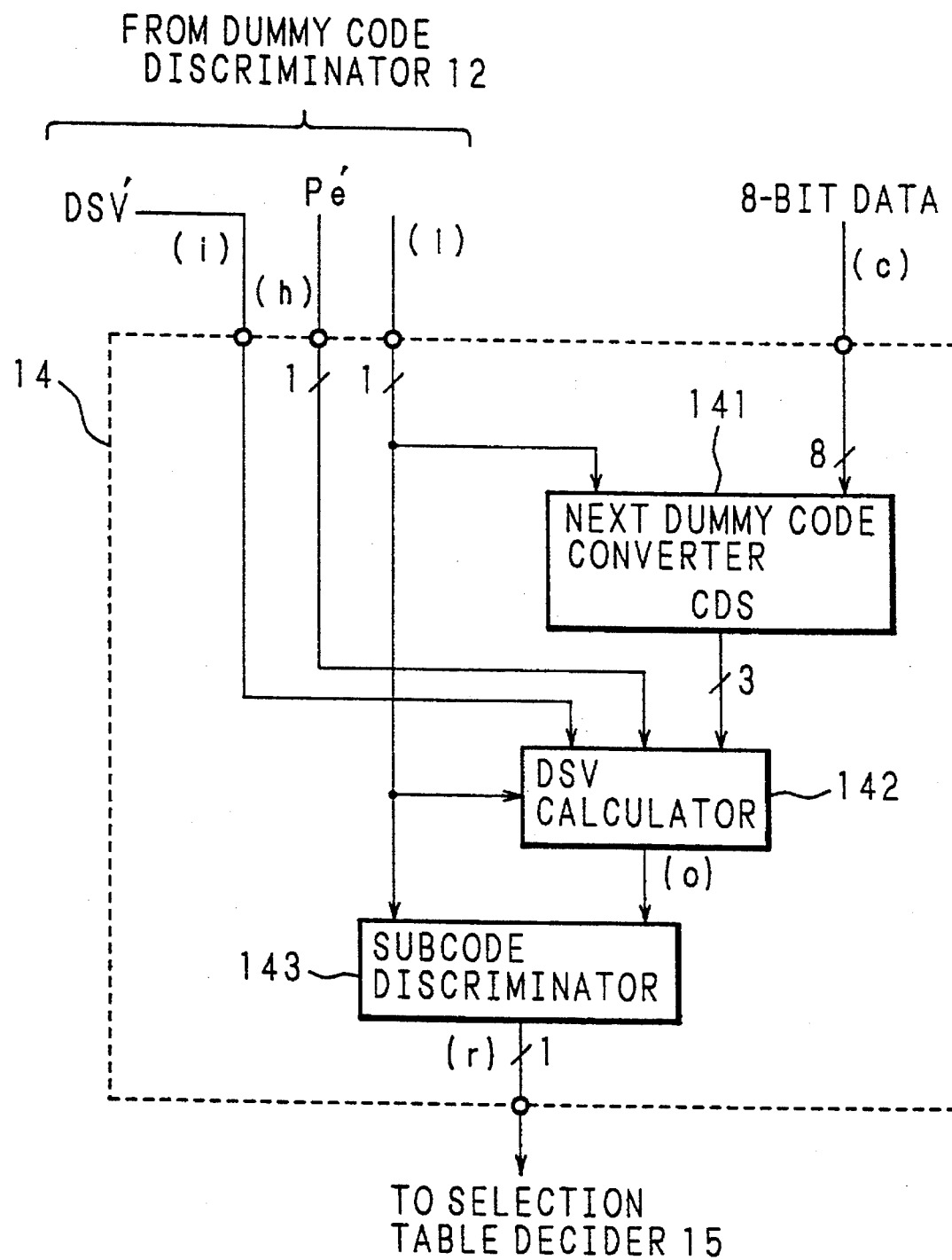
FIG. 59 is a diagram showing the configuration of a subcode selection determiner in the data conversion apparatus shown in FIG. 57.

FIG. 59 is a diagram showing an example of a circuit configuration for the subcode selection determiner 14. The subcode selection determiner 14, in which CDS information for the codewords in the conversion table T3 in FIGS. 47 to 52 is stored in corresponding relationship to 8-bit data, has: a next dummy code converter 141 that outputs CDS information for a codeword (next dummy codeword) when the input 8-bit data (c) is converted using the conversion table T3 in accordance with the select signal supplied from the next dummy code table determiner 125 in the dummy code discriminator 12 indicating whether or not the next dummy codeword is to be selected from the conversion table T3; a DSV calculator 142 which, only when the next dummy codeword is selected from the conversion table T3, calculates the DSV at the end of the next dummy codeword on the basis of the CDS information supplied from the next dummy code converter 141 and the DSV and Pe signal at the end of the dummy codeword supplied from the dummy code discriminator 12; and a subcode discriminator 143 to which the DSV at the end of the next dummy codeword and the select signal indicating the conversion table for the conversion of the next dummy codeword are inputted from the DSV calculator 142 and the dummy code discriminator 12 respectively, and which obtains the absolute value of the DSV at the end of the next dummy codeword when the next dummy codeword is a codeword generated using the table T3, and outputs a signal to select the current codeword from the subcode if the absolute value exceeds the predetermined value n=8, or a signal indicating not to use the subcode if the absolute value is equal to or smaller than the predetermined value or if the next dummy codeword is to be selected from other conversion tables than T3. The signal indicating whether to use or not to use the subcode is transferred to the selection table decider 15.

FIGS. 60 to 63 are timing diagrams for explaining in further detail the operation of the circuits described with reference to FIGS. 57, 58, and 59. In the figures, the signs (a) to (t) correspond to the points indicated by the same signs in the input/output sections of the circuits shown in FIGS. 57 to 59.

The operation of each circuit will be described in detail below. The 8-bit data (c) from an error-correction encoding circuit is inputted to the flip-flop circuit 11 and the subcode selection determiner 14. The flip-flop circuit 11 delays the input 8-bit data (c) by one dataword by using the symbol clock (a); the resulting delayed data (d) is supplied as a parallel signal to the dummy code discriminator 12 as well as to the encoder 16. In the dummy code discriminator 12, the 8-bit data (d) from the flip-flop circuit 11 and the table selection signal (e) from the latch circuit 13 are inputted to the dummy code converter 121, which then converts the 8-bit data (d) into a dummy codeword on the basis of the table selection signal (e), and outputs the CDS information, P signal, and codeword LSB of the resulting dummy codeword. The latch circuit 13 also supplies the DSV (g) and Pe signal (f) at the end of the immediately-preceding codeword to the dummy code discriminator 12, where the DSV value (g) at the end of the immediately-preceding codeword is inputted to the DSV calculator 122 and the Pe signal (f) at the end of the immediately-preceding codeword is inputted to the Pe determiner 123. Based on the DSV value (g) thus inputted and the CDS information supplied from the dummy code converter 121, the DSV calculator 122 calculates the DSV at the end of the dummy codeword and outputs the result (i). Based on the P signal from the dummy code converter 121 and the Pe signal at the end of the immediately-preceding codeword, the Pe determiner 123 determines the Pe signal at the end of the dummy codeword and outputs the result (h). Suppose here that, at time 1 in FIG. 60, the table selection signal (e) from the latch circuit 13 indicates the conversion table T0 while the Pe signal at the end of the immediately-preceding codeword is +1 and DSV(g) is 0. In this case, when the data (d) "8C" outputted from the flip-flop circuit 11 is converted by the dummy code converter 121 into a dummy codeword, the CDS, P signal, and codeword LSB for the dummy codeword are outputted as "0", "+1", and "1" respectively The output of the DSV calculator 122, i.e. the DSV (i) at the end of the dummy codeword and the output (h) of the Pe determiner 123 are "0" and "+1", respectively.

The DSV (i) at the end of the dummy codeword, outputted from the DSV calculator 122, and the Pe signal at the end of the dummy code, outputted from the Pe determiner 123, are supplied to the k calculator 124 as well as to the subcode selection determiner 14. The k calculator 124 calculates k =DSV×Pe from the DSV (i) and Pe signal (h), obtains its polarity, and outputs a signal (j), representing "1" if k≧ 0 and "0" if k<0, which is fed to the next dummy code table determiner 125. Based on the LSB of the dummy codeword from the dummy code converter 121 and the signal (j) indicating the polarity of k at the end of the dummy codeword, the next dummy code table determiner 125 determines the conversion table to be used for the conversion of the next dummy codeword that follows the first codeword, and outputs a signal (1) indicating, for example, a high level when the conversion table T3 is to be used, and a low level when another conversion table is to be used. More specifically, when the LSB of the first dummy codeword is 1 and k<0, then the next dummy codeword is selected from the conversion table T3; otherwise (when the dummy codeword LSB is "1" and k≧0 or when the LSB is "0"), a conversion table other than the conversion table T3 is used. At time 1 in FIG. 60, k=0 and the dummy codeword LSB is "1", and the conversion table T2 is selected for the next dummy codeword, so that the output (1) of the next dummy code table determiner 125 is a low level signal. The output (1) of the next dummy code table determiner 125 is supplied to the subcode selection determiner 14.

Next, the operation of the subcode selection determiner 14 will be described in detail. In the subcode selection determiner 14, the input 8-bit data (c) is inputted to the next dummy code converter 141 to which the signal (1) indicating whether or not the next dummy codeword is to be selected from the conversion table T3 is inputted from the next code table determiner 125. When the conversion table T3 is to be used, the next 8-bit data (c) "81" is converted as the next dummy codeword, and the associated CDS information is fed to the DSV calculator 142. Based on the CDS information associated with the next dummy codeword supplied from the next dummy code converter 141 and the DSV (i) and Pe signal (h) at the end of the first dummy codeword supplied from the dummy code discriminator 12, the DSV calculator 142 calculates the DSV at the end of the next dummy codeword, and outputs the result (o) which is supplied to the subcode discriminator 143. The DSV calculator 142 is required to perform the calculation only when the next dummy codeword is selected from the conversion table T3; the output (1) of the next dummy code table determiner 125 is applied to control the operation of the DSV calculator 142.

Based on the signal (1) supplied from the next dummy code table determiner 125 and the DSV (o) at the end of the next dummy codeword supplied from the DSV calculator 142, the subcode discriminator 143 determines whether to use or not to use the subcode for the conversion of the current input dataword, and outputs a signal (r) which is, for example, a high level signal when the subcode table is to be used, and a low level signal when the main code is to be used. The decision as to whether to use or not to use the subcode is made, first on the basis of the signal (1) indicating whether or not the next dummy codeword is to be selected from the conversion table T3; when the signal (1) is at the low level, the subcode is not used, and therefore, the low level signal is outputted. On the other hand, when the signal (1) is at the high level, indicating that the next dummy codeword is to be selected from the conversion table T3, then the absolute value of the DSV (o) at the end of the next dummy codeword supplied From the DSV calculator 142 is obtained; if the absolute value is larger than the predetermined value n=8, the subcode is used for the conversion of the current input dataword, so that the output (r) goes high, and if the absolute value is not larger than the predetermined value, the subcode is not used, so that a low level signal is outputted. At time 1 in FIG. 60, the output signal (1) of the next dummy code table determiner 125 is low and no output is generated either from the next code converter 141 or from the DSV calculator 142, which indicates that the subcode is not used, so that the subcode discriminator 143 outputs a low level signal. The output (r) of the subcode discriminator 143 is supplied to the selection table decider 15.

Along with the output (r) of the subcode selection determiner 14 (the subcode discriminator 143), the same table selection signal (e) as used to determine the dummy codeword is inputted to the selection table decider 15, which then decides which conversion table is to be used for the conversion of the current dataword, and outputs a 3-bit signal (s) indicating the decided selection table. More specifically, when the output (r) of the subcode discriminator 143 is at the low level, a signal indicating the conversion table designated by the table selection signal (e) is outputted; conversely, when the output (r) of the subcode discriminator 143 is at the high level, a signal indicating a subcode table is outputted. The output signal is fed to the encoder 16. Based on the decided selection table indicating signal (s) supplied from the selection table decider 15, the encoder 16 selects the conversion table to be used from among the conversion tables of FIGS. 41 to 55, and converts the 8-bit data (d) (dataword), inputted via the flip-flop circuit 11, into a 14-bit codeword for output. This 14-bit codeword is fed into the parallel-serial converter 17.

Figure 62:
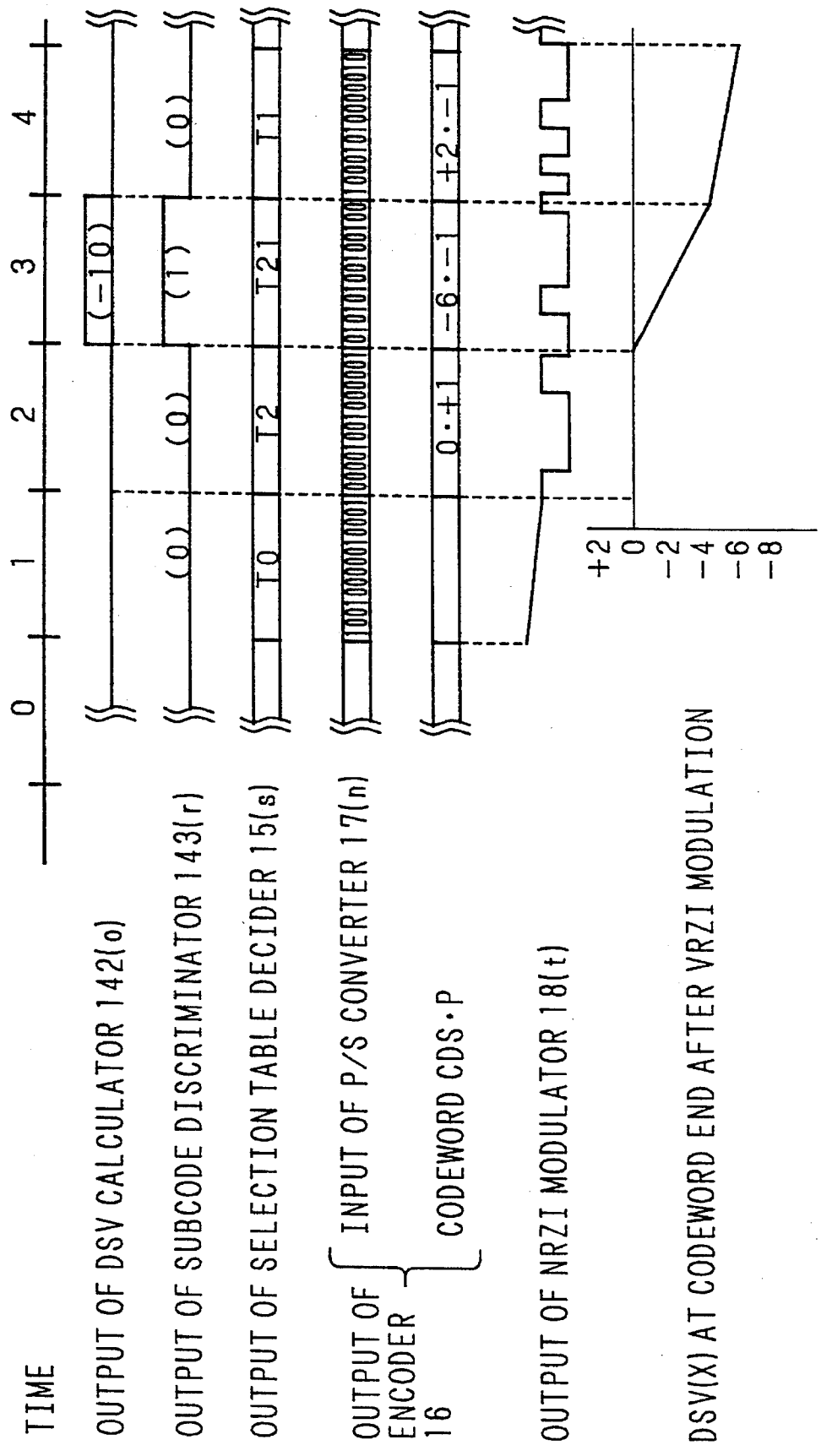
FIG. 62 is a timing chart for explaining in detail the operation of the data conversion apparatus shown in FIG. 57.
Figure 63:
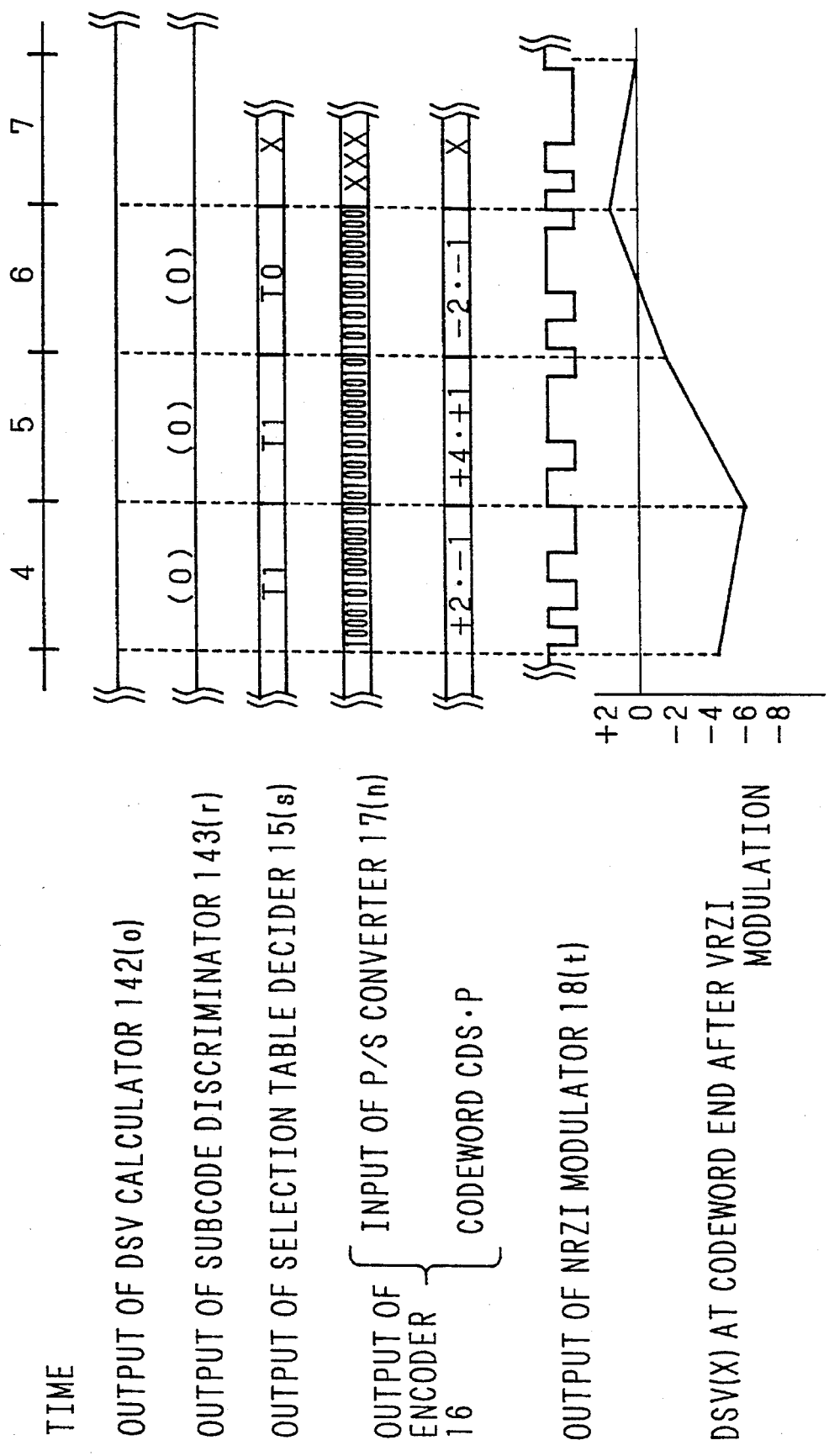
FIG. 63 is a timing chart for explaining in detail the operation of the data conversion apparatus shown in FIG. 57.

At time 1 in FIG. 62, since the output (r) of the subcode discriminator 143 is at the low level, the output (s) of the selection table decider 15 indicates T0, the same conversion table as designated by the table selection signal (e); therefore, in the encoder 16, the 8-bit data (d) "8C" is converted into a 14-bit codeword "10010000010001" (n) in accordance with the conversion table T0 shown in FIGS. 41 to 46, which is fed into the parallel-serial converter 17. This 14-bit codeword (n) is loaded into the parallel-serial converter 17 during a low level period of the symbol clock (a), and is outputted as a serial codeword sequence, with MSB as the leading bit, from the parallel-serial converter 17 in synchronism with the channel clock (b). The codeword sequence outputted from the parallel-serial converter 17 is fed into the NRZI modulator 18 where it is transformed into a signal (t), shown in FIG. 62, with its polarity being reversed at every appearance of a "1". With the high level designated as +1 and the low level as −1, when the CDS is calculated, the result is +1, and the DSV of the codeword sequence remains 0.

With the above operation, the 8-bit dataword has been converted into a 14-bit codeword. Next, the DSV at the end of the thus obtained codeword and the Pe signal indicating the state at the end of it are obtained, based on which the conversion table used for the conversion of the next dataword is determined. This operation will be described below.

Along with the 14-bit codeword, the encoder 16 outputs the CDS information associated with this codeword and the P signal indicating the state at the end of this codeword. The CDS information is fed to the DSV calculator 19 and the P signal to the Pe determiner 20. Further, the LSB of the codeword outputted from the encoder 16 is fed to the table determiner 21. Using the DSV (g) and Pe signal (f) at the end of the immediately preceding codeword supplied from the latch circuit 13 and the CDS information associated with the current codeword, the DSV calculator 19 calculates the DSV at the end of the current codeword and supplies the result (u) to the table determiner 21 as well as to the latch circuit 13. Based on the Pe signal (f) at the end of the immediately-preceding codeword supplied from the latch circuit 13 and the P signal of the current codeword supplied From the encoder 16, the Pe determiner 20 determines the Pe signal indicating the state at the end of the current codeword, and supplies the result (v) to the table determiner 21 as well as to the latch circuit 13. Based on the codeword LSB and also on the DSV (u) and Pe signal (v) at the end of the current, codeword supplied respectively from the DSV calculator 19 and the Pe determiner 20, the table determiner 21 determines the conversion table to be used for the next conversion, and supplies the result (w) to the latch circuit 13. More specifically, from the DSV and Pe signal at the end of the codeword, the value k=DSV×Pe is obtained, and the conversion table to be used is determined on the basis of the polarity of k and the LSB of the codeword: when the codeword LSB is "0" and k≧0, the conversion table T0 is selected; when the LSB is "0" and k<0, the conversion table T1 is selected; when the LSB is 1 and k≧0, the conversion table T2 is selected; and when the LSB is "1" and k <0, the conversion table T3 is selected for the conversion of the next, dataword. The DSV (u) and Pe signal (v) for the codeword and the output (w) from the table determiner 21, which are inputted to the latch circuit 13, are latched for one symbol period by using the symbol clock (a) and used as the information for the next dataword conversion.

Figure 60:
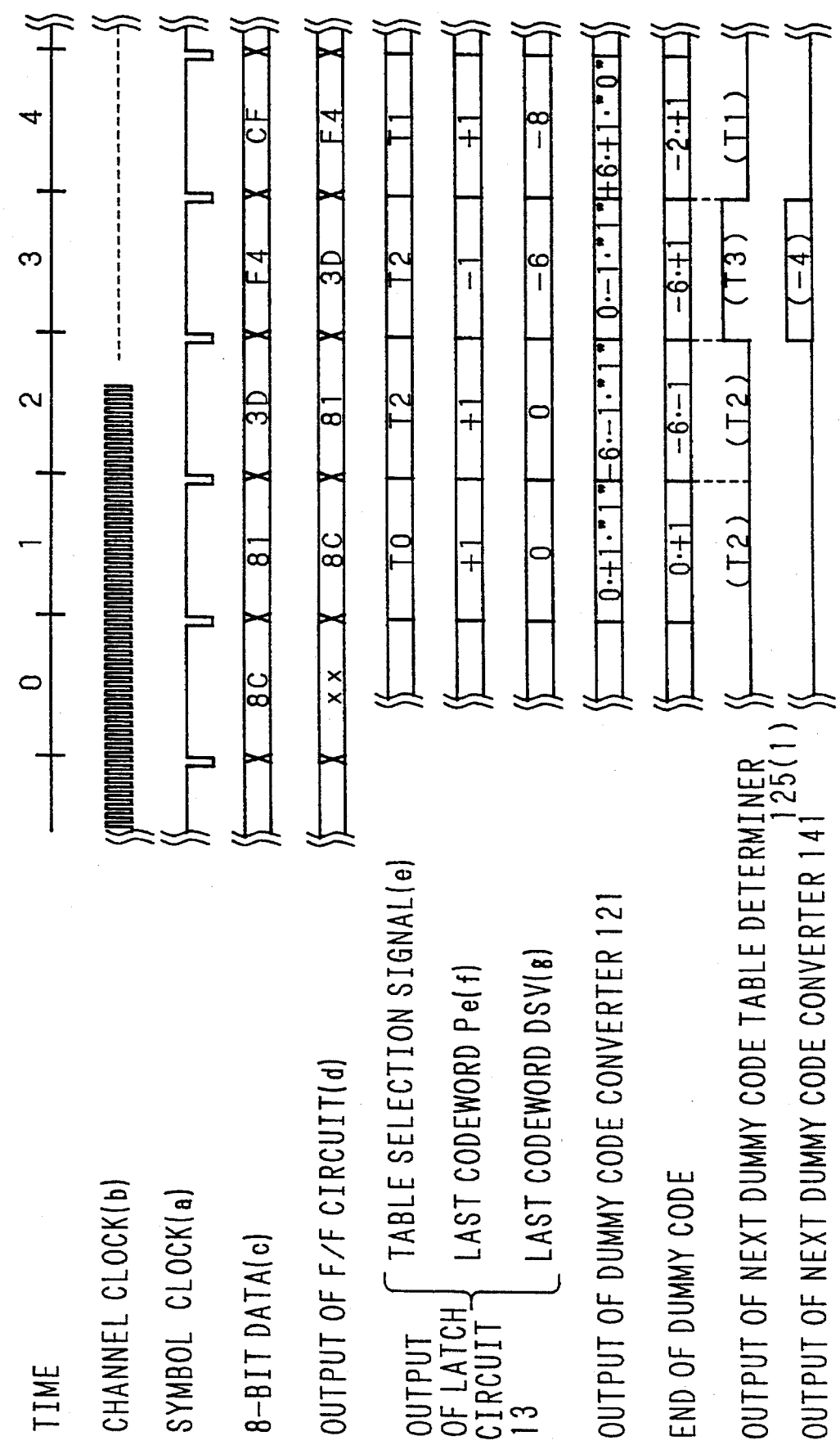
FIG. 60 is a timing chart for explaining in detail the operation of the data conversion apparatus shown in FIG. 57.
Figure 61:
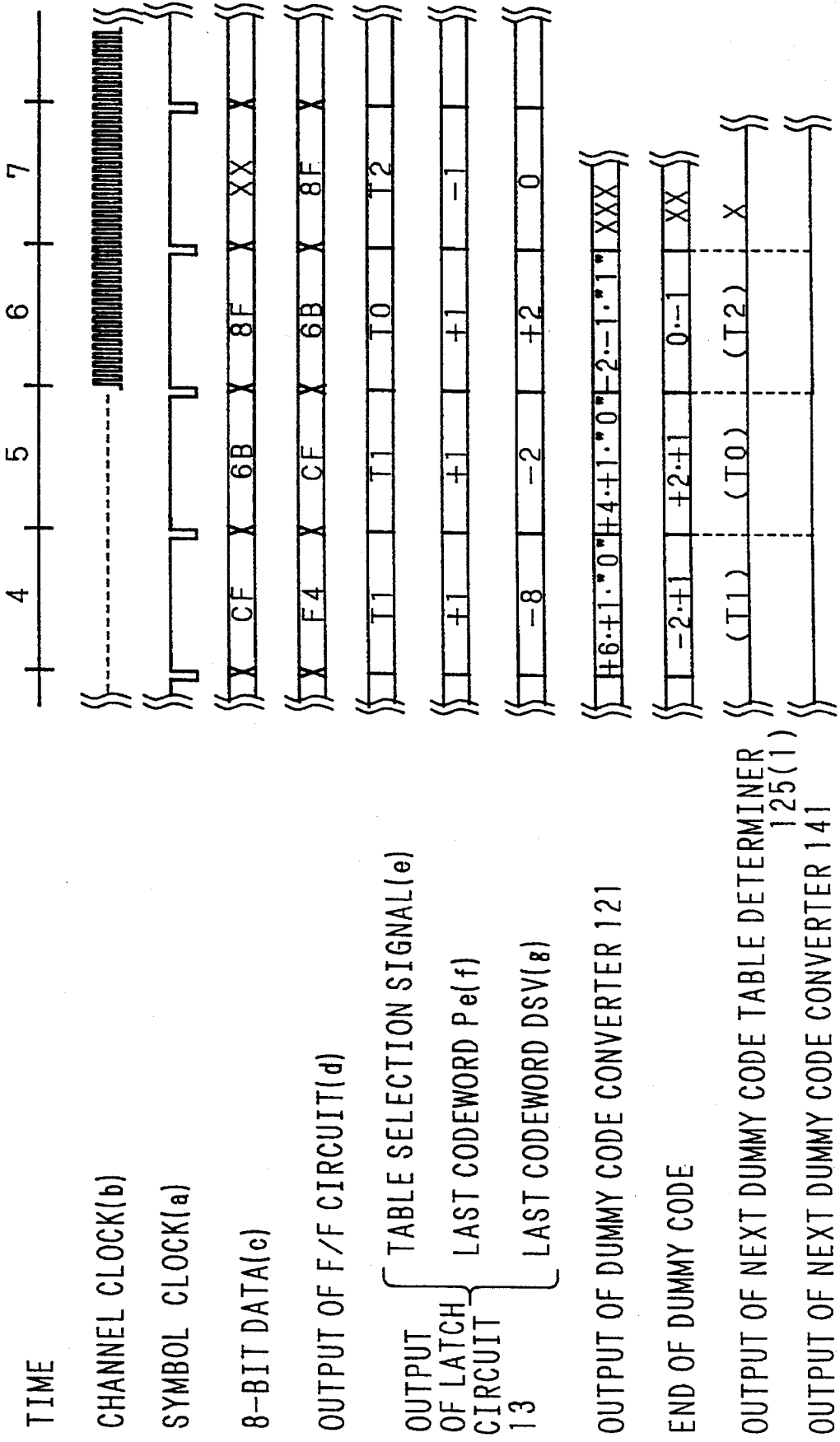
FIG. 61 is a timing chart for explaining in detail the operation of the data conversion apparatus shown in FIG. 57.

Referring to FIG. 60, the DSV (u) "0" and Pe (v) "+1" at the end of the codeword (n) converted from the 8-bit data "8C" at time 1 and the selection table signal (w) "T2" for the next codeword are latched in the latch circuit 13, and are used at time 2 as the DSV (g) and Pe signal (f) at the end of the immediately preceding codeword and the table selection signal (e), respectively. Then, in the same manner as described above, data conversion is performed on the input 8-bit data "81" at time 2.

As described above, every input 8-bit data (dataword) is converted by the encoder 16 into a 14-bit codeword on the basis of the DSV and Pe signal at the end of the immediately-preceding codeword as well as the kind of the next codeword and the DSV at the end of it; as a result, the change range of the DSV is held within a finite value, i.e. ±12 at the end of a codeword and ±14 within a codeword sequence, and a DC-free codeword can thus be obtained.

Embodiment 4

We will now describe a method of reproduction signal decoding wherein an n-bit codeword is reverse-converted into the original m-bit dataword for reproduction in a recording and reproduction apparatus employing the above-described data conversion method of Embodiment 3.

Figure 64:
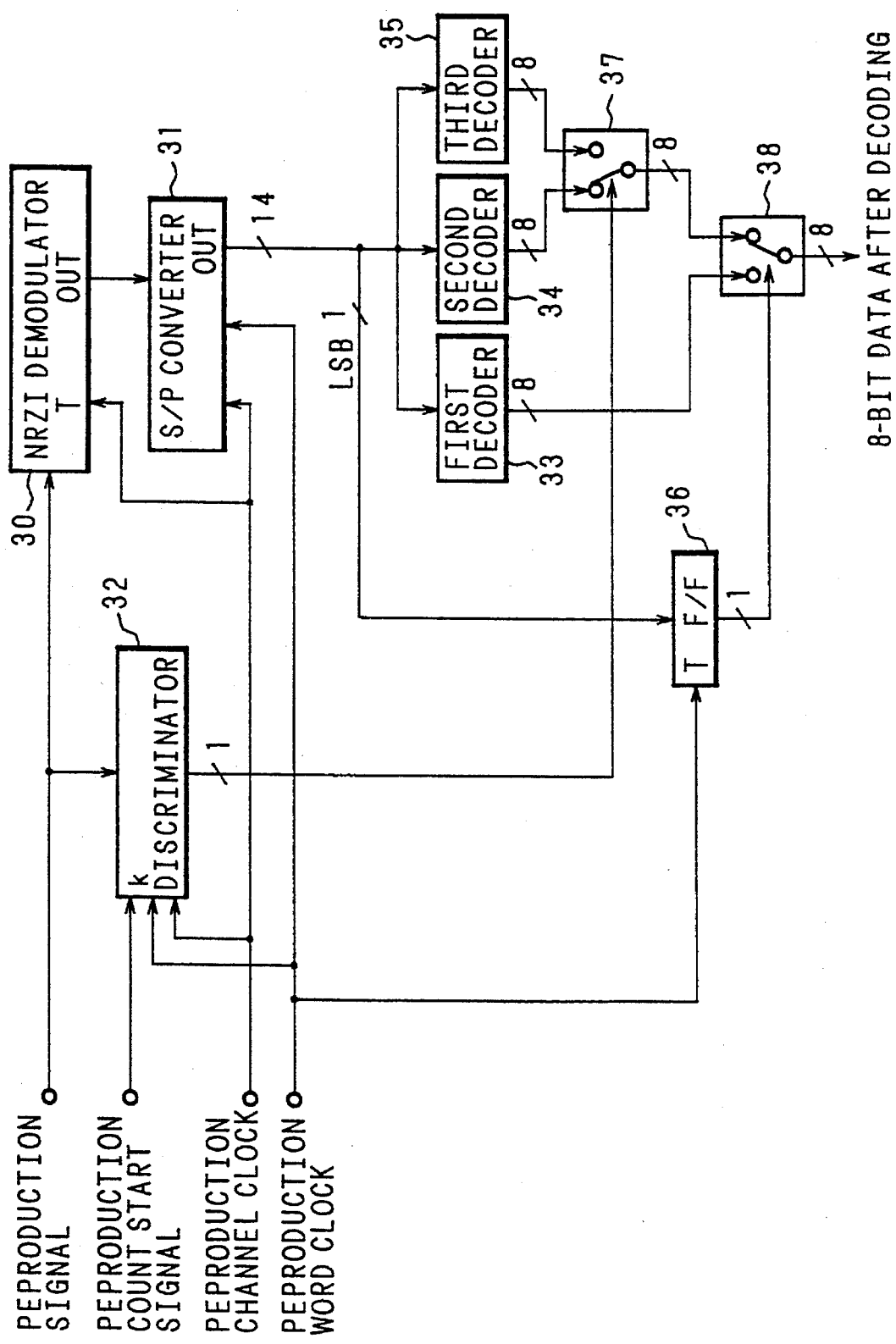
FIG. 64 is a diagram showing the configuration of a decoding system in a recording and reproduction apparatus of Embodiment 4 in which the data conversion method of Embodiment 3 is employed.

FIG. 64 is a block diagram showing an example of an apparatus for decoding reproduced 14-bit codewords into the original 8-bit datawords in a recording and reproduction apparatus employing the data conversion method of Embodiment 3. In FIG. 64, the numeral 30 designates an NRZI demodulator for NRZI-demodulating the reproduction signal transmitted in synchronism with a reproduction channel clock. The NRZI demodulator 30 supplies the NRZI-demodulated signal to a serial-parallel converter 31. The serial-parallel converter 31 converts the NRZI-demodulated serial signal from the NRZI demodulator 30 into a 14-bit parallel signal by using a reproduction word clock word-synchronized by a synchronizing signal appended to the beginning of a block, and supplies the converted signal to a first decoder 33, a second decoder 34, and a third decoder 35. Further, the serial-parallel converter 31 supplies the LSB of the 14-bit codeword to a flip-flop circuit 36. The transmitted reproduction signal is also inputted to a k discriminator 32. The k discriminator 32 counts the DSV during the reproduction of the reproduction signal being transmitted in synchronism with the reproduction channel clock, by using a reproduction count start signal that is synchronized with the output of the serial-parallel converter 31 by the reproduction channel signal, the reproduction word clock, the synchronizing clock appended to the beginning of a block, etc. At the same time, the k discriminator 32 discriminates the terminal state Pe and the DSV of the codeword to determine k=DSV×Pe for reproduction, latches the signal indicating the polarity of k by the reproduction word clock, and supplies the thus latched signal to a selector 37 to provide the decoding condition for the next codeword to be decoded. As the signal indicating the polarity of k, a "1" is outputted for k≧0, and a "0" is outputted for k<0, for example.

The first decoder 33 is supplied with 14-bit codewords outputted from the serial-parallel converter 31; of these 14-bit codewords, any codeword shown in the conversion table T0/T1 in FIGS. 41 to 46 or the conversion table T01/T11 in FIGS. 53 is decoded by the first decoder 33 into the original 8-bit dataword, and the result of the decoding is applied to one input terminal of a selector 38. The second decoder 34 is supplied, as is the first decoder 33, with 14-bit codewords outputted from the serial-parallel converter 31; of these 14-bit codewords, any codeword shown in the conversion table T2 in FIGS. 47 to 52 or the conversion table T21 in FIG. 54 is decoded by the second decoder 34 into the original 8-bit dataword, and the result of the decoding is applied to one input terminal of the selector 37. The third decoder 35 is supplied, as are the first and second decoders 33 and 34, with 14-bit codewords outputted from the serial-parallel converter 31; of these 14-bit codewords, any codeword shown in the conversion table T3 in FIGS. 47 to 52 or the conversion table T31 in FIG. 55 is decoded by the third decoder 35 into the original 8-bit dataword, and the result of the decoding is applied to the other input terminal of the selector 37.

The flip-flop circuit 36 delays the one-bit LSB, fed from the serial-parallel converter 31, by one word by using the reproduction word clock, and applies its output to the selector 38. Based on the signal from the k discriminator 32, the selector 37 selects the 8-bit dataword outputted from the second decoder 34 or the 8-bit dataword outputted from the third decoder 35, and applies the selected dataword to the other input of the selector 38. Based on the LSB of the codeword delayed by one word through the flip-flop circuit 36, the selector 38 selects the 8-bit dataword outputted from the first decoder 33 or the 8-bit dataword outputted from the selector 37, and outputs the selected 8-bit dataword.

The operation of the above apparatus will now be described. The reproduction signal is NRZI-demodulated by the NRZI demodulator 30, and fed to the serial-parallel converter 31, where the serial signal is converted to a parallel signal which is outputted as a 14-bit codeword. The reproduction signal is also supplied to the k discriminator 32 which counts the DSV of the reproduction signal by the reproduction count start signal, reproduction channel clock, and reproduction word clock, discriminates the DSV and Pe at the end of the codeword to determine k=DSV×Pe, latches the signal indicating the polarity of k by the word clock, and supplies the thus latched signal to the selector 37 as k information representing the condition at the end of the last decoded codeword immediately preceding the current codeword to be decoded. The 14-bit codeword outputted from the serial-parallel converter 31 is fed into the first decoder 33, second decoder 34 and third decoder 35, while the LSB of the 14-bit codeword is sent to the flip-flop circuit 36 where it is delayed by one word before it is transferred to the selector 38.

The first decoder 33 decodes the 14-bit codeword into the original 8-bit data (dataword) if it is a codeword shown in the conversion table T0/T1 in FIGS. 41 to 46 or the conversion table T01/T11 in FIG. 53, and supplies the decoded data to the selector 38. For the codewords in the conversion tables T0/T1 and T01/T11, the corresponding 8-bit data are not discriminated by the polarity of k at the end of the last decoded codeword, but these codewords are used when the LSB of the immediately-preceding codeword is "0". On the other hand, the second decoder 34 decodes the 14-bit codeword into the original 8-bit data if it is a codeword shown in the conversion table T2 in FIGS. 47 to 52 or the conversion table T21 in FIG. 54, and supplies the decoded data to the selector 37, and the third decoder 35 decodes the 14-bit codeword into the original 8-bit data if it is a codeword shown in the conversion table T3 in FIGS. 47 to 52 or the conversion table T31 in FIG. 55, and supplies the decoded data to the selector 37. For the codewords in the conversion tables T2/T21 and T3/T31, the corresponding 8-bit data need to be discriminated by the polarity of k at the end of the last decoded codeword, and these codewords are used when the LSB of the immediately preceding codeword is "1".

Next, using the signal indicating the polarity of k at the end of the last decoded signal supplied from the k discriminator 32 as the selection signal, the selector 37 selects the 8-bit data decoded by the second decoder 34 when k>0, or the 8-bit data decoded by the third decoder 35 when k<0, and supplies the selected data to the selector 38. Using the LSB of the last decoded codeword supplied from the flip-flop circuit 36 as the selection signal, the selector 38 selects the 8-bit data from the first decoder 33 when the LSB of the immediately-preceding codeword is "0", or the 8-bit data selected by the selector 37 when the LSB is "1", and outputs the selected data as the decoded 8-bit data.

Thus, according to the above decoding method of reverse-converting and decoding reproduced 14-bit codewords into 8-bit datawords in a recording and reproduction apparatus employing the data conversion method of Embodiment 3, the polarity of k is obtained from the DSV and Pe at the end of the immediately preceding codeword in the reproduction signal, and decoding is performed by switching the outputs of the conversion tables according to the polarity of k and the LSB of the immediately preceding codeword.

Embodiment 5

In the above-described decoding method of Embodiment 4, three kinds of decoders (first, second and third decoders) using different conversion tables are provided, and the decoded data are selected, using selectors, according to the discriminating conditions of the polarity of k and the LSB at the end of the immediately preceding codeword. It will be recognized, however, that the method of selecting the conversion table according to the discriminating conditions is not limited to the above-illustrated one. For example, as shown in FIG. 65, a discrimination signal may be generated from the signal supplied from the k discriminator and the LSB of the immediately-preceding codeword, and this signal may be inputted to the decoder along with the codeword to be decoded to obtain m-bit data (dataword); with this configuration also, the same effect as achieved in Embodiment 4 can be obtained.

Figure 65:
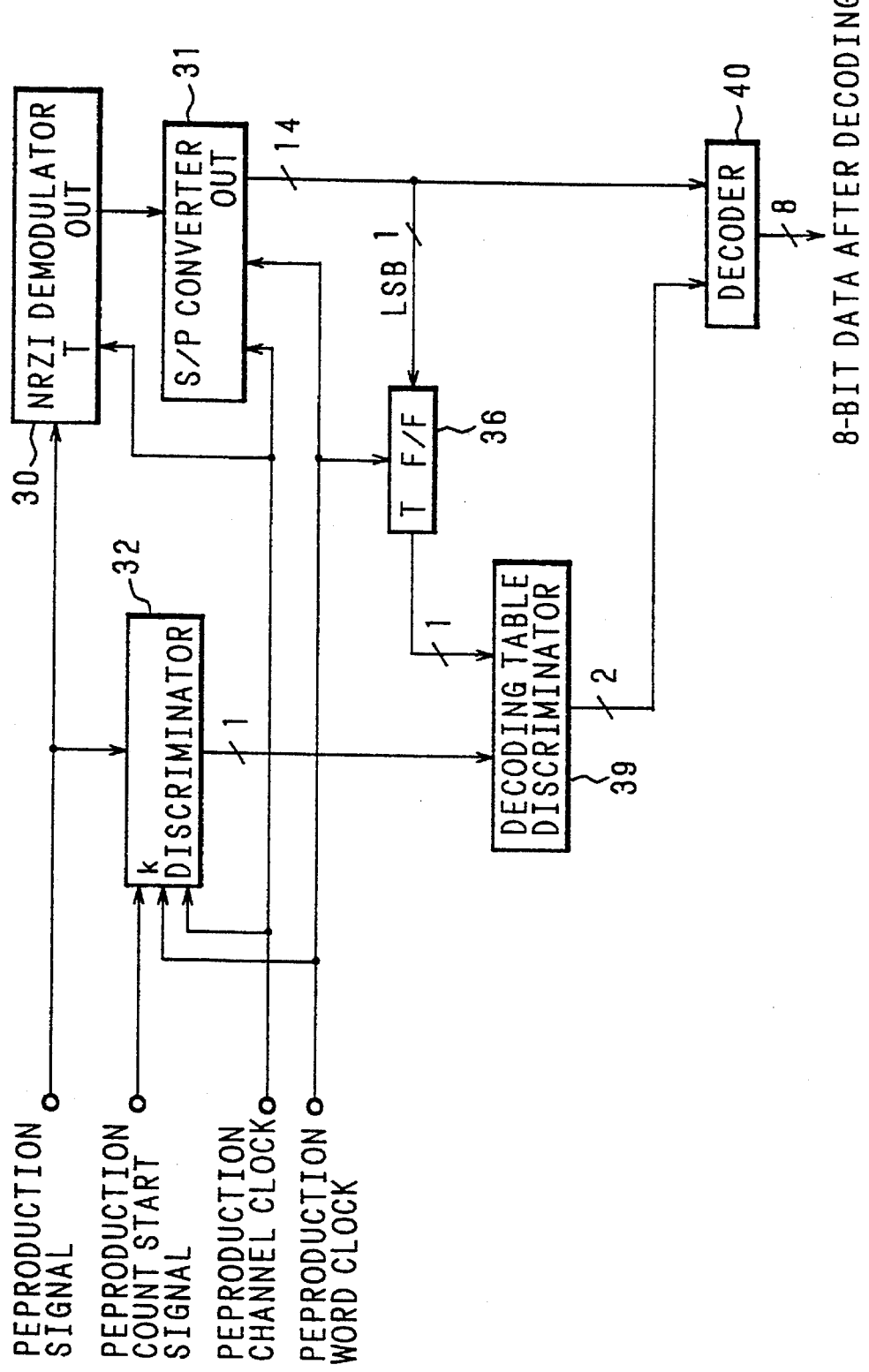
FIG. 65 is a diagram showing the configuration of a decoding system in a recording and reproduction apparatus of Embodiment 5 in which the data conversion method of Embodiment 3 is employed.

In FIG. 65, the parts indicated at 30, 31, 32 and 36 are identical to the corresponding parts in the apparatus of Embodiment 4. The numeral 39 designates a decoding table discriminator which accepts at its inputs the signal indicating the polarity of k, outputted from the k discriminator 32, and the LSB of the immediately-preceding codeword supplied from the flip-flop circuit 36, and which discriminates the signal designating the decoding table to be used for the decoding of the current codeword. The decoding table discriminator 39 outputs a 2-bit control signal to the decoder 40; For example, a signal "00" when the same decoding table as in the first decoder 33 in Embodiment 4 is to be used, a signal "01" when the same decoding table as in the second decoder 34 is to be used, and a signal "11" when the same decoding table as in the third decoder 35 is to be used. The decoder 40 accepts at its inputs the 2-bit control signal designating the decoding table, outputted from the decoding table discriminator 39, as well as the 14-bit codeword to be decoded, and converts the 14-bit codewords into an 8-bit dataword for output.

The operation of the above apparatus will now be described. The 14-bit codeword outputted from the serial-parallel converter 31 is inputted to the decoder 40, while the LSB of the codeword is sent to the flip-flop circuit 36 where it is delayed by one word before being passed on to the decoding table discriminator 39. Also inputted to the decoding table discriminator 39 is the signal indicating the polarity of k at the end of the immediately-preceding codeword, outputted from the k discriminator 32. Based on the signal supplied from the k discriminator 32 and the LSB of the immediately preceding codeword supplied from the flip-flop circuit 36, the decoding table discriminator 39 discriminates the decoding table to be used for the decoding of the current codeword, and supplies the output to the decoder 40. At this time, a signal "00" indicating the same decoding table as used in the first decoder 33 in Embodiment 4 is supplied to the decoder 40 when the LSB of the immediately-preceding codeword is "0"; a signal "01" indicating the same decoding table as used in the second decoder 34 in Embodiment 4 is supplied when the LSB of the immediately-preceding codeword is "1" and k≧0; and a signal "11" indicating the same decoding table as used in the third decoder 35 in Embodiment 4 is supplied when the LSB of the immediately-preceding codeword is "1" and k<0.

The 2-bit control signal outputted from the decoding table discriminator 39 and the 14-bit codeword are inputted to the decoder 40 for decoding: when the control signal bits are "00", the 14-bit codeword is decoded into an 8-bit dataword by using the same conversion table as used in the first decoder 33 in Embodiment 4 shown in FIG. 64; when the control signal bits are "01", the 14-bit codeword is decoded into an 8-bit dataword by using the same conversion table as used in the second decoder 34; and when the control signal bits are "11", the 14-bit codeword is decoded into an 8-bit dataword by using the same conversion table as used in the third decoder 35.

The decoded 8-bit data (dataword) is thus outputted from the decoder 40, achieving the same effect as obtained with the decoding method of Embodiment 4.

Embodiment 6

Figure 66:
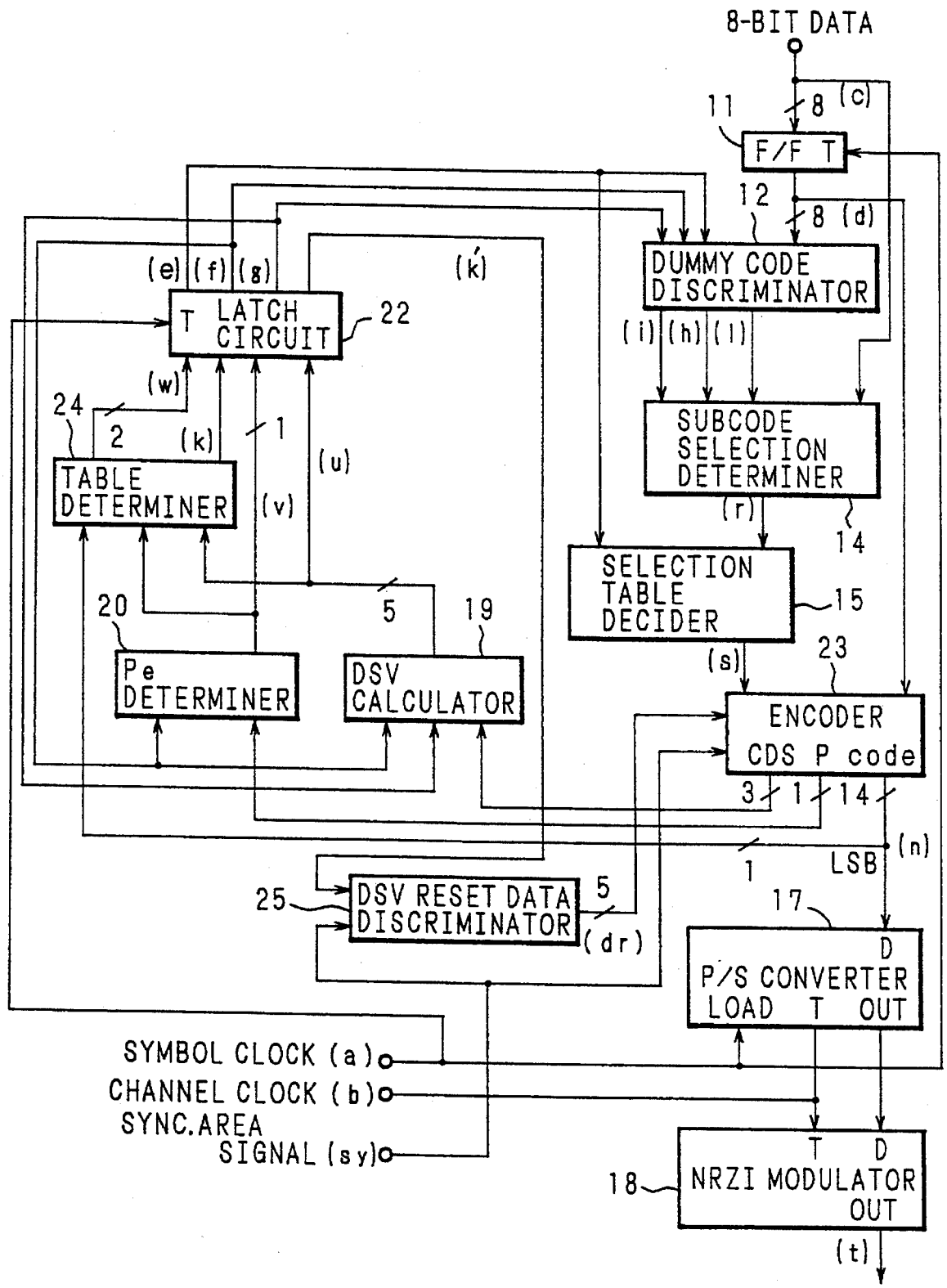
FIG. 66 is a diagram showing the configuration of another data conversion apparatus (Embodiment 6) for implementing the data conversion method of Embodiment 3.

FIG. 66 is a diagram showing a circuit configuration for implementing the data conversion method of Embodiment 3. In FIG. 66, the parts indicated at 11, 12, 14, 15, and 17 to 20 are identical to the corresponding parts in the apparatus of Embodiment 3 shown in FIG. 57. The numeral 22 indicates a latch circuit for delaying the input signal by one symbol by using the symbol clock (a). The numeral 23 is an encoder which contains therein: data conversion tables, such as shown in FIGS. 41 to 55; a codeword not used in any of these conversion tables, as a codeword indicating a synchronizing signal; and codewords to be placed after the synchronizing signal and used for resetting the DSV at the end of the synchronizing signal to 0. Based on the signal supplied from the selection table decider 15, a sync. area signal (sy) indicating a synchronizing signal area, and a signal (dr) indicating the output of the DSV resetting codeword, the encoder 23 selects the conversion table, synchronizing signal or DSV reset data, and encodes the 8-bit data (d) outputted from the flip-flop circuit 11 into a 14-bit codeword for output. The encoder 23 also outputs 3-bit CDS information associated with the output 14-bit codeword and a 1-bit P signal indicating the state at the end of the output codeword ("1" when P=+1, "0" when P=−1); the CDS information is supplied to the DSV calculator 19 and the P signal to the Pe determiner 20.

The DSV outputted from the DSV calculator 19, the Pe signal outputted from the Pe determiner 20, and the LSB of the 14-bit codeword outputted from the encoder 23 are inputted to a table determiner 24 which then obtains k=DSV× Pe, determines the conversion table to be selected for the conversion of the next dataword succeeding the current dataword, and supplies a 2-bit table selection signal indicating the selected table and the value of k to the latch circuit 22. The numeral 25 is a DSV reset data discriminator to which the value of k at the end of the immediately-preceding codeword is inputted from the latch circuit 22, and which, based on the sync. area signal (sy) and symbol clock (a), discriminates such data as to reset the DSV at the end of the synchronizing signal to 0 in the two-symbol area succeeding the sync. signal area, creates a signal indicating such data, and supplies it to the encoder 23.

Figure 67:
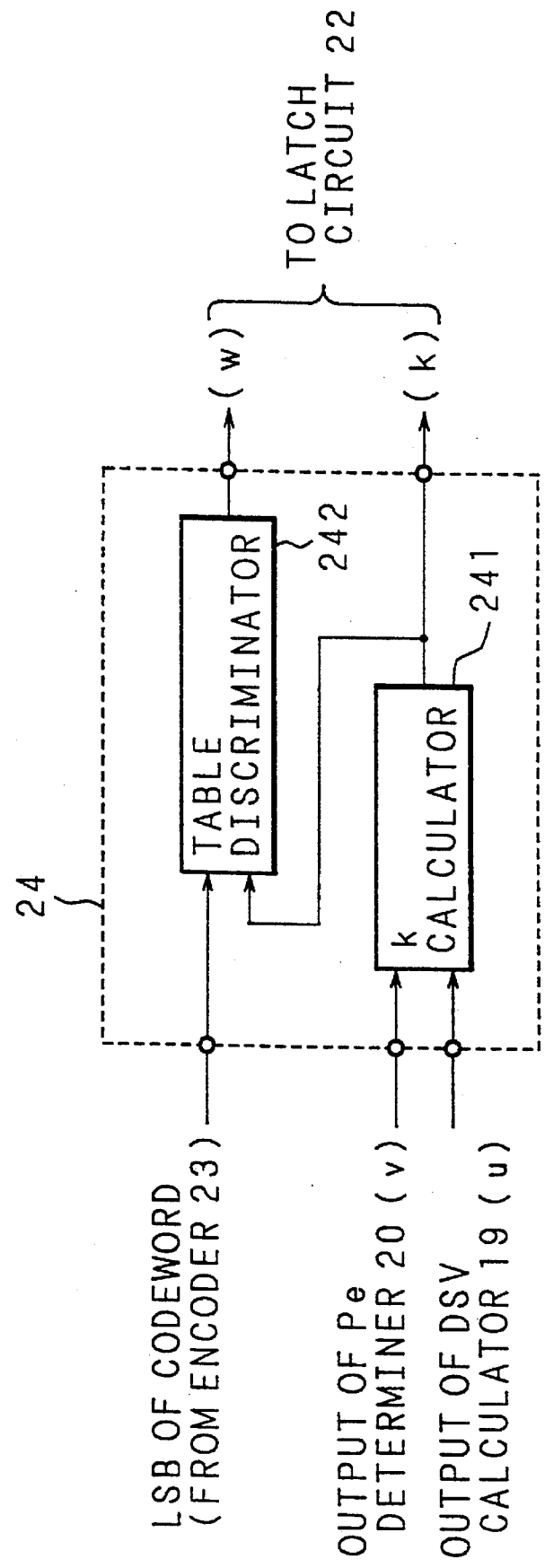
FIG. 67 is a diagram showing the configuration of a table determiner in the data conversion apparatus shown in FIG. 66.

FIG. 67 is a diagram showing an example of a circuit configuration for the table determiner 24. The table determiner 24 includes: a k calculator 241 that obtains k=DSV× Pe from the DSV (u) at the end of the codeword supplied from the DSV calculator 19 and the Pe signal (v) supplied from the Pe determiner 20, and that outputs the resulting value; and a table discriminator 242 that accepts at its inputs the value of k from the k calculator 241 and the LSB of the codeword from the encoder, and that discriminates the conversion table to be selected for the next dataword to be converted. The respective outputs of the k calculator 241 and table discriminator 242 are supplied to the latch circuit 22 where they are delayed by one symbol.

Figure 68:
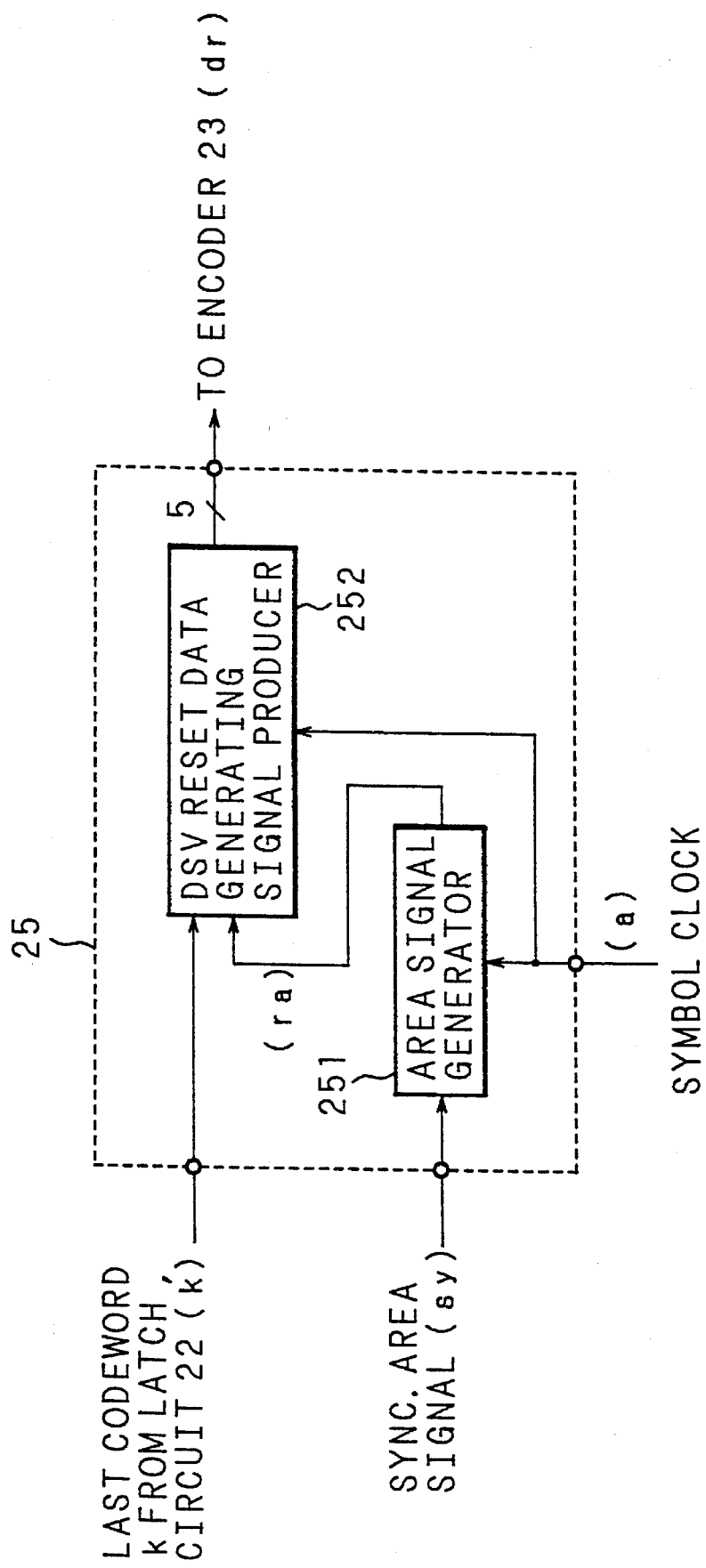
FIG. 68 is a diagram showing the configuration of a DSV reset data discriminator in the data conversion apparatus shown in FIG. 66.
Figure 69:
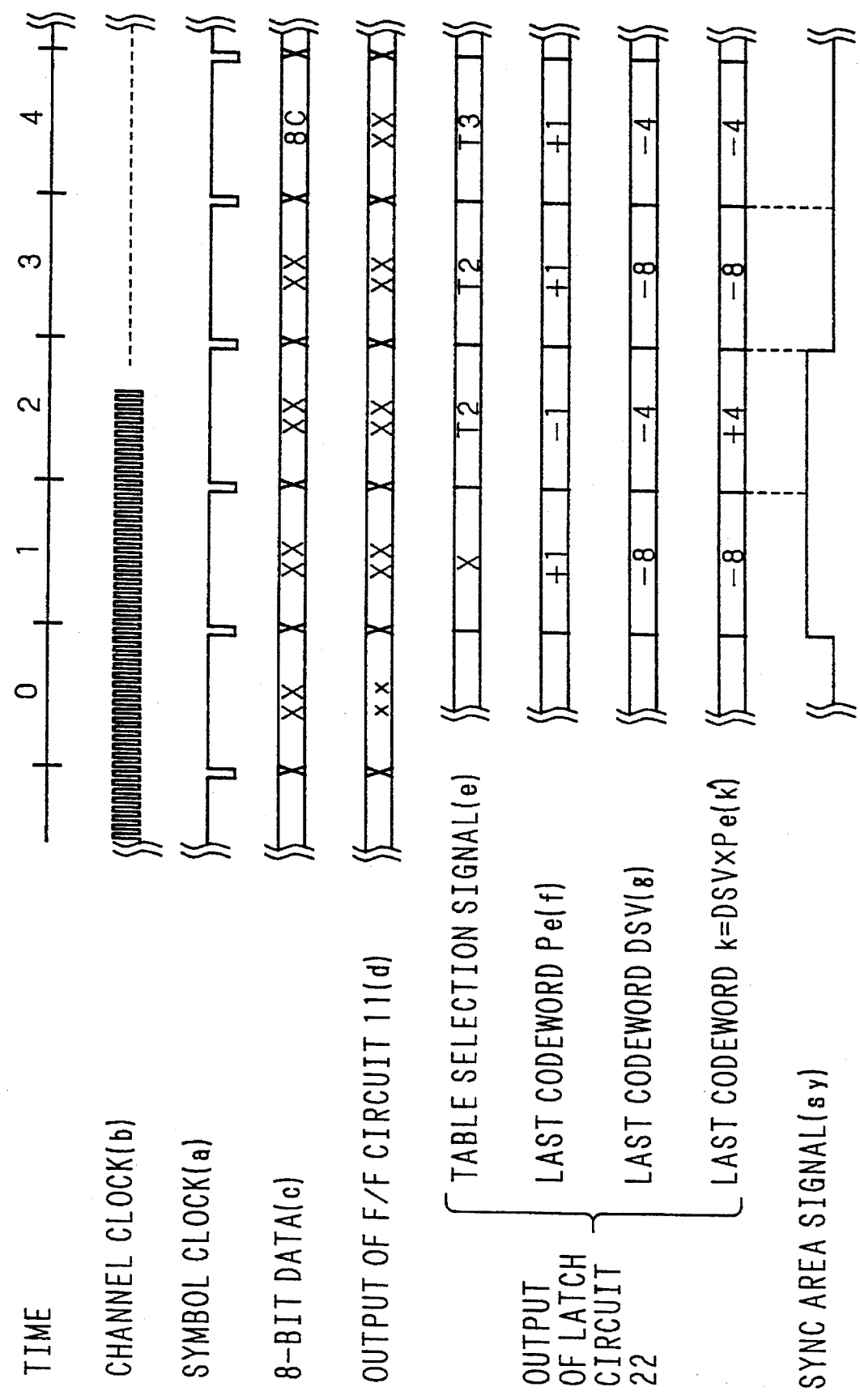
FIG. 69 is a timing chart for explaining in detail the operation of the data conversion apparatus shown in FIG. 66.
Figure 70:
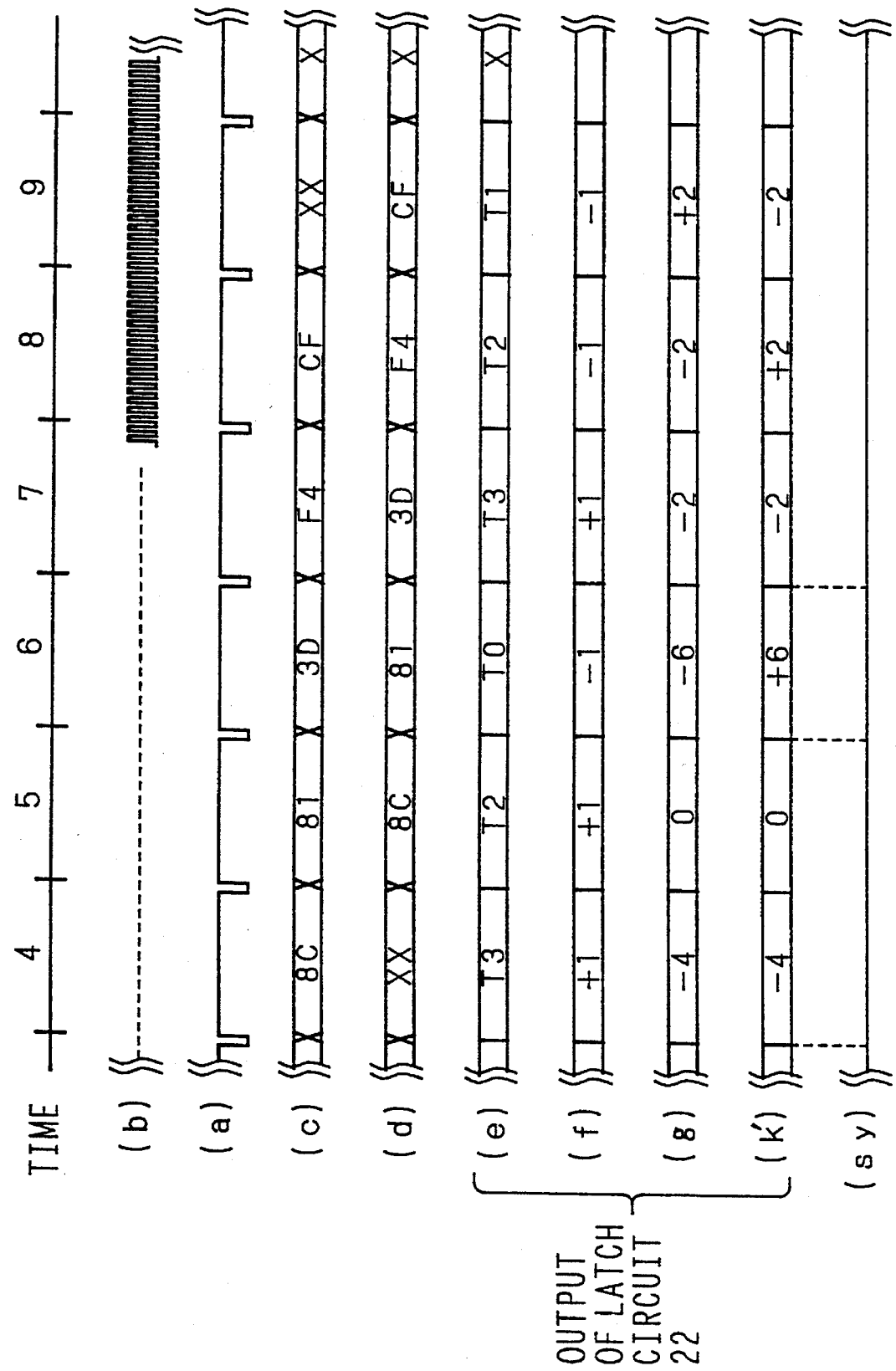
FIG. 70 is a timing chart for explaining in detail the operation of the data conversion apparatus shown in FIG. 66.
Figure 71:
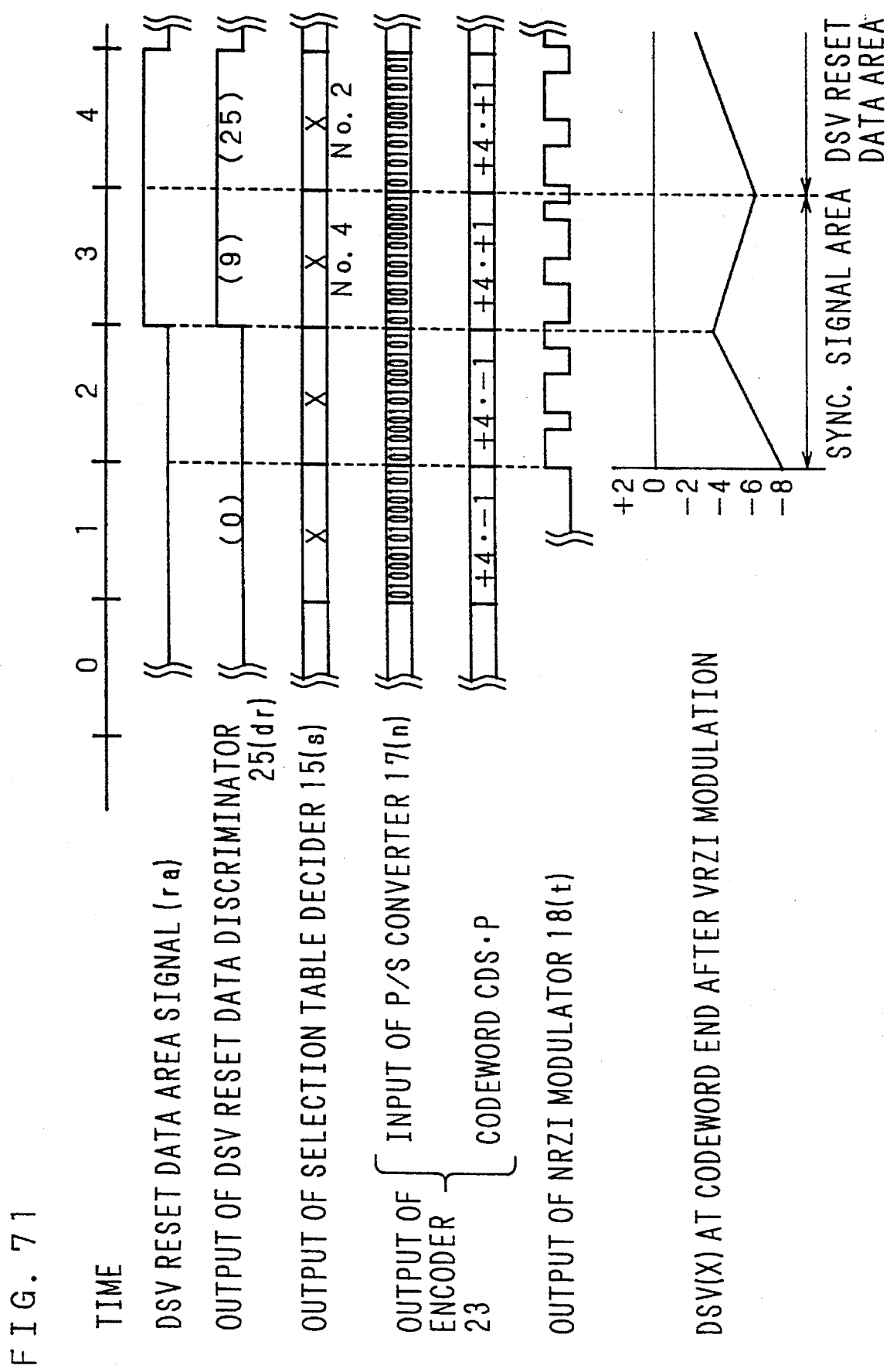
FIG. 71 is a timing chart for explaining in detail the operation of the data conversion apparatus shown in FIG. 66.
Figure 72:
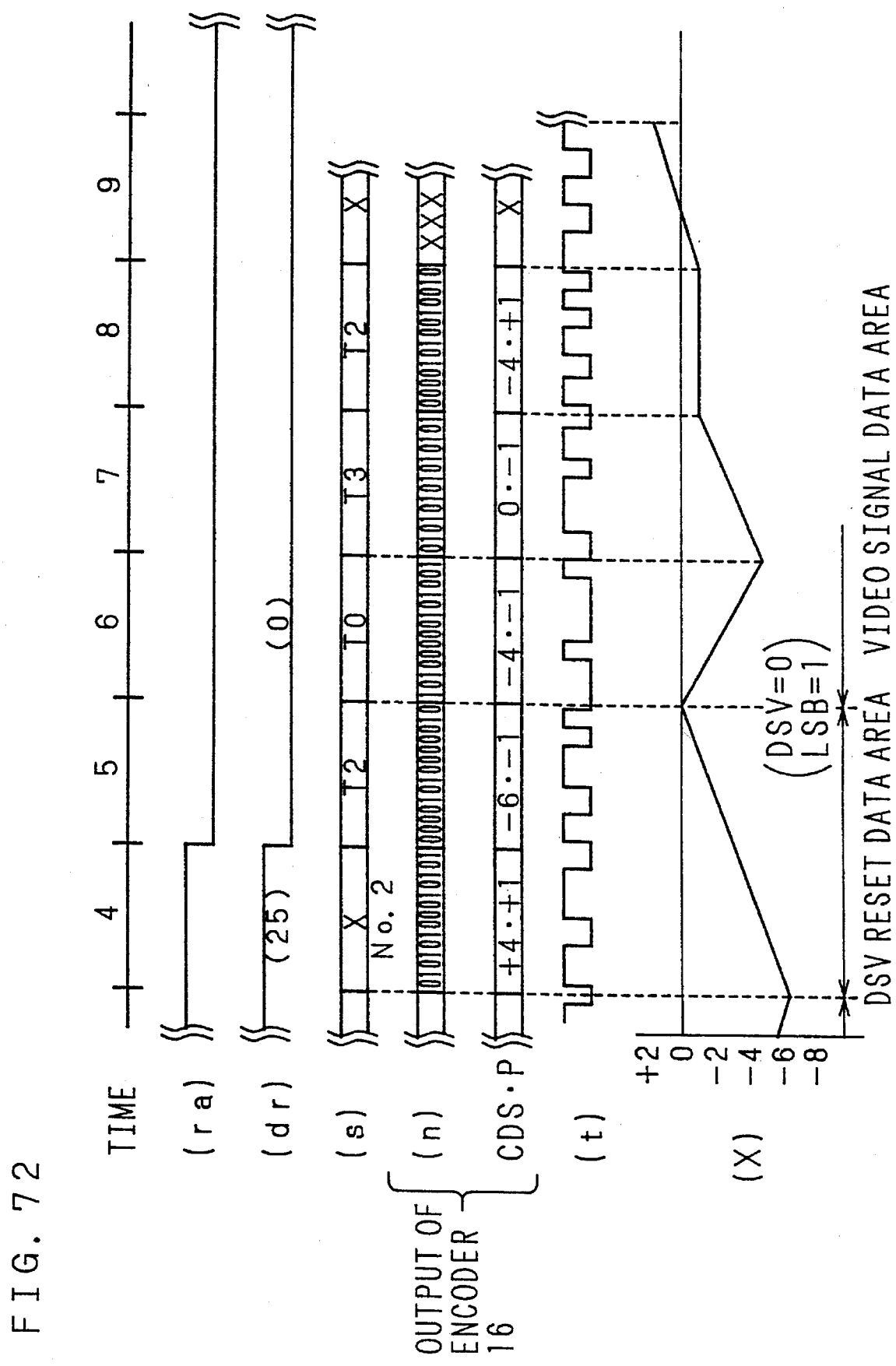
FIG. 72 is a timing chart for explaining in detail the operation of the data conversion apparatus shown in FIG. 66.

FIG. 68 is a diagram showing an example of a circuit configuration for the DSV reset data discriminator 25. The DSV reset data discriminator 25 includes: an area signal generator 251 that generates at its output an area signal indicating the two-symbol DSV reset data area succeeding the synchronizing signal on the basis of the symbol clock (a) and sync. signal area signal (sy); and a DSV reset data generating signal producer 252 that, produces a signal indicating the output of a codeword for resetting the DSV at the end of the synchronizing-signal indicating codeword to "0" on the basis of the value of k at the end of the immediately-preceding codeword supplied from the latch circuit 22, the area signal from the area signal generator 251, and the symbol clock (a), and supplies the signal to the encoder 23.

Generally, a synchronizing signal appended at the beginning of a block is used to separate one codeword group from another, and is required to have high reliability. Therefore, a codeword that cannot occur in a codeword sequence converted from 8-bit data is used as the codeword to indicate the synchronizing signal, and at the time of reproduction, this codeword is detected as the reproduction synchronizing signal to be used as the reference to which the reproduction operation is performed. In Embodiment 6, a codeword "01000101000101" with CDS=+4 and P=−1, which is not used in any of the conversion tables in FIGS. 41 to 55 as a codeword corresponding to 8-bit data, is used as the codeword to indicate the synchronizing signal. This codeword satisfies the codeword "0" run length condition whether the LSB of the immediately-preceding codeword is "0" or 1; when two words are used in sequence, the DSV and Pe values at the end of the codeword immediately preceding the synchronizing signal are retained also at the end of the second word in the synchronizing signal. Furthermore, the DSV at the end of the codeword immediately preceding the synchronizing signal is smaller in absolute value terms than the predetermined value n=8 for DSV control in data conversion described in Embodiment 3, since the succeeding codeword is the synchronizing signal, not an NG codeword.

FIGS. 69 to 72 are timing diagrams for explaining in further detail the operation of the circuits described with reference to FIGS. 66, 67, and 68. In the figures, the signs (a) to (g), (k'), (sy), etc. correspond to the points indicated by the same signs in the input/output sections of the circuits shown in FIGS. 66 to 68.

The operation of each circuit will be described in detail below. The 8-bit data (c) from an error-correction encoding circuit is inputted to the flip-flop circuit 11 as well as to the subcode selection determiner 14. The flip-flop circuit 11 delays the input 8-bit data (c) by one dataword by using the symbol clock (a), and supplies the delayed data (d) as a parallel signal to the dummy code discriminator 12 as well as to the encoder 23. The dummy code discriminator 12 accepts at its inputs the 8-bit data (d) from the flip-flop circuit 11 and the table selection signal (e) from the latch circuit 13, and converts the 8-bit data (d) into a dummy codeword in accordance with the table selection signal (e). The dummy code discriminator 12 also receives the DSV (g) and Pe signal (f) at the end of the immediately-preceding codeword from the latch circuit 22, and outputs the DSV (i) and Pe signal (h) at the end of the dummy codeword. Furthermore, in the dummy code discriminator 12, the conversion table for the conversion of the next dummy codeword is determined on the basis of the DSV (i) and Pe signal (h) at the end of the dummy codeword as well as the LSB of the dummy codeword, and a signal (l) indicating whether the conversion table T3 is to be used for the next dummy codeword is outputted. The DSV (i) and Pe signal (h) at the end of the dummy codeword and the signal (l) indicating the table selected for the next dummy codeword, which are outputted from the dummy code discriminator 12, are supplied to the subcode selection determiner 14.

The subcode selection determiner 14 determines whether to use or not to use the subcode for the conversion of the current dataword on the basis of the 8-bit data input (c) and the outputs of the dummy code discriminator 12, i.e. the DSV (i) and Pe signal (h) at the end of the dummy codeword and the signal (l) indicating whether the conversion table T3 is to be used for the next dummy codeword. The subcode selection determiner 14 then outputs a signal (r) which is, for example, high when the subcode is to be used, and low when the main code is to be used. The output (r) of the subcode selection determiner 14 is supplied to the selection table decider 15. Along with the output (r) of the subcode selection determiner 14, the same table selection signal (e) as used to determine the dummy codeword is inputted to the selection table decider 15, which then decides which conversion table is to be used for the conversion of the current dataword, and supplies a 3-bit signal (s) indicating the decided selection table to the encoder 23. Based on the signal (s) from the selection table decider 15 indicating the decided selection table, the encoder 23 selects the conversion table to be used from among the conversion tables shown in FIGS. 41 to 55, and converts the 8-bit data (d) fed from the flip-flop circuit 11 into a 14-bit codeword which is outputted. The 14-bit codeword is inputted to the parallel-serial converter 17. This 14-bit codeword (n) is loaded into the parallel-serial converter 17 during a low level period of the symbol clock (a), and is outputted as a serial codeword sequence, with MSB as the leading bit, from the parallel-serial converter 17 in synchronism with the channel clock (b). The codeword sequence outputted from the parallel-serial converter 17 is fed into the NRZI modulator 18 where it is transformed into a signal with its polarity being reversed at every appearance of a "1". The operation here is the same as the conversion operation described in Embodiment 3.

With the above sequence of operations, the 8-bit data (dataword) has been converted into a 14-bit codeword. Next, the sync. area signal (sy) and the output of the DSV reset data discriminator 25 are inputted to the encoder 23, and the DSV at the end of the current codeword and the Pe signal indicating the state at the end of it are obtained, to determine the conversion table to be used for the conversion of the next dataword. This operation will be described below.

Outside the sync. signal area and DSV reset data area, the encoder 23 performs the above-described encoding operation to convert the 8-bit data (d) fed from the flip-flop circuit 11 into a 14-bit codeword, and outputs the 14-bit codeword along with the associated CDS information and the P signal indicating the state at the end of the codeword. In FIGS. 69 to 72, suppose, for example that the synchronizing signal area is indicated by a high level period of the sync. area signal (sy); then, during the high level period of the sync. area signal, the encoder 23 outputs the synchronizing signal codeword "01000101000101" along with its associated CDS information and P signal, regardless of the 8-bit data (d) and the output of the DSV reset data discriminator 25 being applied during that period. Also, when DSV reset data is inputted in the DSV reset data area, the encoder 23 outputs a 14-bit codeword for resetting the DSV along with its associated CDS information and P signal, regardless of the 8-bit data (d) and the sync. area signal (sy). Next, the CDS information is fed to the DSV calculator 19, and the P signal to the Pe determiner 20. Also, the LSB of the codeword outputted from the encoder 23 is inputted to the table determiner 24. Using the DSV (g) and Pe signal (f) at the end of the immediately-preceding codeword supplied from the latch circuit 22 and the CDS information associated with the current codeword, the DSV calculator 19 calculates the DSV at the end of the codeword, and supplies the result (u) to the table determiner 24 and the latch circuit 22. Based on the Pe signal (f) at the end of the immediately preceding codeword supplied from the latch circuit 22 and the P signal of the current codeword supplied from the encoder 23, the Pe determiner 20 determines the Pe signal indicating the state at the end of the codeword, and supplies the result (v) to the table determiner 24 and the latch circuit 22.

In the table determiner 24, the DSV (u) and Pe signal (v) at the end of the current codeword supplied from the DSV calculator 19 and Pe determiner 20, respectively, are inputted to the k calculator 241, which then calculates the k=DSV×Pe at the end of the codeword and supplies the calculated value (k) to the table discriminator 242 and the latch circuit 22. Based on the value of k (k) from the k calculator 241 and the LSB of the codeword, the table discriminator 242 discriminates the conversion table to be used for the next data conversion, and supplies the result (w) to the latch circuit 22. More specifically, the conversion table to be used is determined on the basis of the polarity of k at the end of the codeword and the LSB of the codeword: when the codeword LSB is "0" and k≧0, the conversion table T0 is selected; when the LSB is "0" and k<0, the conversion table T1 is selected; when the LSB is "1" and k≧0, the conversion table T2 is selected; and when the LSB is "1" and k<0, the conversion table T3 is selected for the next data conversion. The DSV (u) and Pe signal (v) of the codeword, the table selection signal (w), and the value of k (k) at the end of the codeword, which are input to the latch circuit 22, are delayed by one symbol period by using the symbol clock (a) and used as the information for the next data conversion. Of this information, the value of k (k') at the end of the codeword outputted from the latch circuit 22 is fed to the DSV reset data discriminator 25.

Next, the operation in the DSV reset data discriminator 25 will be described. The DSV reset data discriminator 25 is constructed as shown in FIG. 68, in which the area signal generator 251 generates a signal (ra) indicating the DSV reset data area from the sync area signal (sy) and symbol clock (a), and supplies the generated signal to the DSV reset data generating signal producer 252. Using the symbol clock (a) and the area signal (ra) supplied from the area signal generator 251, the DSV reset data generating signal producer 252 produces a signal (dr), during the area indicated by the area signal (ra), for generating the DSV reset data based on the value of k (k') at the end of the immediately-preceding codeword supplied from the latch circuit 22, and applies this signal to the encoder 23.

Figure 73:
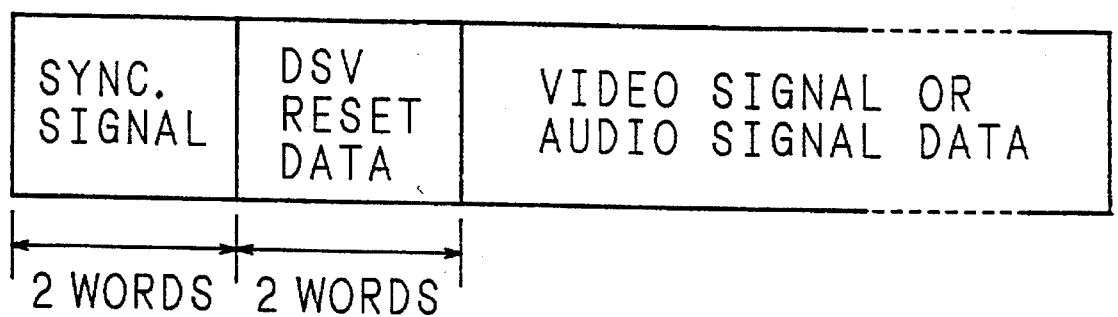
FIG. 73 is a diagram showing an example of a block format of a codeword sequence in the data conversion apparatus of Embodiment 6.

As shown in FIG. 73, the DSV reset data consists of two words appended immediately following the synchronizing signal area, the codeword sequence being such that the DSV at the end of the synchronizing signal codeword is reset to "0". The DSV at the end of the synchronizing signal codeword is not larger in absolute value terms than the predetermined value n=8 for DSV control in data conversion as previously described, that is, DSV=0, ±2, ±4, ±6, ±8. To reset the DSV to 0, the two-word DSV reset data is selected from among the data shown in FIG. 74, for example, so that the DSV at the end of the codeword constructed from the two-word DSV reset data is 0. Any codeword indicated by the data shown in FIG. 74, whether it is connected to the synchronizing signal codeword (LSB is 1) or connected each other, satisfies the codeword "0" run length condition.

When data as shown in FIG. 75 is selected as the two-word data for resetting the DSV to 0, from among the data shown in FIG. 74 according to the value of k at the end of the synchronizing signal codeword, the DSV at the codeword end of the DSV reset data can be made equal to 0. More specifically, in FIGS. 69 to 72, if the output (ra) of the area signal generator 251 is high during the two-word period after the synchronizing signal area at times 3 and 4, and the value of k (k') at the end of the synchronizing signal codeword fed from the latch circuit 22 is −8, then the DSV reset data generating signal producer 252, in synchronism with the symbol clock (a), outputs at time 3 a signal of five bits, for example, "01001" ("9" in decimal number), indicating the output of No. 4 code in FIG. 74, as the data for k'=−8 in FIG. 75, and at time 4 for the second word, a signal "11001" ("25" in decimal number) indicating the output of No. 2 code in FIG. 74. Outside the DSV reset data area, the output of the DSV reset data generating signal producer 252 is "00000". With the signal (dr) fed from the DSV reset data generating signal producer 252, the encoder 23 outputs a codeword "01001001000001" at time 3 and a codeword "01001001000001" at time 4, and the DSV at the codeword end becomes 0, as shown by (x) in FIGS. 71 and 72.

As described above, every input 8-bit data is converted by the encoder 23 into a 14-bit codeword on the basis of the DSV and Pe signal at the end of the immediately preceding codeword as well as the kind of the next codeword and the DSV at the end of it, and in data conversion, each synchronizing signal is followed by a data area for resetting the DSV value at the end of the synchronizing signal codeword to 0; as a result, the change range of the DSV is held within a finite value, i.e. ±12 at codeword end and ±14 within a codeword sequence, and a DC-free codeword can thus be obtained.

Embodiment 7

We will now describe a method of reproduction signal decoding wherein an n-bit codeword is reverse-converted into the original m-bit dataword for reproduction in a recording and reproduction apparatus employing the above-described data conversion method of Embodiment 6.

Figure 76:
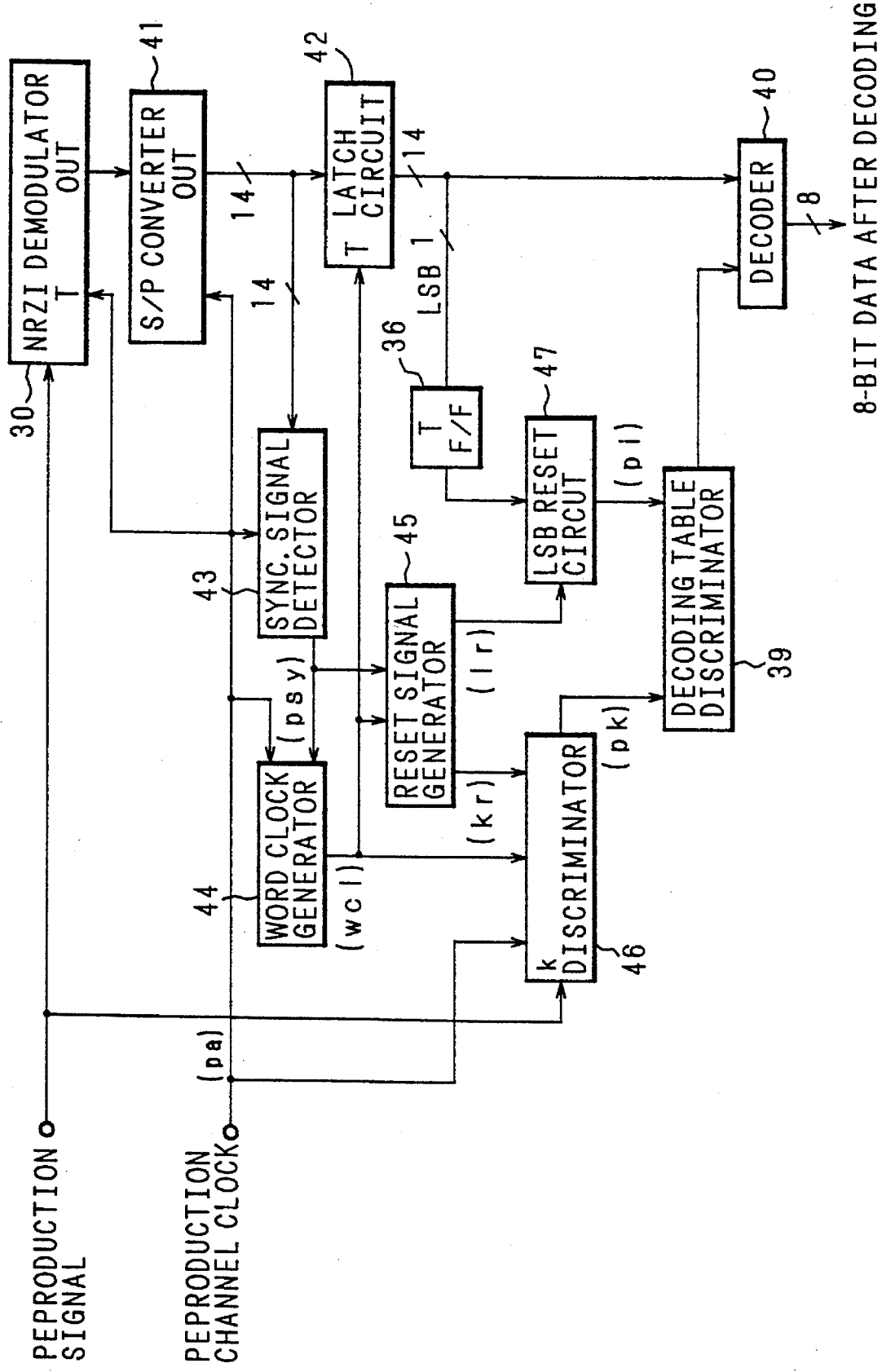
FIG. 76 is a diagram showing the configuration of a decoding system in a recording and reproduction apparatus of Embodiment 7 in which the data conversion method of Embodiment 6 is employed.

FIG. 76 is a block diagram showing an example of an apparatus for decoding codewords that were encoded by the data conversion method of Embodiment 6. In FIG. 76, the parts indicated at 30, 36, 39, and 40 are identical to the corresponding parts in the apparatus of Embodiment 5 shown in FIG. 65. The numeral 41 designates a serial-parallel converter by which an NRZI-demodulated serial reproduction signal outputted from the NRZI demodulator 30 is converted to a parallel signal. The converted parallel signal is fed to a latch circuit 42 and a sync. signal detector 43. The latch circuit 42 latches the parallel signal fed from the serial-parallel converter 41. The sync. signal detector 43 detects a synchronizing signal in the parallel signal fed from the serial-parallel converter 41, and supplies the reproduction synchronizing signal to a word clock generator 44 and a reset signal generator 45. Using the synchronizing signal from the sync. signal detector 43 and a reproduction channel clock (pa), the word clock generator 44 generates a reproduction word clock, and the parallel signal from the serial-parallel converter 41 is latched into the latch circuit 42 by the reproduction word clock.

Using the synchronizing signal from the sync signal detector 43 and the reproduction word clock from the word clock generator 44, the reset. signal generator 45 discriminates the DSV reset data area described in Embodiment 6, generates a reset signal indicating the resetting of the DSV at the end of that area to 0 and also a signal for resetting the LSB of the codeword in the DSV reset data area to 1, and supplies the respective signals to a k discriminator 46 and an LSB reset circuit 47. Using the reproduction channel clock, the reproduction word clock and the reset signal from the reset signal generator 45, the k discriminator 46 counts the DSV during the reproduction of the reproduction signal being transmitted in synchronism with the reproduction channel clock, discriminates the DSV and Pe at the end of the codeword to determine k=DSV×Pe for reproduction, and latches the signal indicating the polarity of k by the reproduction word clock, and the signal is then supplied to the decoding table discriminator 39 to provide the decoding condition for the next codeword to be decoded. As the signal indicating the polarity of k, a "1" is outputted for k≧0, and a "0" is outputted for k<0, for example. The LSB reset circuit, 47 resets the LSB of the codeword in accordance with the signal supplied from the reset signal generator 45.

Figure 77:
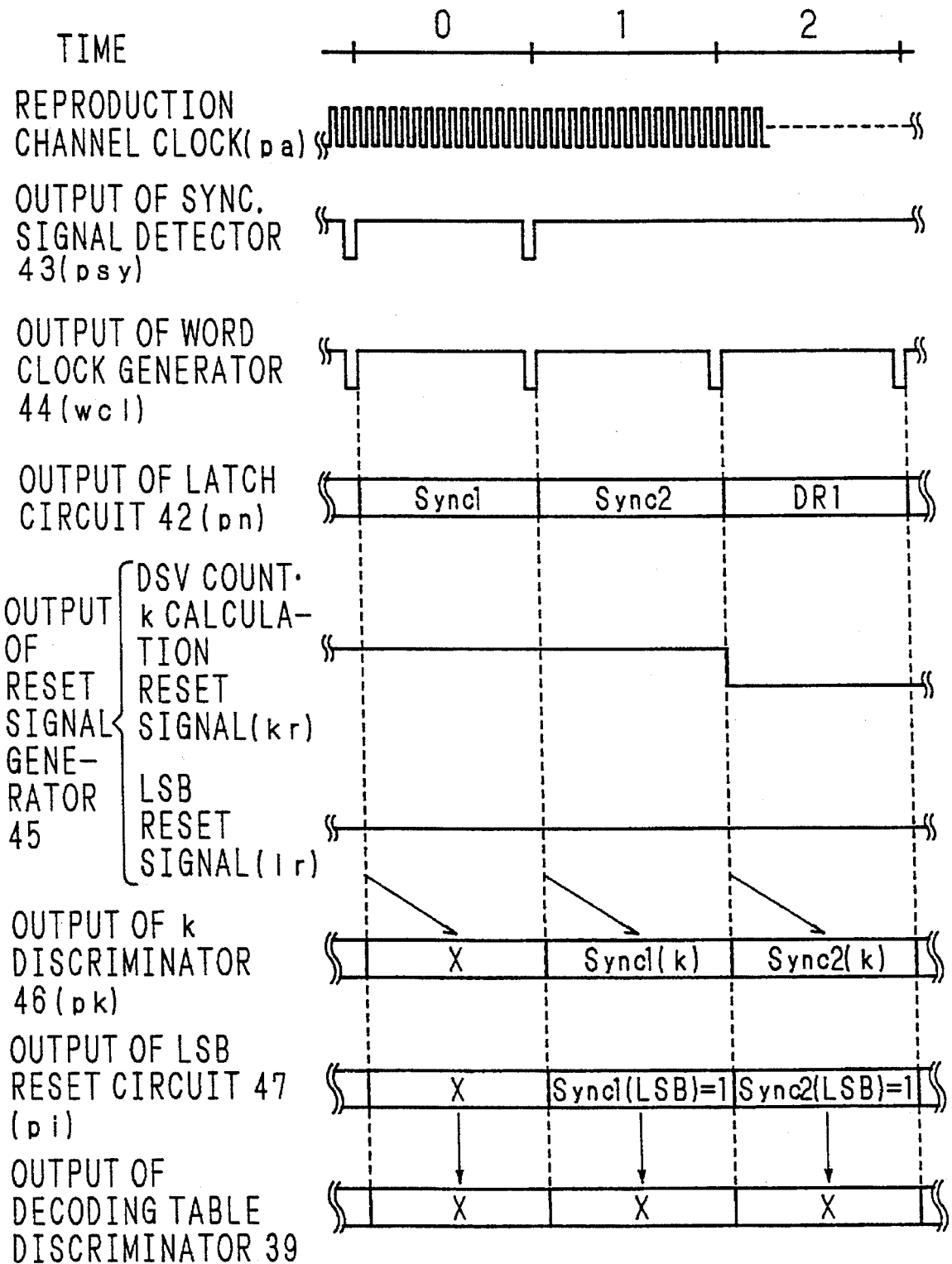
FIG. 77 is a timing chart for explaining in detail the operation of the recording and reproduction apparatus shown in FIG. 76.
Figure 78:
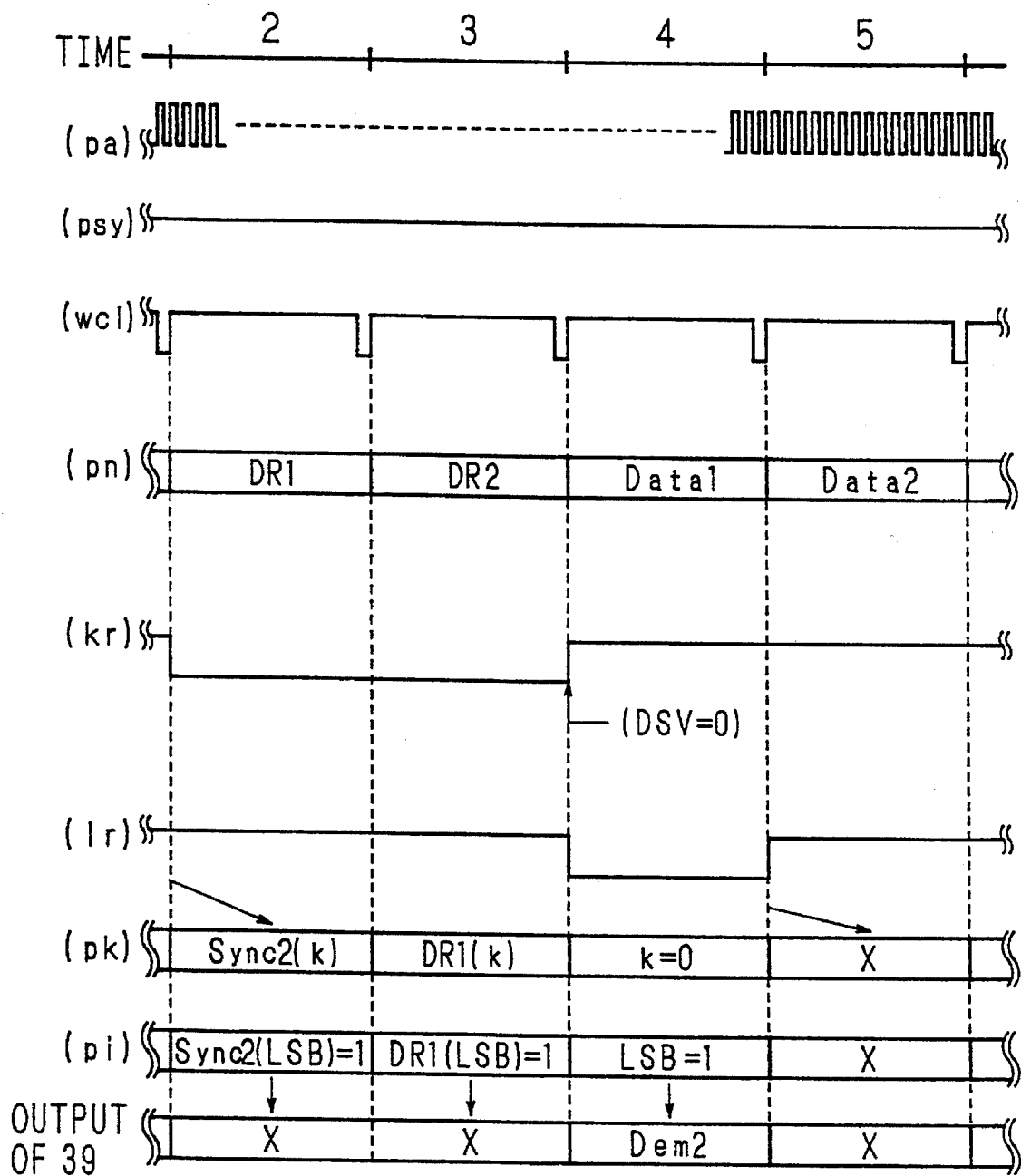
FIG. 78 is a timing chart for explaining in detail the operation of the recording and reproduction apparatus shown in FIG. 76.

FIGS. 77 and 78 are timing diagrams for explaining in further detail the operation of the circuit described with reference to FIG. 76. In the figures, the signs (pa), (psy), (wcl), etc. correspond to the points indicated by the same signs in the input/output sections of the circuits shown in FIG. 76.

The circuit operation will be described in detail below. The 14-bit parallel signal outputted from the serial-parallel converter 41 is fed to the latch circuit 42 and also to the sync signal detector 43. The sync. signal detector 43 detects a codeword indicating the synchronizing signal in the reproduction signal, and outputs the synchronizing signal (psy) shown in FIGS. 77 and 78. The word clock generator 44 generates the reproduction word clock (wcl) by using the synchronizing signal from the sync. signal detector 43 and the reproduction channel clock (pa). The latch circuit 42 latches the parallel signal inputted from the serial-parallel converter 41 by the reproduction word clock fed from the word clock generator 44, and supplies the word-synchronized reproduced 14-bit codeword (pn) to the decoder 40, while the LSB of the codeword is fed to the flip-flop circuit 36 where it is delayed by one word before it is transferred to the LSB reset circuit 47.

Based on the synchronizing signal (psy) from the sync. signal detector 43 and the reproduction word clock (wcl) from the word clock generator 44, the reset signal generator 45 generates a signal (kr) indicating the DSV reset data area, which is the two-word area immediately succeeding the synchronizing signal as described in Embodiment 6, wherein the signal (kr) is, for example, low within the area and fed to the k discriminator 46; the reset signal generator 45 also generates a signal (lr) indicating the last one word of the DSV reset data area and supplies it to the LSB reset circuit 47. Using the reproduction channel clock the reproduction word clock, and the reset signal from the reset signal generator 45, the k discriminator 46 counts the DSV during the reproduction of the reproduction signal being transmitted in synchronism with the reproduction channel clock, discriminates the DSV and Pe at the end of the codeword to determine k=DSV×Pe for reproduction, and latches the signal indicating the polarity of k by the reproduction word clock, and then outputs the signal to provide the decoding condition for the next codeword to be decoded. At this time, the counting of DSV and the calculation of k are performed by resetting the DSV to 0 (k to 0) at the rising edge of the DSV reset data area indicating signal (kr) being outputted from the reset, signal generator 45, i.e., at the end of the codeword corresponding to the DSV reset data. The signal indicating the polarity of k at the end of the immediately preceding codeword, discriminated by the k discriminator 46, is fed to the decoding table discriminator 39.

With the signal (lr) indicating the last one word of the DSV reset data area fed from the reset signal generator 45, the LSB reset circuit, 47 resets the LSB of the codeword in that area to "1" before outputting it, while for other areas, the inputted LSB is outputted without resetting. This is because the LSB of all the codewords shown in FIG. 74 for the DSV reset data area is "1". The output of the LSB reset circuit 47 is supplied to the decoding table discriminator 39. The decoding table discriminator 39 discriminates the decoding table for the current codeword to be decoded on the basis of the signal supplied from the k discriminator 46 and the LSB of the immediately-preceding codeword supplied from the LSB reset, circuit 47, and supplies the result to the decoder 40. At this time, a signal "00" indicating the same decoding table as used in the first decoder 33 in Embodiment 4 is supplied to the decoder 40 when the LSB of the immediately-preceding codeword is "0"; a signal "01" indicating the same decoding table as used in the second decoder 34 in Embodiment 4 is supplied when the LSB of the immediately-preceding codeword is "1" and $k \geq 0$; and a signal "11" indicating the same decoding table as used in the third decoder 35 in Embodiment 4 is supplied when the LSB of the immediately preceding codeword is "1" and $k<0$.

The 2-bit control signal outputted from the decoding table discriminator 39 and the 14-bit codeword are inputted to the decoder 40 for decoding: when the control signal bits are "00", the 14-bit codeword is decoded into an 8-bit dataword by using the same conversion table as used in the first decoder 33 in Embodiment 4 in FIG. 64; when the control signal bits are "01", the 14-bit codeword is decoded into an 8-bit dataword by using the same conversion table as used in the second decoder 34; and when the control signal bits are "11", the 14-bit codeword is decoded into an 8-bit dataword by using the same conversion table as used in the third decoder 35.

As described, according to the above decoding method of reverse-converting and decoding reproduced 14-bit codewords into 8-bit datawords in a recording and reproduction apparatus employing the data conversion method of Embodiment 6, the polarity of k is obtained from the DSV and Pe at the end of the immediately preceding codeword in the reproduction signal, and the value of k is reset to 0 in the DSV reset data area placed after the sync signal area, while at the same time, resetting the codeword LSB in the same area. Thus, in the above decoding method, the appropriate conversion table is selected according to the polarity of k and the LSB of the immediately preceding codeword; furthermore, if there occur errors in the reproduction signal, resulting in erroneous DSV counting during reproduction, the DSV at the end of the DSV reset data area can be reset to 0 so that, the correct DSV counting can be performed.

Embodiment 8

In the above-described decoding method of Embodiment 7, the discriminating signal created from the signal from the k discriminator and the LSB of the immediately preceding codeword is inputted to the decoder along with the codeword to be decoded, and n bits of codeword with discriminating signal bits are decoded into m bits of dataword. It will be recognized, however, that the method of selecting the conversion table according to the condition is not limited to the above-illustrated one. For example, as shown in FIG. 79, three kinds of decoders, the first, second and third decoders, using different conversion tables may be provided, and switching may be performed between decoded datawords, using selectors, according to the discriminating conditions of the polarity of k and the LSB at the end of the immediately preceding codeword; with this configuration also, the same effect as achieved in Embodiment 7 can be obtained.

Figure 79:
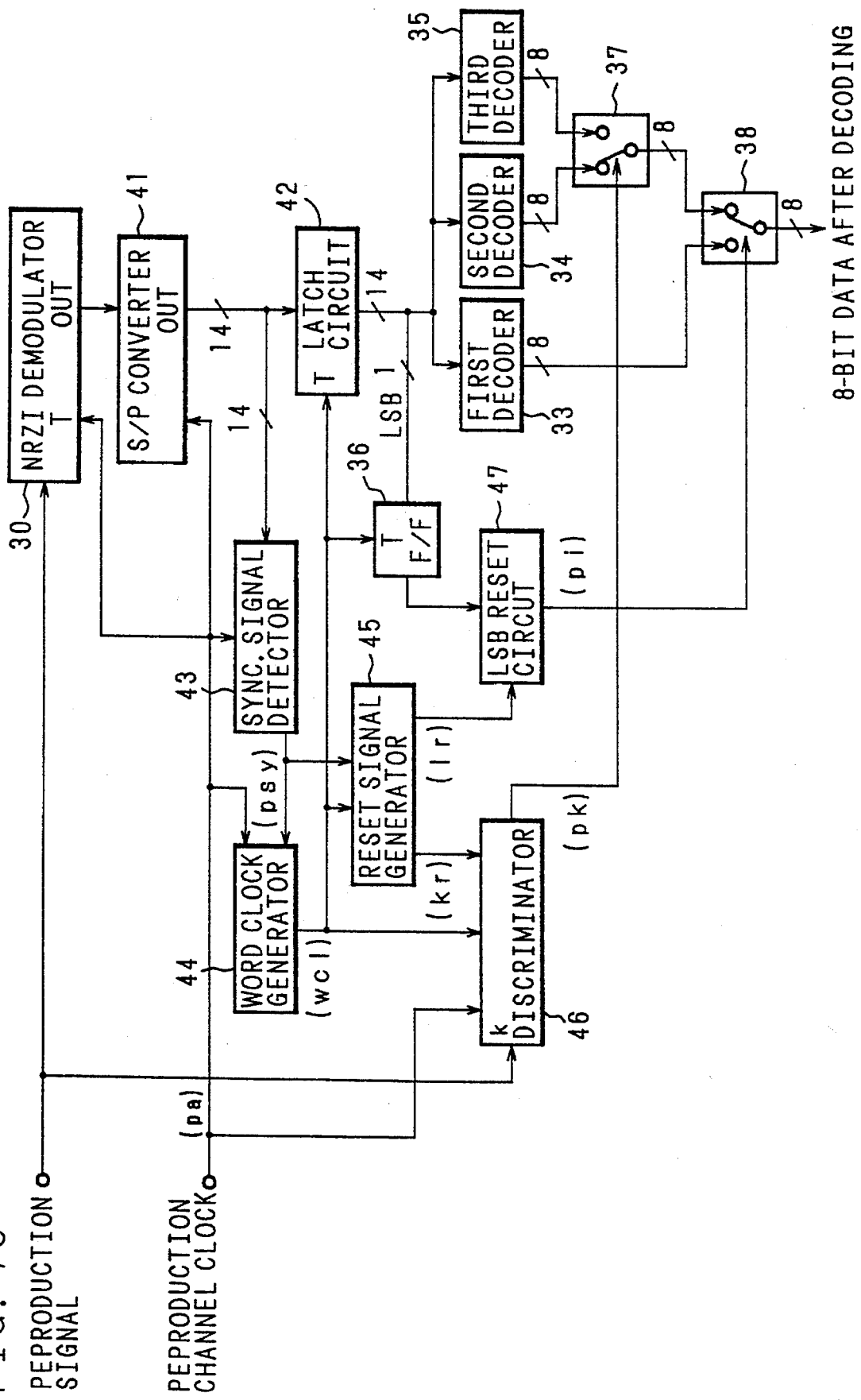
FIG. 79 is a diagram showing the configuration of a decoding system in a recording and reproduction apparatus of Embodiment 8 in which the data conversion method of Embodiment 6 is employed.

In FIG. 79, the parts indicated at 30, and 33 to 38 are identical to the corresponding parts in the apparatus of Embodiment 4 shown in FIG. 64, and the parts indicated at 41 to 47 are identical to the corresponding parts in the apparatus of Embodiment 7 shown in FIG. 76.

The operation of Embodiment 8 will be described below. The 14-bit parallel signal outputted from the serial-parallel converter 41 is fed to the latch circuit 42 and also to the sync signal detector 43. The sync. signal detector 43 detects a codeword indicating the synchronizing signal in the reproduction signal, and outputs a synchronizing signal (psy). The word clock generator 44 generates a reproduction word clock (wcl) by using the synchronizing signal from the sync. signal detector 43 and the reproduction channel clock (pa). The latch circuit 42 latches the inputted parallel signal from the serial-parallel converter 41 by the reproduction word clock fed from the word clock generator 44, and outputs a word-synchronized 14-bit codeword which is transferred to the first decoder 33, the second decoder 34 and the third decoder 35, while the LSB of the codeword is fed to the flip-flop circuit 36 where it is delayed by one word before it is transferred to the LSB reset circuit 47.

Based on the synchronizing signal (psy) from the sync. signal detector 43 and the reproduction word clock (wcl) from the word clock generator 44, the reset, signal generator 45 generates a signal (kr) indicating the DSV reset data area, which is the two-word area immediately succeeding the synchronizing signal, then feeding the signal (kr) to the k discriminator 46, and also generates a signal (lr) indicating the last one word of the DSV reset data area and supplies it to the LSB reset circuit 47. Using the reproduction channel clock, the reproduction word clock and the reset signal from the reset signal generator 45, the k discriminator 46 counts the DSV during the reproduction of the reproduction signal being transmitted in synchronism with the reproduction channel clock, discriminates the DSV and Pe at the end of the codeword to determine $k=DSV \times Pe$ for reproduction, and latches a signal indicating the polarity of k by the reproduction word clock, and then outputs the signal to provide the decoding condition for the next, codeword to be decoded. At this time, the counting of DSV and the calculation of k are performed by resetting the DSV to 0 (k to 0) at the rising edge of the DSV reset data area indicating signal (kr) being outputted from the reset, signal generator 45, i.e., at the end of the codeword corresponding to the DSV reset data. The signal indicating the polarity of k at the end of the immediately-preceding codeword, discriminated by the k discriminator 46, is applied to the selector 37.

With the signal (lr) indicating the last one word of the DSV reset data area supplied from the reset signal generator 45, the LSB reset circuit 47 resets the LSB of the codeword in that area to "1" before outputting it, while for other areas, the input LSB is outputted without resetting. The output of the LSB reset circuit 47 is applied to the selector 38.

Using the signal indicating the polarity of k at the end of the last, decoded signal supplied from the k discriminator 46 as the selection signal, the selector 37 selects the 8-bit data decoded by the second decoder 34 when $k \geq 0$, or the 8-bit data decoded by the third decoder 35 when $k<0$, and supplies the selected data to the selector 38. Using the LSB of the last decoded codeword supplied from the LSB reset circuit 47 as the selection signal, the selector 38 selects the 8-bit data outputted from the first decoder 33 when the LSB of the immediately-preceding codeword is "0", or the 8-bit data selected by the selector 37 when the LSB "1", and outputs the selected data as the decoded 8-bit data. Thus, the selector 38 outputs the decoded 8-bit data (dataword), and the same effect as achieved in Embodiment 7 can be obtained.

Embodiment 9

Figure 80:
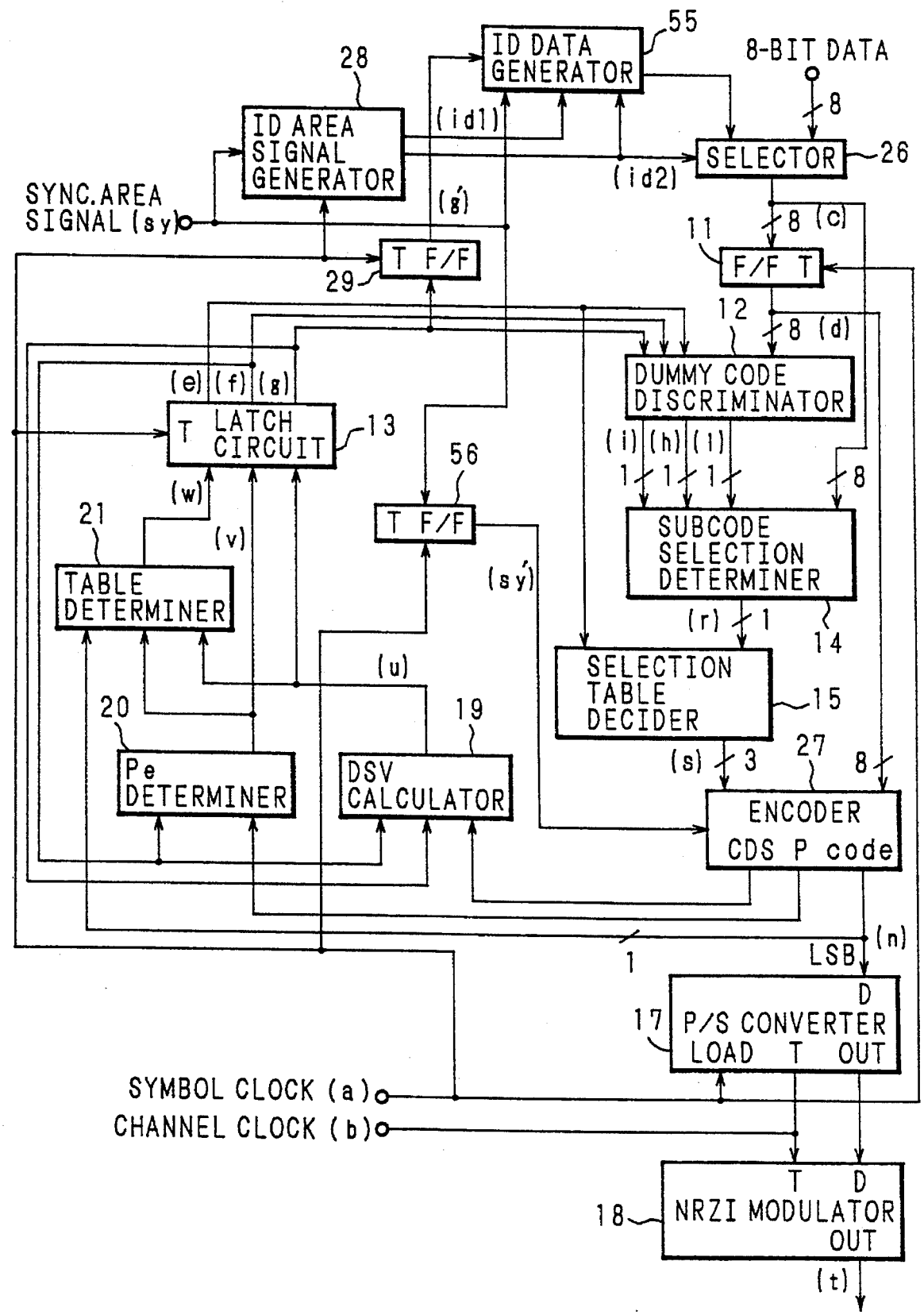
FIG. 80 is a diagram showing the configuration of another data conversion apparatus (Embodiment 9) for implementing the data conversion method of Embodiment 3.

FIG. 80 is a diagram showing an example of a circuit configuration for an apparatus for implementing the data conversion method of Embodiment 3. In FIG. 80, the parts indicated at 11 to 15 and 17 to 20 are identical to the corresponding parts in the apparatus of Embodiment 3 shown in FIG. 57. The numeral 26 indicates a selector. The numeral 27 is an encoder which contains therein the data conversion tables shown in FIGS. 41 to 55 and a codeword indicating a synchronizing signal. Based on the signal from the selection table decider 15 and a sync. area signal indicating a synchronizing signal area, the encoder 27 selects the data conversion table and the synchronizing signal, and encodes the 8-bit data (d) outputted from the flip-flop circuit 11 into a 14-bit codeword for output. The encoder 27 also outputs 3-bit CDS information associated with the output 14-bit codeword and a 1-bit P signal indicating the state at the end of the output codeword ("1" when P=+1, "0" when P=−1); the CDS information is supplied to the DSV calculator 19 and the P signal to the Pe determiner 20. The same codeword as used to indicate the synchronizing signal in Embodiment 6 is used as the codeword for the synchronizing signal; that is, a codeword "01000101000101" with CDS= +4 and P=−1, which is not used in any of the conversion tables as a codeword corresponding to 8-bit data, is used. This codeword satisfies the codeword "0" run length condition whether the LSB of the immediately-preceding codeword is "0" or "1"; when two words are used in sequence, the DSV and Pe values at the end of the codeword immediately preceding the synchronizing signal are retained also at the end of the second word in the synchronizing signal. Furthermore, the DSV at the end of the codeword immediately preceding the synchronizing signal is not larger in absolute value terms than the predetermined value n=8 for DSV control in data conversion described in Embodiment 3, since the succeeding codeword is the synchronizing signal, not an NG codeword.

Figure 81:
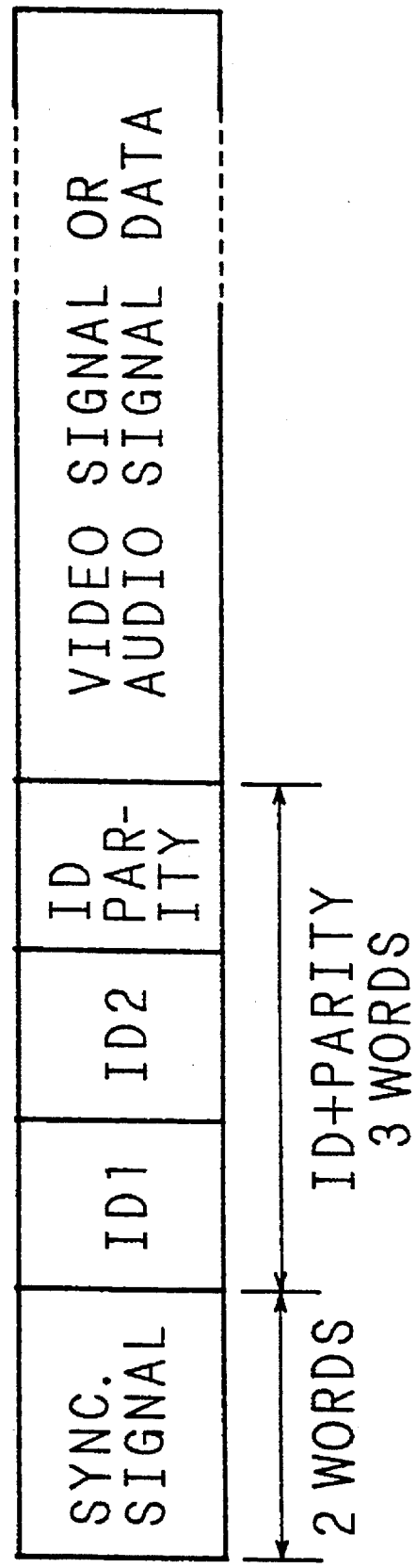
FIG. 81 is a diagram showing an example of a block format of a codeword sequence in the data conversion apparatus of Embodiment 9.

Using the symbol clock (a), an ID area signal generator 28 generates an ID area signal indicating an ID codeword area from the sync. area signal (sy) indicating the synchronizing signal area, and supplies it to the select, or 26 and also to an ID data generator 55. The ID codeword is data indicating recording signal channel, segment and other information for special-mode reproduction. In Embodiment 9, one-word data as ID1 indicating the DSV at the end of the synchronizing signal, one-word data as ID2 indicating the recording signal channel, segment number, etc., and a parity signal for the ID data are appended in this order in the block, as shown in FIG. 81. A flip-flop circuit 29 delays the DSV (g) fed from the latch circuit 13 by one dataword by using the symbol clock (a), and supplies the delayed DSV (g') to the ID data generator 55. Based on the ID area signal from the ID area signal generator 28 and the sync. area signal, the ID data generator 55 generates the ID1 codeword data indicating the value of the DSV fed from the flip-flop circuit 29, the ID2 codeword data indicating the channel, segment and other information, and the ID parity signal, and supplies these data to the selector 26. These ID data are selected by the selector 26 using the ID area signal applied from the ID area signal generator 28, and are appended to the input 8-bit data. A flip-flop circuit 56 delays the sync. area signal by one symbol before transferring it to the encoder 27.

FIG. 82 is a diagram showing an example of the ID1 codeword data that the ID data generator 55 generates from the DSV supplied from the flip-flop circuit 29. The ID1 data is generated, as shown, according to the DSV at the end of the synchronizing signal, i.e., the DSV at the end of the immediately-preceding block.

Figure 83:
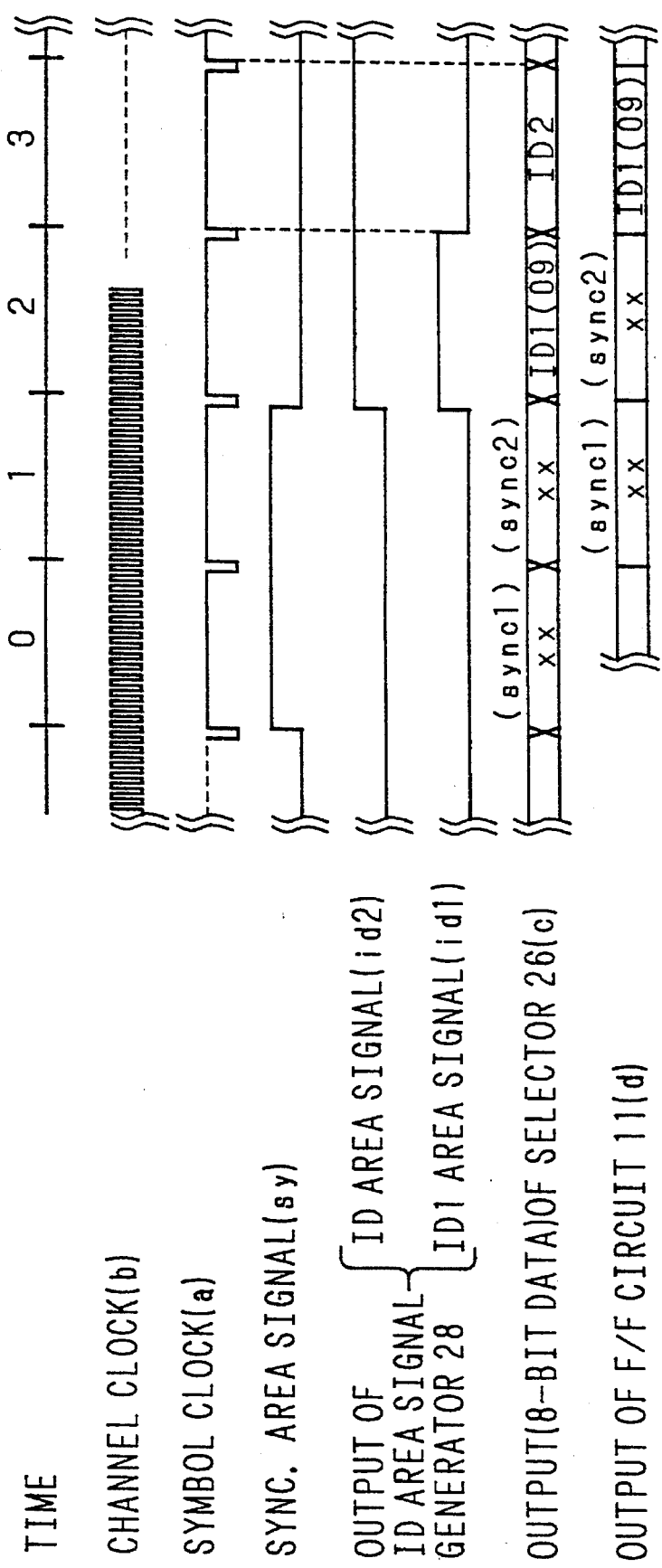
FIG. 83 is a timing chart for explaining in detail the operation of the data conversion apparatus shown in FIG. 80.
Figure 84:
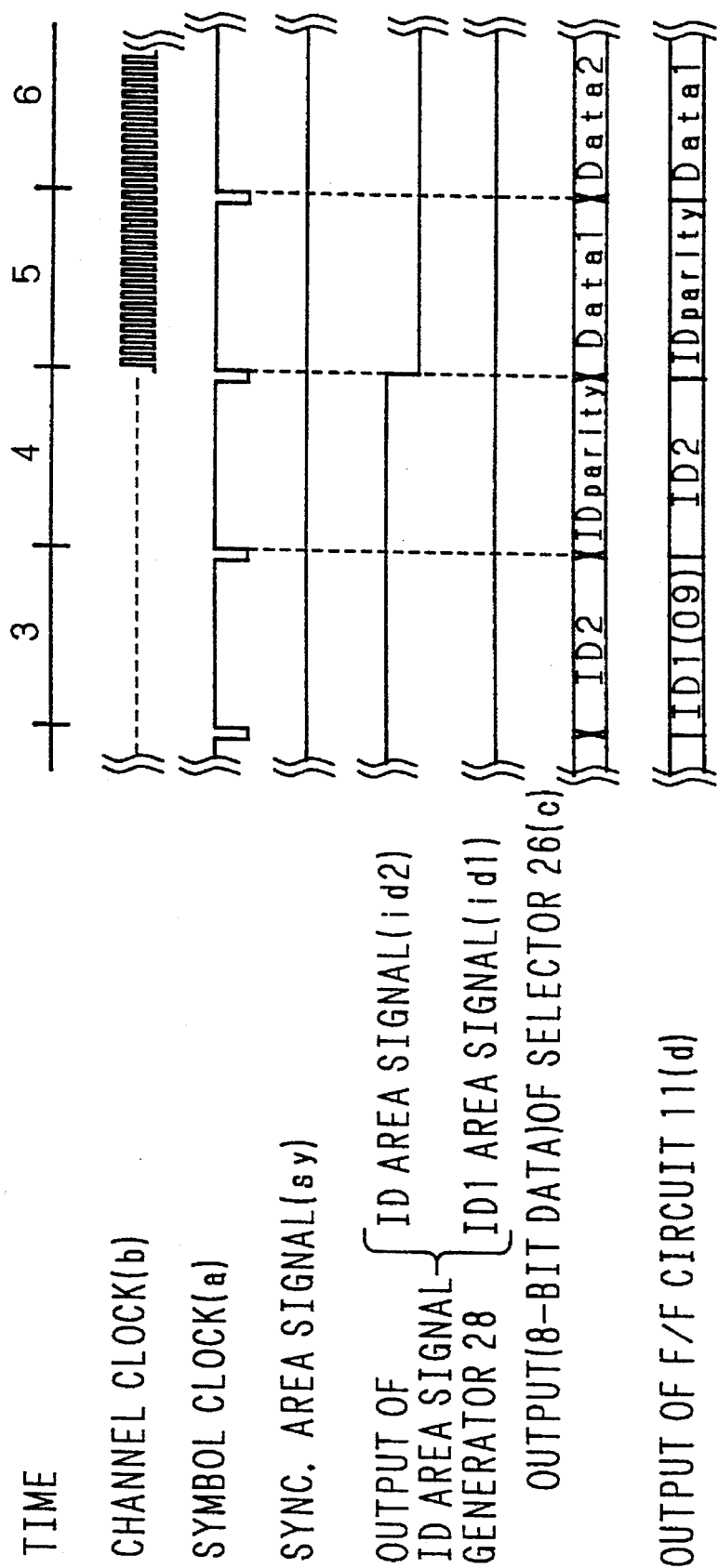
FIG. 84 is a timing chart for explaining in detail the operation of the data conversion apparatus shown in FIG. 80.
Figure 85:
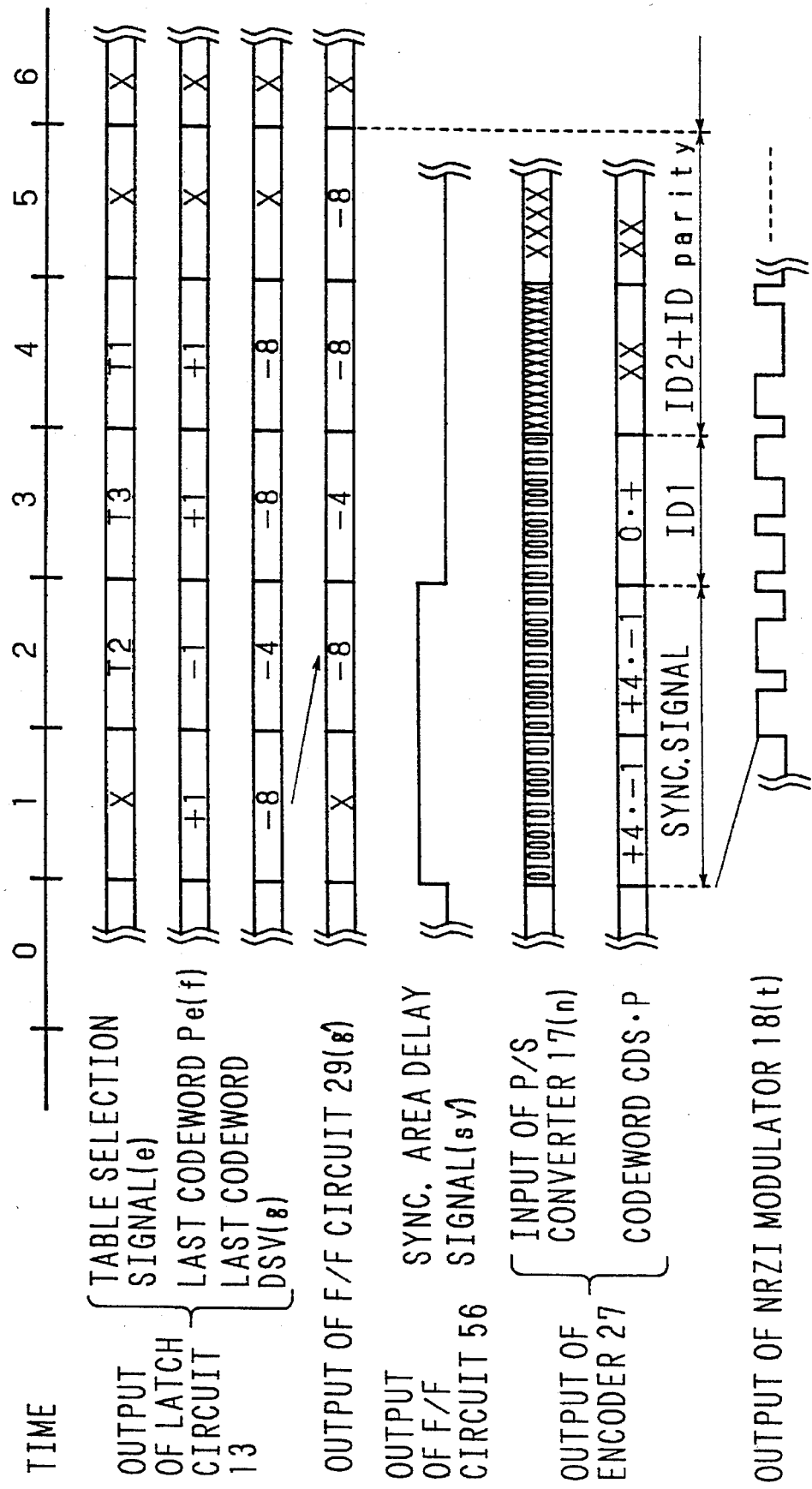
FIG. 85 is a timing chart for explaining in detail the operation of the data conversion apparatus shown in FIG. 80.

FIGS. 83 to 85 are timing diagrams for explaining in further detail the operation of the circuit described with reference to FIG. 80. In the figures, the signs (a) to (g), (g'), (sy), etc. correspond to the points indicated by the same signs in the input/output sections of the circuits shown in FIG. 80.

The circuit operation will be described in detail below. The sync. area signal (sy) is applied to the ID area signal generator 28 which, based on the symbol clock (a), generates and outputs an ID area signal (id2) indicating the three-symbol ID area succeeding the synchronizing signal, and an ID1 area signal (id1) indicating the ID1 area. In FIGS. 83 and 84, each of the area signals is high to indicate its associated area, and remains low outside that area. The flip-flop circuit 29 produces an output by delaying the DSV (g) fed from the latch circuit 13 by one symbol; in the ID1 area at time 2 in FIGS. 83 to 85, the output (g') indicates the DSV at the end of the codeword immediately preceding the synchronizing signal, i.e., the DSV at the end of the immediately preceding block. The ID data generator 55 generates and outputs the ID codeword data and parity signal, based on the ID area signal (id2) and ID1 area signal (id1) from the ID area signal generator 28 and the sync. area signal (sy); when the ID1 area signal (id1) indicating the ID1 area is high, the ID data generator 55 generates the ID1 data shown in FIG. 82 in accordance with the signal (g') indicating the DSV at the end of the immediately-preceding block supplied from the flip-flop circuit 29. In FIG. 85, since the output (g') of the flip-flop circuit 29 is "−8", "09" is outputted as the ID1 data. The ID data outputted from the ID data generator 55 is applied to the selector 26 where it is appended to the 8-bit data from the error-correction encoding circuit in accordance with the ID area signal (id2) supplied from the ID area signal generator 28. The 8-bit data (c) with the ID data appended thereto outputted from the selector 26 is supplied to the flip-flop circuit 11 as well as to the subcode selection determiner 14. The flip-flop circuit 11 delays the 8-bit data (c) by one dataword by using the symbol clock (a), and transfers the delayed data (d) to the dummy code discriminator 12 and the encoder 27.

The encoding operation thereafter is the same as described in Embodiment 3 shown in FIG. 57: The 8-bit data (d) from the flip-flop circuit 11 and the table selection signal (e) from the latch circuit 13 are inputted to the dummy code discriminator 12 which then converts the 8-bit data (d) to a dummy codeword in accordance with the table selection signal (e). The dummy code discriminator 12 is also supplied with the DSV (g) and Pe signal (f) at the end of the immediately-preceding codeword from the latch circuit 13, and outputs the DSV (i) and Pe signal (h) at the end of the dummy codeword. Furthermore, based on the DSV (i) at the end of the dummy codeword, the Pe signal (h) at the end of the dummy codeword and the LSB of the dummy codeword, the dummy code discriminator 12 discriminates the conversion table to be used for the conversion of the next dummy codeword, and outputs a signal (l) indicating whether to use or not to use the conversion table T3 for the next dummy codeword. The DSV (i) at the end of the dummy codeword, the Pe signal (h) and the signal (l) indicating the selected table for the next dummy codeword, which are outputted from the dummy code discriminator 12, are supplied to the subcode selection determiner 14.

The subcode selection determiner 14 determines whether to use or not to use the subcode for the conversion of the current dataword on the basis of the 8-bit data input (c) and the outputs of the dummy code discriminator 12, i.e. the DSV (i) and Pe signal (h) at the end of the dummy codeword and the signal (l) indicating whether the conversion table T3 is to be used for the next dummy codeword. The subcode selection determiner 14 then outputs a signal (r) which is, for example, high when the subcode is to be used, and low when the main code is to be used. The output (r) of the subcode selection determiner 14 is supplied to the selection table decider 15. Along with the output (r) of the subcode selection determiner 14, the same table selection signal (e) as used to determine the dummy codeword is inputted to the selection table decider 15, which then decides which conversion table is to be used for the conversion of the current dataword, and supplies a 3-bit signal (s) indicating the decided selection table to the encoder 27. Based on the signal (s) from the selection table decider 15 indicating the decided selection table, the encoder 27 selects the conversion table to be used from among the conversion tables shown in FIGS. 41 to 55, and converts the 8-bit data (d) fed from the flip-flop circuit 11 into a 14-bit codeword which is outputted. At this time, if the sync. area signal (sy') delayed by one symbol through the flip-flop circuit 56 is inputted as a high level signal indicating the synchronizing signal area, then the encoder 27 outputs the synchronizing signal codeword "01000101000101" and its associated CDS information and P signal, regardless of the input 8-bit data (d).

The 14-bit codeword outputted from the encoder 27 is fed into the parallel-serial converter 17. This 14-bit codeword (n) is loaded into the parallel-serial converter 17 during a low level period of the symbol clock (a), and is outputted as a serial codeword sequence, with MSB as the leading bit, from the parallel-serial converter 17 in synchronism with the channel clock (b). The codeword sequence outputted from the parallel-serial converter 17 is fed into the NRZI modulator 18 where it is transformed into a signal with its polarity being reversed at every appearance of a "1".

With the above sequence of operations, the 8-bit data (dataword) has been converted into a 14-bit codeword. Next, the DSV at the end of the current codeword and the Pe signal indicating the state at the end of it are obtained, based on which the conversion table to be used For the conversion of the next data is determined. This operation will be described below.

Outside the synchronizing signal area, the encoder 27 outputs a 14-bit codeword along with the CDS information associated with the codeword and the P signal indicating the state at the end of the codeword; on the other hand, in the synchronizing signal area, the synchronizing signal codeword "01000101000101" and its associated CDS information and P signal are outputted. Next, the CDS information is supplied to the DSV calculator 19, and the P signal to the Pe determiner 20. Also, the LSB of the codeword outputted from the encoder 27 is input, ted to the table determiner 21. Using the DSV (g) and Pe signal (f) at the end of the immediately preceding codeword supplied from the latch circuit 13 and the CDS information associated with the current codeword, the DSV calculator 19 calculates the DSV at the end of the codeword, and supplies the result (u) to the table determiner 21 and the latch circuit. 13. Based on the Pe signal (f) at the end of the immediately-preceding codeword supplied from the latch circuit 13 and the P signal of the current codeword supplied from the encoder 27, the Pe determiner 20 determines the Pe signal indicating the state at the end of the codeword, and supplies the result (v) to the table determiner 21 and the latch circuit 13.

In the table determiner 21, the DSV (u) and Pe signal (v) at the end of the current codeword are inputted from the DSV calculator 19 and Pe determiner 20, respectively, and $k = DSV \times Pe$ at the end of the codeword is calculated. Based on the polarity of this value (k) and the LSB of the codeword, the table determiner 21 determines the conversion table to be used for the next data conversion, and supplies the result (w) to the latch circuit 13. More specifically, the conversion table to be used is determined on the basis of the polarity of k at the end of the codeword and the LSB of the codeword: when the codeword LSB is "0" and $k \geq 0$, the conversion table T0 is selected; when the LSB is "0" and $k < 0$, the conversion table T1 is selected; when the LSB is "1" and $k \geq 0$, the conversion table T2 is selected; and when the LSB is "1" and $k < 0$, the conversion table T3 is selected for the next data conversion. The DSV (u) and Pe signal (v) of the codeword and the table selection signal (w) outputted from the table determiner 21 are fed into the latch circuit 13 where these signals are delayed by one symbol period by using the symbol clock (a), to provide the information for the next data conversion.

As described above, every input 8-bit data is converted by the encoder 27 into a 14-bit codeword on the basis of the DSV and Pe signal at the end of the immediately-preceding codeword as well as the kind of the next codeword and the DSV at the end of it, and in data conversion, data indicating the DSV value at the end of the synchronizing signal codeword is appended in the ID codeword immediately succeeding the synchronizing signal; as a result, the change range of the DSV is held within a finite value, i.e. ±12 at codeword end and ±14 within a codeword sequence, and a DC-free codeword can thus be obtained.

Embodiment 10

We will now describe a method of reproduction signal decoding wherein an n-bit codeword is reverse-converted into the original m-bit dataword for reproduction in a recording and reproduction apparatus employing the above-described data conversion method of Embodiment 9.

Figure 86:
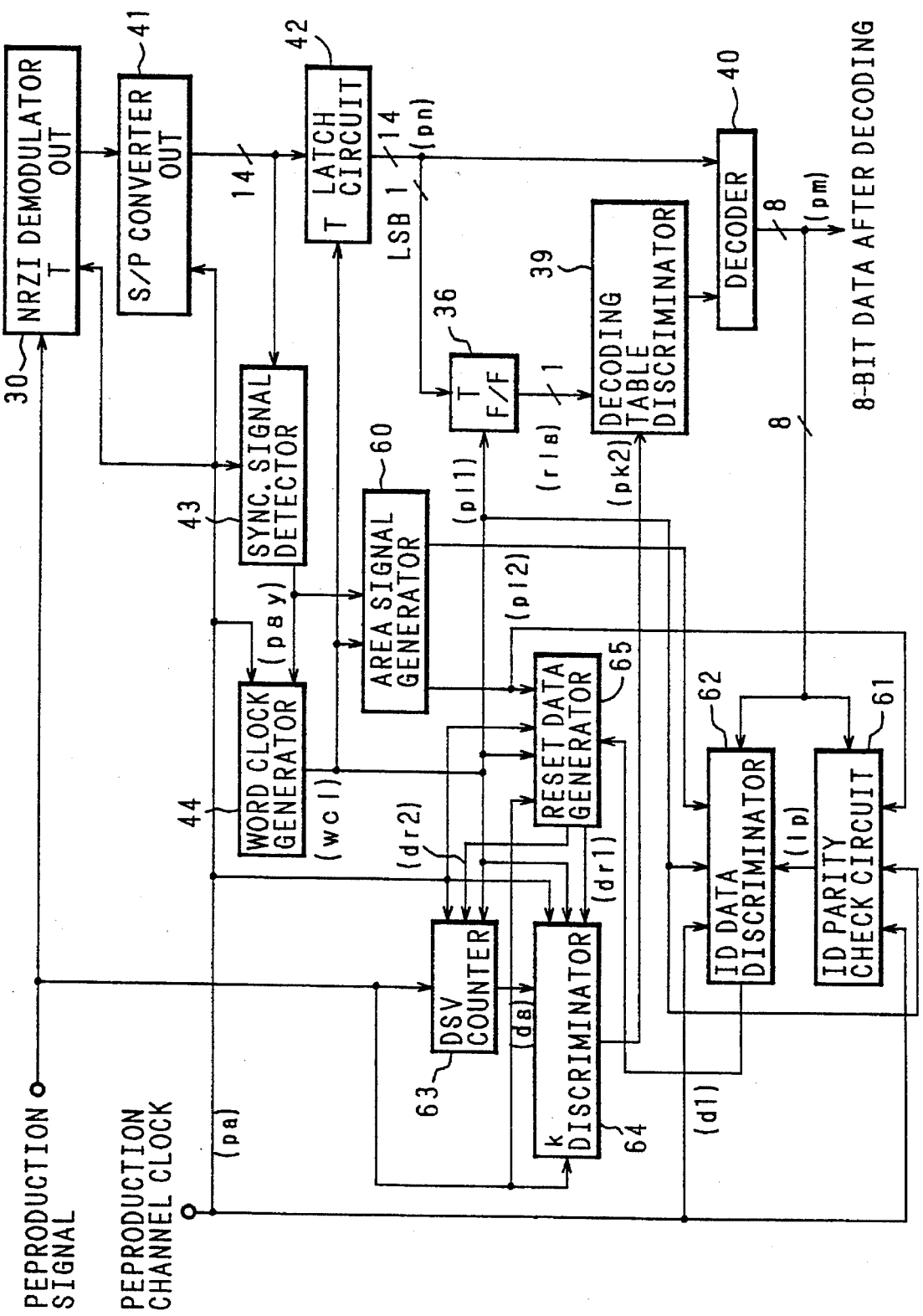
FIG. 86 is a diagram showing the configuration of a decoding system in a recording and reproduction apparatus of Embodiment 10 in which the data conversion method of Embodiment 9 is employed.

FIG. 86 is a diagram showing an example of a circuit configuration for an apparatus for implementing this decoding method. In FIG. 86, the parts indicated at 30, 36, 39, and 40 to 44 are identical to the corresponding parts in the apparatus of Embodiment 7 shown in FIG. 76. The numeral 60 is an area signal generator which, based on the synchronizing signal from the sync signal detector 43 and the reproduction word clock from the word clock generator 44, discriminates the ID codeword area shown in FIG. 81 in Embodiment 9, and generates a signal (pi2) designating that area and a signal (pi1) designating the ID1 codeword area. The signal (pi2) is supplied to an ID parity check circuit 61 and also to a reset data generator 65, and the signal (pi1) is supplied to an ID data discriminator 62. Using the reproduction channel clock, the reproduction word clock and the ID codeword area signal (pi2) from the area signal generator 60, the ID parity check circuit 61 checks the ID parity for the signal in the ID codeword area of the data decoded by the decoder 40, and outputs, for example, a high level signal to the ID data discriminator 62 when the ID data is correct. Using the reproduction channel clock, the reproduction word clock and the ID1 codeword area signal (pi1) from the area signal generator 60, the ID data discriminator 62 holds the ID1 data carried in the signal in the ID codeword area of the data decoded by the decoder 40, and outputs the thus held ID1 area data to the reset data generator 65 when the signal from the ID parity check circuit 61 goes high (when the ID data is correct).

A DSV counter 63 counts the DSV during the reproduction of the reproduction signal being transmitted in synchronism with the reproduction channel clock, and supplies the result of the count to a k discriminator 64. The k discriminator 64 discriminates the state Pe at the end of the codeword and also k=DSV×Pe at the end of the codeword in reproduction on the basis of the DSV supplied from the DSV counter 63, and latches the signal indicating the polarity of k by the reproduction word clock, and then feeds the signal to the decoding table discriminator 39 to provide the decoding condition for the next codeword to be decoded. As the signal indicating the polarity of k, a "1" is outputted for k≧0, and a "0" is outputted for k<0, for example. Using the ID1 data from the ID data discriminator 62, the ID codeword area signal from the area signal generator 60 and the reproduction signal, the reset data generator 65 generates signals for resetting the DSV count in the DSV counter 63 and the value of k in the k discriminator 64 by detecting the DSV at the end of the ID codeword area.

Figure 87:
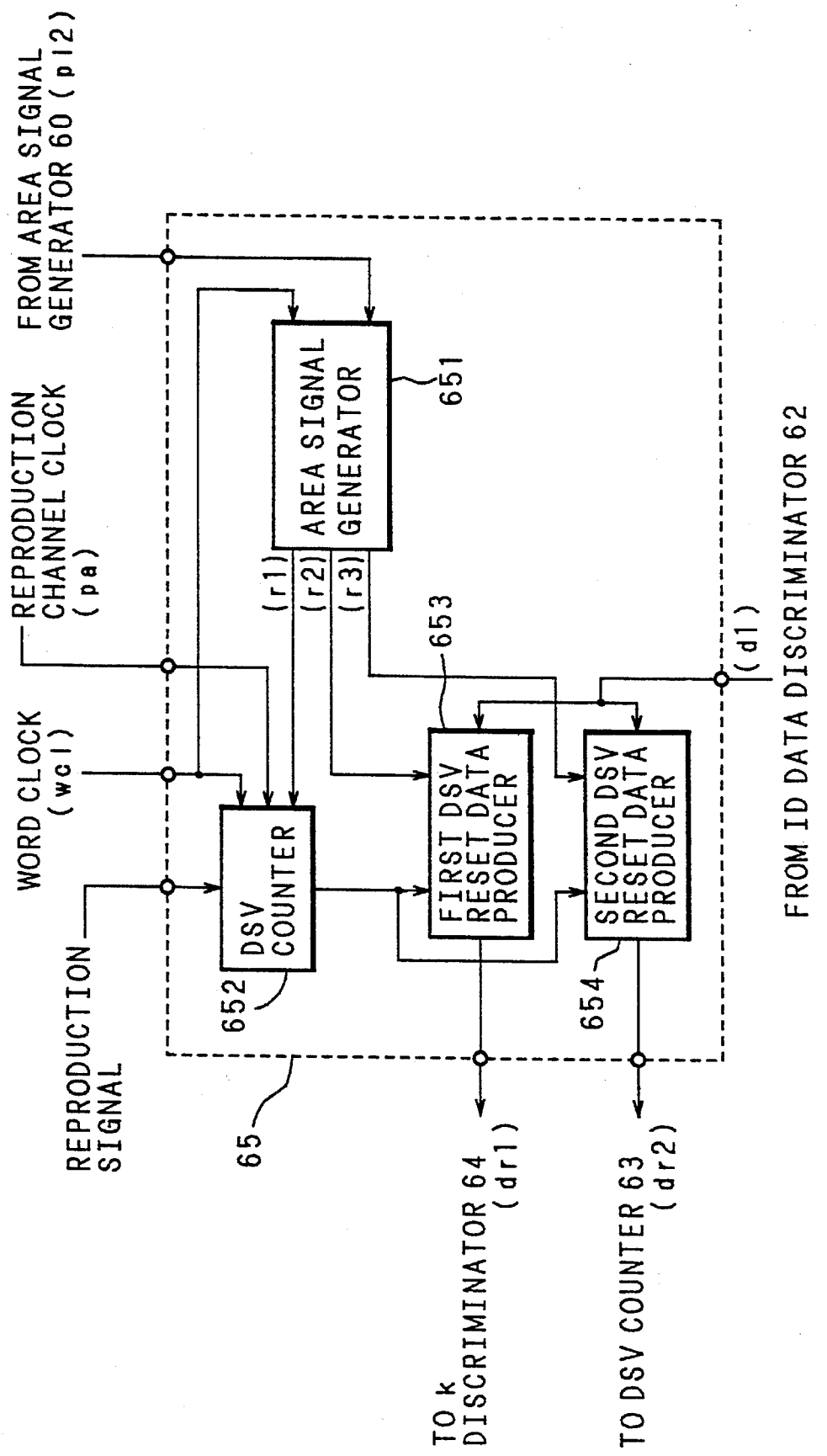
FIG. 87 is a diagram showing the configuration of a reset, data generator in the decoding system of the recording and reproduction apparatus shown in FIG. 86.

FIG. 87 is a diagram showing an example of a circuit configuration for the reset data generator 65. The reset data generator 65 has: an area signal generator 651 which, based on the ID codeword area signal (pi2) from the area signal generator 60 and the reproduction word clock (wcl), generates a signal that is high in the ID codeword area and also in the one-codeword area immediately succeeding the ID codeword area a signal that is high in the one-codeword area immediately succeeding the ID codeword area, and a signal that rises at the end of the codeword immediately succeeding the ID codeword area; a DSV counter 652 that starts counting the DSV from 0 at the start of the ID codeword area and that obtains the DSV over the ID codeword area and the one-codeword area immediately succeeding the ID codeword area; a first DSV reset data producer 653 which obtains the DSV at the end of the ID codeword area from the DSV supplied from the DSV counter 652 and the ID1 data supplied from the ID data discriminator 62, and which supplies the obtained data as DSV reset data to the k discriminator 64; and a second DSV reset data producer 654 which obtains the DSV at the end of the codeword immediately succeeding the ID codeword area from the DSV supplied from the DSV counter 652, the ID1 data supplied from the ID data discriminator 62, and the signal, supplied from the area signal generator 651, that rises at the end of the codeword immediately succeeding the ID codeword area, and which supplies the obtained data as DSV reset data to the DSV counter 63.

Figure 88:
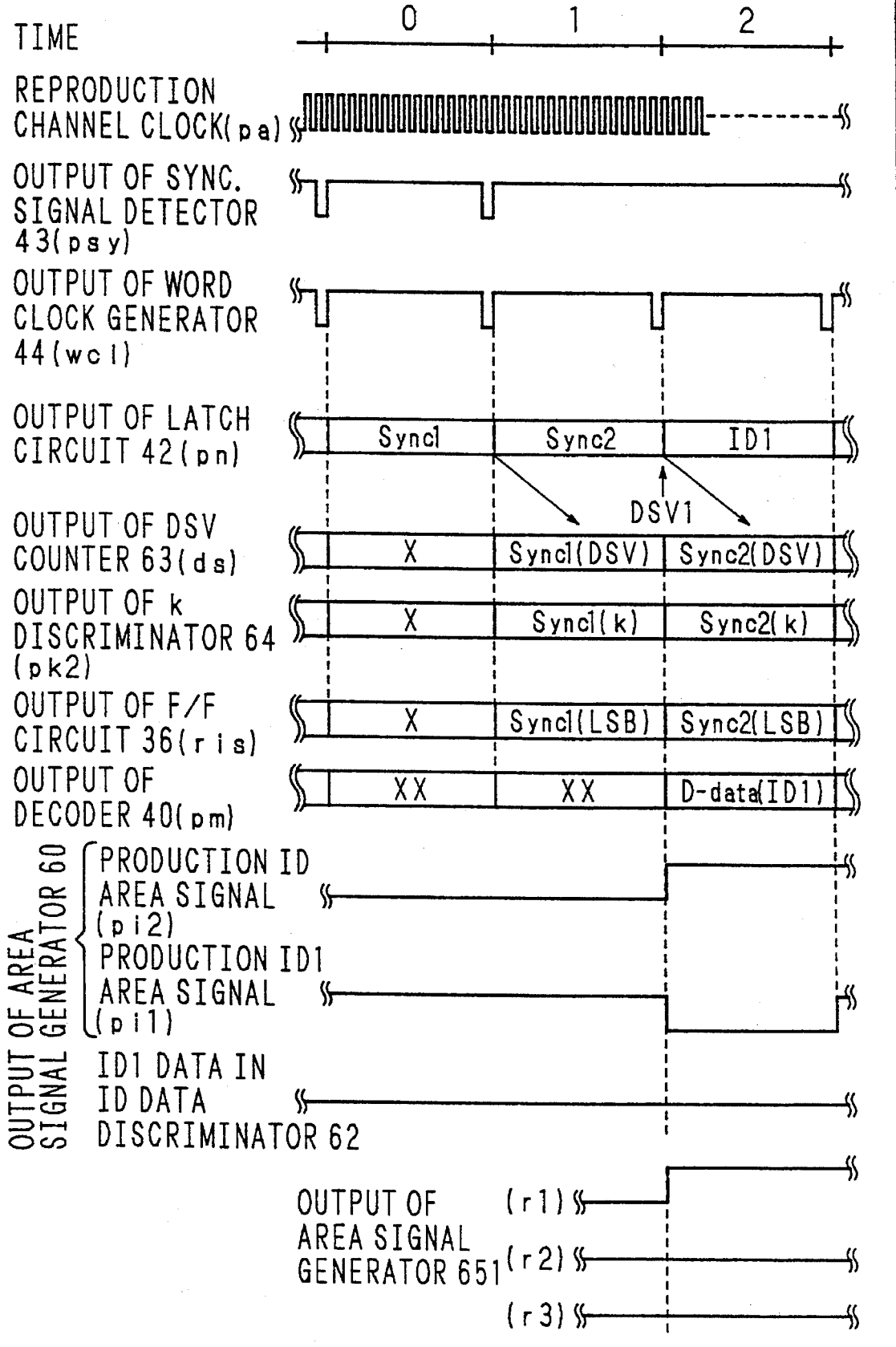
FIG. 88 is a timing chart for explaining in detail the operation of decoding in the decoding system of the recording and reproduction apparatus shown in FIG. 86.
Figure 89:
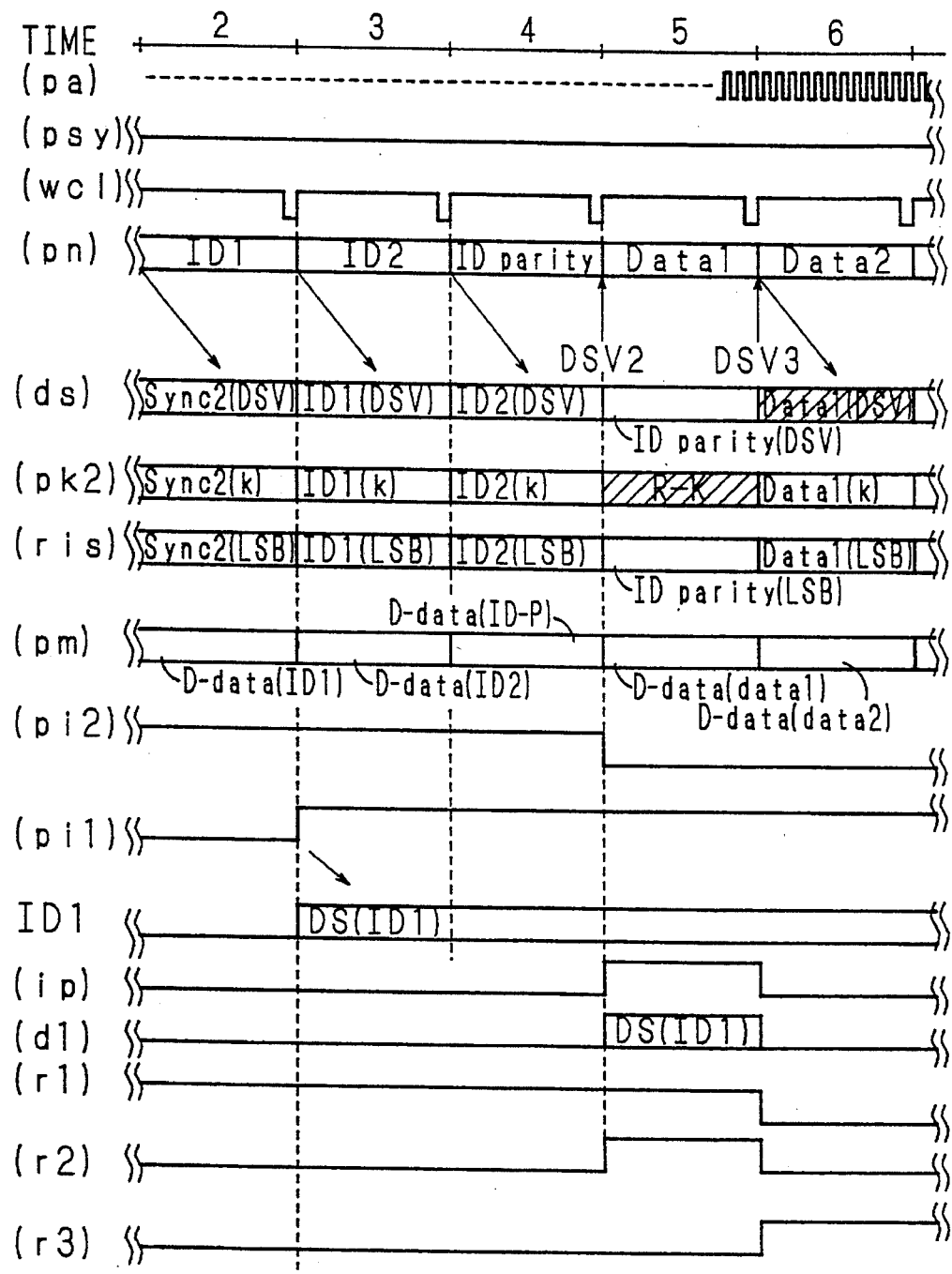
FIG. 89 is a timing chart for explaining in detail the operation of decoding in the decoding system of the recording and reproduction apparatus shown in FIG. 86.

FIGS. 88 and 89 are timing diagrams for explaining in further detail the operation of the circuits described with reference to FIGS. 86 and 87. In the Figures, the signs (pa), (psy), (wcl), etc. correspond to the points indicated by the same signs in the input/output sections of the circuits shown in FIG. 86 and 87.

The operation of each circuit will be described in detail below. The 14-bit parallel signal outputted from the serial-parallel converter 41 is fed to the latch circuit 42 and also to the sync. signal detector 43. The sync. signal detector 43 detects a codeword indicating the synchronizing signal in the reproduction signal, and outputs the synchronizing signal (psy) shown in FIGS. 88 and 89. The word clock generator 44 generates the reproduction word clock (wcl) by using the synchronizing signal from the sync. signal detector 43 and the reproduction channel clock (pa). The latch circuit 42 latches the parallel signal inputted from the serial-parallel converter 41 by the reproduction word clock fed from the word clock generator 44, and supplies the word-synchronized reproduced 14-bit codeword (pn) to the decoder 40, while the LSB of the codeword is fed to the flip-flop circuit 36 where it is delayed by one word before it is transferred to the decoding table discriminator 39.

Based on the synchronizing signal (psy) from the sync. signal detector 43 and the reproduction word clock (wcl) from the word clock generator 44, the area signal generator 60 generates the signal (pi2) designating the ID codeword area immediately succeeding the synchronizing signal shown in FIG. 81 in Embodiment 9 as a signal which is, for example, high within that area; the area signal generator 60 also generates the signal (pi1) whose low level period designates the ID1 data area. Using the reproduction channel clock, the reproduction word clock and the reset signal from the reset data generator 65, the DSV counter 63 counts the DSV during the reproduction of the reproduction signal being transmitted in synchronism with the reproduction channel clock, and supplies the count to the k discriminator 64. The k discriminator 64 discriminates the DSV and Pe at the end of the codeword to determine k=DSV×Pe for reproduction, and latches the signal indicating the polarity of k by the reproduction word clock, and then outputs the signal to provide the decoding condition for the next codeword to be decoded. At this time, the discrimination of k is performed by resetting the DSV at the end of the ID codeword area by using the reset signal from the reset data generator 65. The signal indicating the polarity of k at the end of the immediately preceding codeword, discriminated by the k discriminator 64, is fed to the decoding table discriminator 39.

The decoding table discriminator 39 discriminates the decoding table for the current codeword to be decoded on the basis of the signal fed from the k discriminator 64 and the LSB of the immediately-preceding codeword fed from the flip-flop circuit 36, anti supplies the result to the decoder 40. At this time, a signal "00" indicating the same decoding table as used in the first decoder 33 in Embodiment 4 is supplied to the decoder 40 when the LSB of the immediately-preceding codeword is "0"; a signal "01" indicating the same decoding table as used in the second decoder 34 in Embodiment 4 is supplied when the LSB of the immediately-preceding codeword is "1" and k≧0; and a signal "11" indicating the same decoding table as used in the third decoder 35 in Embodiment 4 is supplied when the LSB of the immediately-preceding codeword is "1" and k<0.

The 2-bit control signal outputted from the decoding table discriminator 39 and the 14-bit codeword are inputted to the decoder 40 for decoding: when the control signal bits are "00", the 14-bit codeword is decoded into an 8-bit dataword by using the same conversion table as used in the first decoder 33 in Embodiment 4 in FIG. 64; when the control signal bits are "01", the 14-bit codeword is decoded into an 8-bit dataword by using the same conversion table as used in the second decoder 34; and when the control signal bits are "11", the 14-bit codeword is decoded into an 8-bit dataword by using the same conversion table as used in the third decoder 35. The thus decoded 8-bit data is outputted.

The 8-bit data outputted from the decoder 40 is transferred to the ID parity check circuit 61 and also to the ID data discriminator 62. In the high level area of the signal (pi2) outputted from the area signal generator 60, designating the ID codeword area succeeding the synchronizing signal, the ID parity check circuit 61 checks the ID parity for the signal in the ID codeword area of the data decoded by the decoder 40, and when the ID data is correct, supplies, for example, a high level signal (ip) to the ID data discriminator 62. The ID data discriminator 62 holds the ID1 data when the ID1 data area designating signal (pi1) from the area signal generator 60 is low, and outputs the thus held ID1 area designating data (d1) to the reset data generator 65 when the signal from the ID parity check circuit 61 goes high (when the ID data is correct). The ID1 data is data indicating the DSV at the end of the synchronizing signal, as described in Embodiment 9.

Next, the operation of the reset data generator 65 will be described. In the reset data generator 65, the area signal generator 651, based on the ID codeword area signal (pi2) from the area signal generator 60 and the reproduction word clock (wcl), generates and outputs a signal (r1) that is high in the ID codeword area and also in the one-codeword area immediately succeeding the ID codeword area, a signal (r2) that rises at the end of the ID codeword area and stays high throughout the one-codeword area immediately succeeding the ID codeword area, and a signal (r3) that rises at the end of the codeword immediately succeeding the ID codeword area. The DSV counter 652, with the reproduction signal inputted thereto, starts counting the DSV from 0 at the start (DSV1 in FIG. 88) of the ID codeword area, obtains the DSV during the period when the signal (r1) from the area signal generator 651 is high, designating the ID codeword area and the succeeding one-codeword area, and supplies the result to the first DSV reset data producer 653 and also to the second DSV reset data producer 654. Along with the DSV from the DSV counter 652, the signal (r2) that rises at the end of the ID codeword area and remains high throughout the one-codeword area immediately succeeding the ID codeword area is supplied from the area signal generator 651 to the first DSV reset data generator 653. The first DSV reset data producer 653 then obtains the DSV at the rising of the signal (r2), i.e. the DSV from the start to the end of the ID codeword area (DSV1 to DSV2 in FIGS. 88 and 89), determines the DSV at the end of the ID codeword area in the codeword sequence on the basis of the first obtained DSV and the ID1 data supplied from the ID1 data discriminator 62, and transfers the result as DSV reset data (dr1) to the k discriminator 64. At this time, the ID1 data from the ID data discriminator 62 indicates the DSV at the end of the synchronizing signal in conversion; the cumulative sum of the DSV from the start to the end of the ID codeword area yields the DSV at the end of the ID codeword area. When the DSV reset data (dr1) that indicates the DSV at the end of the ID codeword area is inputted from the first DSV reset data producer 653, the k discriminator 64 resets the DSV to the inputted DSV value and discriminates the value of k; therefore, the polarity of k at the end of the immediately-preceding codeword which is used for determining the decoding table for decoding the codeword immediately succeeding the ID codeword area, is dependent on the thus reset DSV.

The DSV from the DSV counter 652 is also inputted to the second DSV reset data producer 654 to which the signal (r3) that rises at the end of the codeword immediately succeeding the ID codeword area is supplied from the area signal generator 651. The second DSV reset data producer 654 then obtains the DSV at the rising of the signal (r3), i.e. the DSV from the start of the ID codeword area to the end of the codeword immediately succeeding the ID codeword area (DSV1 to DSV3 in FIGS. 88 and 89), determines the DSV at the end of the codeword immediately succeeding the ID codeword area in the codeword sequence on the basis of the first obtained DSV and the ID1 data supplied from the ID data discriminator 62, and transfers the result as DSV reset data (dr2) to the DSV counter 63. When the DSV from the start of the ID codeword area to the end of the codeword immediately succeeding the ID codeword area is added cumulatively to the DSV indicated by the ID1 data fed from the ID data discriminator 62, the DSV at the end of the codeword immediately succeeding the ID codeword area can be obtained. When the DSV reset data (dr2) indicating the DSV at the end of the codeword immediately succeeding the ID codeword area is inputted from the second DSV reset data producer 654, the DSV counter 63 resets the DSV to the inputted DSV value and starts counting the DSV from the next codeword.

As described, according to the above decoding method of reverse-converting and decoding reproduced 14-bit codewords into 8-bit datawords in a recording and reproduction apparatus employing the data conversion method of Embodiment 9, the polarity of k is obtained from the DSV and Pe at the end of the immediately-preceding codeword in the reproduction signal, and data appended in the ID codeword area and indicating the DSV at the end of the immediately-preceding block is detected, based on which the DSV in reproduction is reset. Thus, in the above decoding method, the appropriate conversion table used for decoding is selected according to the polarity of k and the LSB of the immediately-preceding codeword; furthermore, if there occur errors in the reproduction signal, resulting in erroneous DSV counting during reproduction, the DSV can be reset by the DSV value in the ID codeword so that the correct DSV counting can be performed.

Embodiment 11

In the above-described decoding method of Embodiment 10, the discriminating signal created from the signal from the k discriminator and the LSB of the immediately-preceding codeword is inputted to the decoder along with the codeword to be decoded, and n bits of codeword with discriminating signal bits are decoded into m bits of dataword. It will be recognized, however, that the method of selecting the conversion table according to the condition is not limited to the above-illustrated one. For example, as shown in FIG. 90, three kinds of decoders, the first, second and third decoders, using different conversion tables may be provided, and switching may be performed between datawords, using selectors, according to the discriminating conditions of the polarity of k and the LSB at the end of the immediately-preceding codeword; with this configuration also, the same effect as achieved in Embodiment 10 can be obtained.

Figure 90:
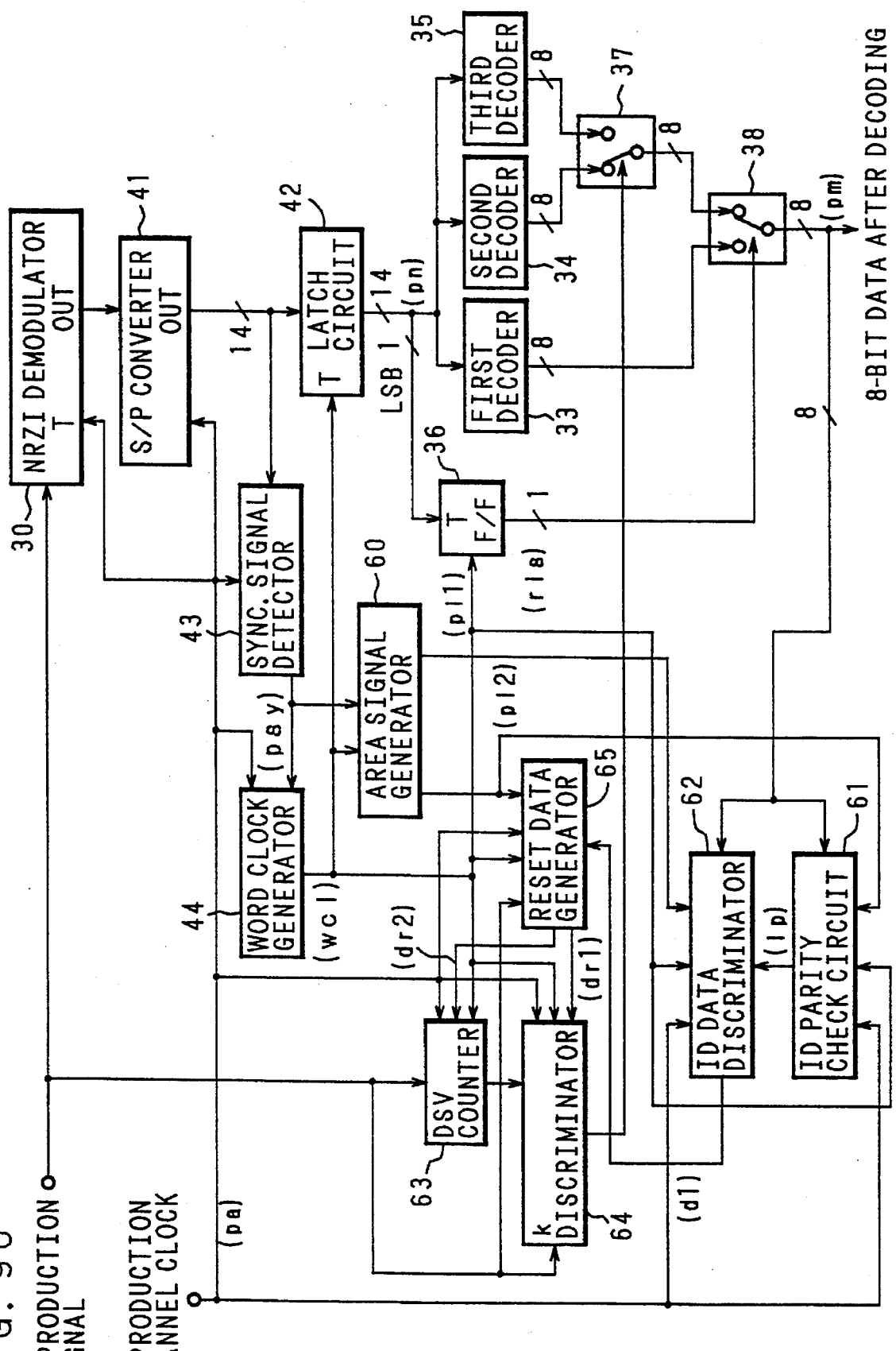
FIG. 90 is a diagram showing the configuration of a decoding system in a recording and reproduction apparatus of Embodiment 11 in which the data conversion method of Embodiment 9 is employed.

In FIG. 90, the parts indicated at 30, and 33 to 38 are identical to the corresponding parts in the apparatus of Embodiment 4 shown in FIG. 64, the parts indicated at 41 to 44 are identical to the corresponding parts in the apparatus of Embodiment 7 shown in FIG. 76, and the parts indicated at 60 to 65 are identical to the corresponding parts in the apparatus of Embodiment 10 shown in FIG. 86.

The operation of Embodiment 11 will be described below. The 14-bit parallel signal outputted from the serial-parallel converter 41 is fed to the latch circuit 42 and also to the sync. signal detector 43. The sync. signal detector 43 detects a codeword indicating the synchronizing signal in the reproduction signal, and outputs a synchronizing signal (psy). The word clock generator 44 generates a reproduction word clock (wcl) by using the synchronizing signal from the sync. signal detector 43 and the reproduction channel clock (pa). The latch circuit 42 latches the parallel signal inputted from the serial-parallel converter 41 by the reproduction word clock fed from the word clock generator 44, and outputs a word-synchronized 14-bit codeword (pn) which is transferred to the first decoder 33, the second decoder 34 and the third decoder 35, while the LSB of the codeword is fed to the flip-flop circuit 36 where it is delayed by one word before it is transferred to the selector 38.

Based on the synchronizing signal (psy) from the sync. signal detector 43 and the reproduction word clock (wcl) from the word clock generator 44, the area signal generator 60 generates the signal (pi2) designating the ID codeword area succeeding the synchronizing signal shown in FIG. 81 in Embodiment 9; the area signal generator 60 also generates the signal (pi1) whose low level period designates the ID1 data area. Using the reproduction channel clock, the reproduction word clock and the reset signal from the reset data generator 65, the DSV counter 63 counts the DSV during the reproduction of the reproduction signal being transmitted in synchronism with the reproduction channel clock, and supplies the count to the k discriminator 64. The k discriminator 64 discriminates the DSV and Pe at the end of the codeword to determine k=DSV×Pe for reproduction, and latches the signal indicating the polarity of k by the reproduction word clock, which and then outputs the signal to provide the decoding condition for the next codeword to be decoded. At this time, the discrimination of k is performed by resetting the DSV at the end of the ID codeword area by using the reset signal from the reset data generator 65. The signal indicating the polarity of k at the end of the immediately-preceding codeword, discriminated by the k discriminator 64, is fed to the decoding table discriminator 39.

Using the signal indicating the polarity of k at the end of the last decoded signal supplied from the k discriminator 64 as the selection signal, the selector 37 selects the 8-bit data decoded by the second decoder 34 when k≧0, or the 8-bit data decoded by the third decoder 35 when k<0, and supplies the selected data to the selector 38. Using the LSB of the last decoded codeword supplied from the flip-flop circuit 36 as the selection signal, the selector 38 selects the 8-bit data outputted from the first decoder 33 when the LSB of the immediately-preceding codeword is "0", or the 8-bit data selected by the selector 37 when the LSB is "1", and outputs the selected data as the decoded 8-bit data.

The 8-bit data outputted from the selector 38 is also transferred to the ID parity check circuit 61 and the ID data discriminator 62. In the area of the signal outputted from the area signal generator 60, designating the ID codeword area succeeding the synchronizing signal, the ID parity check circuit, 61 checks the ID parity for the signal in the ID codeword area of the decoded data, and when the ID data is correct, supplies, for example, a high level signal (ip) to the ID data discriminator 62. The ID data discriminator 62 holds the ID1 data when the ID1 data area designating signal (pi1) from the area signal generator 60 is low, and outputs the thus held ID1 area designating data (d1) to the reset data generator 65 when the signal from the ID parity check circuit 61 goes high (when the ID data is correct). The ID1 data is data indicating the DSV at the end of the synchronizing signal, as described in Embodiment 9.

Next, in the reset data generator 65, the area signal generator 651, based on the ID codeword area signal (pi2) from the area signal generator 60 and the reproduction word clock (wcl), generates and outputs a signal (r1) that is high in the ID codeword area and also in the one-codeword area immediately succeeding the ID codeword area, a signal (r2) that rises at the end of the ID codeword area and stays high throughout the one-codeword area immediately succeeding the ID codeword area, and a signal (r3) that rises at the end of the codeword immediately succeeding the ID codeword area. The DSV counter 652, with the reproduction signal inputted thereto, starts counting the DSV from 0 at the start of the ID codeword area, obtains the DSV during the period when the signal (r1) from the area signal generator 651 is high, designating the ID codeword area and the succeeding one-codeword area, and supplies the result to the first DSV reset data producer 653 and also to the second DSV reset data producer 654. Along with the DSV from the DSV counter 652, the signal (r2) that rises at the end of the ID codeword area and remains high throughout the one-codeword area immediately succeeding the ID codeword area is supplied from the area signal generator 651 to the first DSV reset data generator 653. The first DSV reset data producer 653 then obtains the DSV at the rising of the signal (r2), i.e. the DSV from the start to the end of the ID codeword area, determines the DSV at the end of the ID codeword area in the codeword sequence on the basis of the first obtained DSV and the ID1 data supplied from the ID data discriminator 62, and transfers the result as DSV reset data (dr1) to the k discriminator 64. When the DSV reset data (dr1) that indicates the DSV at the end of the ID codeword area is inputted from the DSV reset data producer 653, the k discriminator 64 resets the DSV to the inputted DSV value and discriminates the value of k; therefore, the polarity of k at the end of the immediately-preceding codeword for determining mined the decoding table for decoding the codeword immediately succeeding the ID codeword area, is dependent on the thus reset DSV.

The DSV from the DSV counter 652 is also inputted to the second DSV reset data producer 654 to which the signal (r3) that rises at the end of the codeword immediately succeeding the ID codeword area is supplied from the area signal generator 651. The second DSV reset data producer 654 then obtains the DSV at the rising of the signal (r3), i.e. the DSV from the start of the ID codeword area to the end of the codeword immediately succeeding the ID codeword area, determines the DSV at the end of the codeword immediately succeeding the ID codeword area in the codeword sequence on the basis of the first obtained DSV and the ID1 data supplied from the ID1 data discriminator 62, and transfers the result as DSV reset data (dr2) to the DSV counter 63. When the DSV reset data (dr2) indicating the DSV at the end of the codeword immediately succeeding the ID codeword area is inputted from the second DSV reset data producer 654, the DSV counter 63 resets the DSV to the input DSV value and starts counting the DSV from the next codeword. The decoded 8-bit data (dataword) is thus output from the selector 38, and the same effect as achieved in Embodiment 10 can be obtained.

FIG. 1 shows the modulation parameters obtained with the data conversion method of the present invention, by comparison with those obtained with the prior art methods; in the data conversion method of the present invention, an 8-bit dataword is converted to a 14-bit codeword, with the number of successive 0s between arbitrary data "1" and the next data "1" in the codeword sequence after conversion being one at minimum and five at maximum, and with the diverging range of the DSV of the codeword sequence after conversion being made finite. As shown, in the example of the present invention, Tmax/Tmin=3.0, which shows that Tmax and Tmax/Tmin can be made smaller than those achieved by the prior art 8-14 modulation method, and furthermore, Tw×Tmin=0.653, which shows that Tmin and Tw×Tmin can be made larger than those achieved by the prior art 8-14 modulation method. As a result, the data conversion method of the invention is much less likely to cause a peak shift due to intersymbol interference, provides good overwrite characteristics, and realizes high-density recording.

As this invention may be embodied in several forms without departing from the spirit of essential characteristics thereof, the present embodiment is therefore illustrative and not restrictive, since the scope of the invention is defined by the appended claims rather than by the description preceding them, and all changes that fall within metes and bounds of the claims, or equivalence of such metes and bounds thereof are therefore intended to be embraced by the claims.

What is claimed is:

1. A data conversion method for converting m-bit datawords in to n-bit codewords, wherein binary values 1 and 0 are represented by +1 and −1 respectively, the value of the integral thereof being taken as a digital sum variation (DSV), the value of the DSV from the beginning to the end of a codeword being added together to form a codewords digital sum (CDS), and the n-bit codewords being mapped in corresponding relationship to the m-bit datawords in accordance with the following rule:

(a) codewords with CDS=0 in corresponding relationship to datawords, and pairing codewords with CDS>0 and codewords with CDS<0 together and mapping them in corresponding relationship to other datawords, and further, pairing codewords with CDS>0 and codewords with CDS<0 together and mapping them in corresponding relationship to the datawords to which the codewords with CDS=0 have been mapped, and (b) when DSV=0, in cases where there is a codeword with CDS=0 among the codewords corresponding to the datawords, then selecting the codeword with CDS=0, and in cases where there is no such codeword, then selecting a codeword with CDS≠0; when DSV>0, in cases where there is a codeword with CDS<0 among the codewords corresponding to the datawords, then selecting the codeword with CDS<0, and in cases where there is no such codeword, then selecting a codeword with CDS=0 and when DSV<0, in cases where there is a codeword with CDS>0 among the codewords corresponding to the datawords, then selecting the codeword with CDS>0, and in cases where there is no such codeword, then selecting a codeword with CDS=0.

2. A data conversion method according to claim 1, wherein said step (a) of mapping maps the n-bit codewords in corresponding relationship to the m-bit datawords in order of increasing magnitude of the codeword CDS in absolute value terms.

3. A data conversion method according to claim 1, wherein said step (a) of mapping, in mapping the n-bit codewords in corresponding relationship to the m-bit datawords, pairs codewords with CDS≠0 in decreasing order of the DSV change range within the codewords with CDS −0.

4. A data conversion method for converting m-bit datawords in to n-bit codewords, wherein binary values 1 and 0 are represented by +1 and −1 respectively, the value of the integral thereof being taken as a digital sum variation (DSV), the value of the DSV from the beginning to the end of a codeword being added together to form a codeword digital sum (CDS), and the n-bit codewords being mapped in corresponding relationship to the m-bit datawords in accordance with the following rule:

(a) mapping codewords with CDS=0 in corresponding relationship to datawords, and pairing codewords with CDS>0 and codewords with CDS<0 together and mapping them in corresponding relationship to other datawords, and further, pairing codewords with CDS>0 and codewords with CDS<0 together and mapping them in corresponding relationship to the datawords to which the codewords with CDS=0 have been mapped, while mapping codewords with CDS≠0, left unpaired, in corresponding relationship to the datawords to which only the codewords with CDS =0 have been mapped, and (b) when DSV=0, in cases where there is a codeword with CDS =0 among the codewords corresponding to the datawords, then selecting the codeword with CDS=0, and in cases where there is no such codeword, then selecting a codeword with CDS ≠0; when DSV>0, in cases where there is a codeword with CDS<0 among the codewords corresponding to the datawords, then selecting the codeword with CDS<0, and in cases where there is no such codeword, then selecting a codeword with CDS=0; and when DSV<0, in cases where there is a codeword with CDS>0 among the codewords corresponding to the datawords, then selecting the codeword with CDS>0, and in cases where there is no such codeword, then selecting a codeword with CDS=0.

5. A data conversion method according to claim 4, wherein said step (a) of mapping maps the n-bit codewords in corresponding relationship to the m-bit datawords in order of increasing magnitude of the codeword CDS in absolute value terms.

6. A data conversion method according to claim 4, wherein said step (a) of mapping, in mapping the n-bit codewords in corresponding relationship to the m-bit datawords, pairs codewords with CDS≠0 in decreasing order of the DSV change range within the codewords with CDS=0.

7. A data conversion method for converting m-bit datawords in to n-bit codewords, comprising the steps of:

detecting the least significant bit of an n-bit codeword corresponding to the m-bit dataword converted immediately preceding the current m-bit dataword to be converted; and selecting an n-bit codeword corresponding to the current m-bit dataword to be converted, on the basis of the detected least significant bit, the current m-bit dataword to be converted, and the next m-bit dataword to be converted, wherein said step of selecting includes, providing a conversion table in which a plurality of n-bit codewords with different CDS's or different least significant bits are mapped to a single m-bit dataword, using the conversion table, when converting the current m-bit dataword in to an n-bit codeword to calculate the DSV expected at the end of an n-bit codeword corresponding to the next m-bit dataword to be converted for each of two cases, i.e. a case where a first n-bit codeword in the conversion table is selected for the current m-bit dataword and a case where a second n-bit codeword in the conversion table is selected for the current m-bit dataword, and based on the thus calculated DSV, selecting an n-bit codeword corresponding to the current m-bit dataword from the conversion table.

8. A data conversion method for converting m-bit datawords in to n-bit codewords, comprising the steps of:

detecting the least significant bit of an n-bit codeword corresponding to the m-bit dataword converted immediately preceding the current m-bit dataword to be converted; and selecting an n-bit codeword corresponding to the current m-bit dataword to be converted, on the basis of the detected least significant bit, the current m-bit dataword to be converted, and the next m-bit dataword to be converted, wherein when converting an m-bit dataword in to an n-bit codeword, different conversion tables are used in said step (b) of selecting for selection of the n-bit codeword in accordance with the DSV and the level at the end of an n-bit codeword corresponding to the immediately-preceding converted m-bit dataword.

9. A data conversion method for converting m-bit datawords in to n-bit codewords, comprising the steps of:

detecting the least significant bit of an n-bit codeword corresponding to the m-bit dataword converted immediately preceding the current m-bit dataword to be converted; and selecting an n-bit codeword corresponding to the current m-bit dataword to be converted, on the basis of the detected least significant bit, the current m-bit dataword to be converted, and the next m-bit dataword to be converted, wherein the m-bit dataword is an 8-bit dataword, and the n-bit codeword is a 14-bit codeword, the n-bit codeword being selected in such a manner that in a codeword sequence after conversion, an arbitrary first logic value and the next first logic value are separated by a minimum of one second logic value and a maximum of five second logic values, and that the diverging range of the DSV in the signal obtained by NRZI-modulating the codeword sequence after conversion is made finite.

10. A reproduction method employing a data conversion method for converting m-bit datawords in to n-bit codewords including, for converting m-bit datawords in to n-bit codewords, comprising the steps of:

detecting the least significant bit of an n-bit codeword corresponding to the m-bit dataword converted immediately preceding the current m-bit dataword to be converted; and selecting an n-bit codeword corresponding to the current m-bit dataword to be converted, on the basis of the detected least significant bit, the current m-bit dataword to be converted, and the next m-bit dataword to be converted, said reproduction method detecting the least significant bit of the n-bit codeword decoded immediately preceding the current n-bit codeword to be decoded, when decoding an n-bit codeword sequence in to the original m-bit datawords for reproduction;

identifying the DSV at the end of the n-bit codeword decoded immediately preceding the current n-bit codeword to be decoded, and the level at the end of the immediately-preceding decoded n-bit codeword, when decoding an n-bit codeword sequence into the original m-bit datawords for reproduction; and performing decoding by selecting the original m-bit dataword corresponding to the n-bit codeword to be decoded, on the basis of the detected least significant bit of the immediately-preceding decoded n-bit codeword, and the identified DSV and level at the end of the immediately preceding decoded codeword.

11. A recording and reproduction apparatus employing a data conversion method for converting m-bit datawords in to n-bit codewords including, detecting the least significant bit of an n-bit codeword corresponding to the m-bit dataword converted immediately preceding the current m-bit dataword to be converted; and selecting an n-bit codeword corresponding to the current m-bit dataword to be converted, on the basis of the detected least significant bit, the current m-bit dataword to be converted, and the next m-bit dataword to be converted, said apparatus comprising:, appending means for appending, when recording, an n-bit codeword so that the DSV at the end of an n-bit codeword corresponding to the immediately-preceding converted m-bit dataword is set to 0 or to a predetermined value;

detecting means for detecting the least significant bit of the n-bit codeword decoded immediately preceding the current n-bit codeword to be decoded, when decoding an n-bit codeword sequence in to the original m-bit datawords for reproduction;

identifying means for identifying the DSV at the end of the n-bit codeword decoded immediately preceding the current n-bit codeword to be decoded and also the level at the end of the immediately-preceding decoded n-bit codeword;

resetting means for detecting the area of the codeword appended during recording and for resetting the least significant bit and the DSV at the end of the codeword appended during recording to the least significant bit and the DSV in the recorded codeword sequence when detecting the least significant bit by said detecting means and identifying the DSV by said identifying means; and decoding means for performing decoding by selecting the original m-bit dataword corresponding to the current n-bit codeword to be decoded, on the basis of the detected least significant bit of the immediately-preceding decoded n-bit codeword, and the identified DSV and level at the end of the immediately-preceding decoded codeword.

12. A recording and reproduction apparatus employing a data conversion method for converting m-bit datawords in to n-bit codewords including, detecting the least significant bit of an n-bit codeword corresponding to the m-bit dataword converted immediately preceding the current m-bit dataword to be converted; and selecting an n-bit codeword corresponding to the current m-bit dataword to be converted, on the basis of the detected least significant bit, the current m-bit dataword to be converted, and the next m-bit dataword to be converted, said apparatus comprising:

appending means for appending, when recording, data indicating the DSV at the end of the n-bit codeword corresponding to the immediately-preceding converted m-bit dataword;

detecting means for detecting the least significant bit of the n-bit codeword decoded immediately preceding the current n-bit codeword to be decoded, when decoding an n-bit codeword sequence in to the original m-bit datawords for reproduction;

identifying means for identifying the DSV at the end of the n-bit codeword decoded immediately preceding the current n-bit codeword to be decoded and also the level at the end of the immediately-preceding decoded n-bit codeword;

resetting means for detecting the data appended during recording and for resetting, on the basis of the data appended during recording, the DSV at the end of the immediately-preceding decoded codeword to the DSV in the recorded codeword sequence when identifying the DSV by said identifying means; and decoding means for performing decoding by selecting the original m-bit dataword corresponding to the current n-bit codeword to be decoded, on the basis of the detected least significant bit of the immediately-preceding decoded n-bit codeword, and the identified DSV and level at the end of the immediately-preceding decoded codeword.

* * * * *